United States Patent
Yamazaki et al.

(10) Patent No.: US 9,553,205 B2
(45) Date of Patent: Jan. 24, 2017

(54) SEMICONDUCTOR DEVICE, DRIVER CIRCUIT, AND DISPLAY DEVICE

(71) Applicant: Semiconductor Energy Laboratory Co., Ltd., Atsugi-shi, Kanagawa-ken (JP)

(72) Inventors: Shunpei Yamazaki, Setagaya (JP); Hiroyuki Miyake, Atsugi (JP); Kouhei Toyotaka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/147,168

(22) Filed: May 5, 2016

(65) Prior Publication Data

US 2016/0322504 A1 Nov. 3, 2016

Related U.S. Application Data

(63) Continuation of application No. 14/185,221, filed on Feb. 20, 2014, now Pat. No. 9,337,343.

(30) Foreign Application Priority Data

Feb. 27, 2013 (JP) .................................. 2013-036791
Sep. 11, 2013 (JP) .................................. 2013-187853
Dec. 2, 2013 (JP) .................................. 2013-248897

(51) Int. Cl.
  *G09G 3/36* (2006.01)
  *G11C 19/28* (2006.01)
  (Continued)

(52) U.S. Cl.
  CPC ......... *H01L 29/7869* (2013.01); *G09G 3/3655* (2013.01); *G09G 3/3677* (2013.01);
  (Continued)

(58) Field of Classification Search
  CPC ..................... G09G 3/3677; G09G 2310/0286; G09G 2310/0291; G11C 19/28; G11C 19/285
  See application file for complete search history.

(56) References Cited

U.S. PATENT DOCUMENTS 5,731,856 A    3/1998 Kim et al.
5,744,864 A    4/1998 Cillessen et al.
                (Continued)

FOREIGN PATENT DOCUMENTS

CN    001490655 A    4/2004
CN    001611997 A    5/2005
                (Continued)

OTHER PUBLICATIONS

Asakuma.N. et al., "Crystallization and Reduction of SOL-GEL-Derived Zinc Oxide Films by Irradiation With Ultraviloent Lamp", Journal of SOL-GEL Science and Technology, 2003, vol. 26, pp. 181-184.

(Continued)

*Primary Examiner* — Patrick O'Neill
(74) *Attorney, Agent, or Firm* — Robinson Intellectual Property Law Office; Eric J. Robinson

(57) ABSTRACT

To provide a semiconductor device having a high aperture ratio and including a capacitor with a high charge capacitance. To provide a semiconductor device with a narrow bezel. A transistor over a substrate; a first conductive film over a surface over which a gate electrode of the transistor is provided; a second conductive film over a surface over which a pair of electrodes of the transistor is provided; and a first light-transmitting conductive film electrically connected to the first conductive film and the second conductive film are included. The second conductive film overlaps the first conductive film with a gate insulating film of the (Continued)

transistor laid between the second conductive film and the first conductive film.

17 Claims, 47 Drawing Sheets

(51) Int. Cl.
    *H01L 29/786*     (2006.01)
    *H01L 27/12*     (2006.01)

(52) U.S. Cl.
    CPC .......... *G11C 19/28* (2013.01); *H01L 27/1225* (2013.01); *G09G 2300/0408* (2013.01); *G09G 2310/0286* (2013.01); *G09G 2310/0291* (2013.01); *G09G 2330/021* (2013.01)

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,193,593 B2 | 3/2007 | Koyama et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,508,363 B2 | 3/2009 | Hashimoto |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,243,873 B2 | 8/2012 | Koyama et al. |
| 8,274,077 B2 | 9/2012 | Akimoto et al. |
| 8,363,778 B2 | 1/2013 | Koyama et al. |
| 8,466,463 B2 | 6/2013 | Akimoto et al. |
| 8,582,716 B2 | 11/2013 | Koyama et al. |
| 9,024,676 B2 | 5/2015 | Ofuji et al. |
| 9,041,453 B2 | 5/2015 | Miyake et al. |
| 9,208,742 B2 | 12/2015 | Miyake et al. |
| 9,330,782 B2 * | 5/2016 | Yamamoto ............. G11C 19/28 |
| 9,337,343 B2 * | 5/2016 | Yamazaki ............. G11C 19/28 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0041765 A1 | 3/2004 | Koyama et al. |
| 2004/0127038 A1 | 7/2004 | Carcia et al. |
| 2005/0017302 A1 | 1/2005 | Hoffman |
| 2005/0078079 A1 | 4/2005 | Hashimoto |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0165112 A1 | 7/2008 | Su |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0033818 A1 | 2/2009 | Nakajima et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2011/0069805 A1 | 3/2011 | Koyama et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |
| 2012/0249499 A1 | 10/2012 | Takahashi et al. |
| 2012/0280725 A1 | 11/2012 | Koyama et al. |

(56) References Cited

U.S. PATENT DOCUMENTS

| | | | |
|---|---|---|---|
| 2013/0121456 | A1 | 5/2013 | Koyama et al. |
| 2014/0056400 | A1 | 2/2014 | Koyama et al. |

FOREIGN PATENT DOCUMENTS

| | | | |
|---|---|---|---|
| CN | 001991950 | A | 7/2007 |
| CN | 102474256 | A | 5/2012 |
| CN | 102687188 | A | 9/2012 |
| EP | 1737044 | A | 12/2006 |
| EP | 2226847 | A | 9/2010 |
| EP | 2528051 | A | 11/2012 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-118183 | A | 4/2004 |
| JP | 2004-273614 | A | 9/2004 |
| JP | 2004-273732 | A | 9/2004 |
| JP | 2005-115287 | A | 4/2005 |
| JP | 2007-096055 | A | 4/2007 |
| JP | 2007-123861 | A | 5/2007 |
| JP | 2011-090761 | A | 5/2011 |
| JP | 2013-033587 | A | 2/2013 |
| JP | 2013-148910 | A | 8/2013 |
| KR | 2004-0020845 | A | 3/2004 |
| KR | 10-0991684 | | 11/2010 |
| KR | 2012-0085720 | A | 8/2012 |
| WO | WO-2004/114391 | | 12/2004 |
| WO | WO-2011/036993 | | 3/2011 |
| WO | WO-2011/089762 | | 7/2011 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 ; SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFe2O4, and YB2Fe3O7 Types of Structures for Compounds in the IN2O3 and SC2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3,

(56) References Cited

OTHER PUBLICATIONS and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solis-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering ", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandems OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 IN. QVGA AMOLED Display Using In—Ga—Zn—Oxide TFTs With a Novel Passivation Layer", SID Digest '09 : SID International Symposium Digest of Technicals Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide.TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

(56) References Cited

OTHER PUBLICATIONS

International Search Report (Application No. PCT/JP2014/055194) Dated May 13, 2014.
Written Opinion (Application No. PCT/JP2014/055194) Dated May 13, 2014.

* cited by examiner

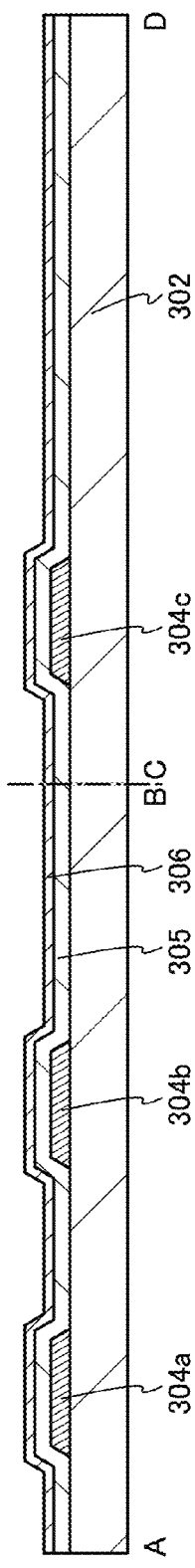
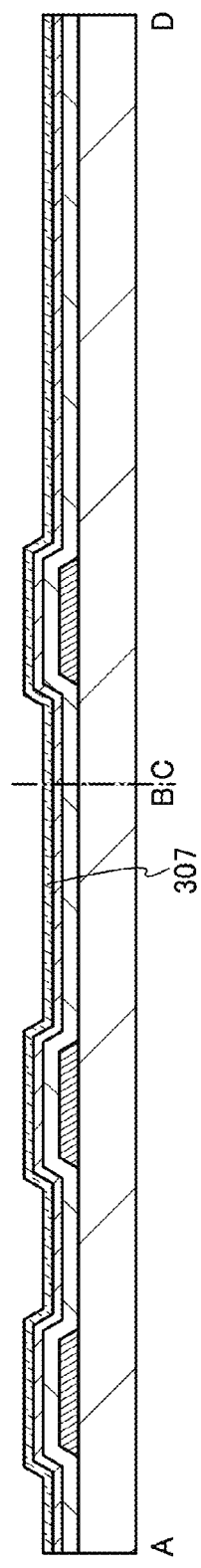
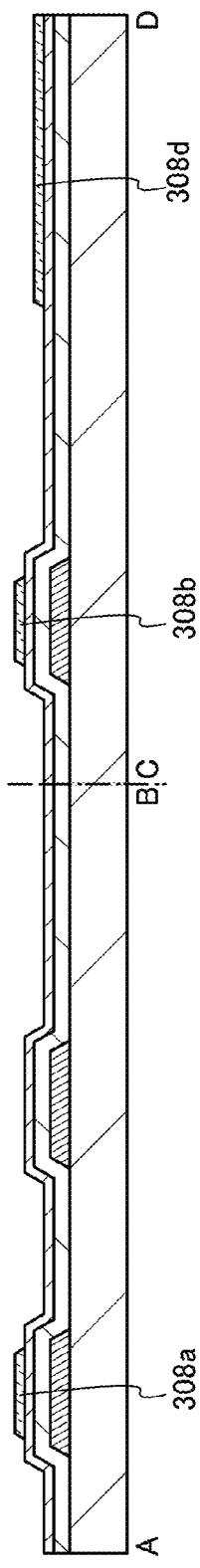

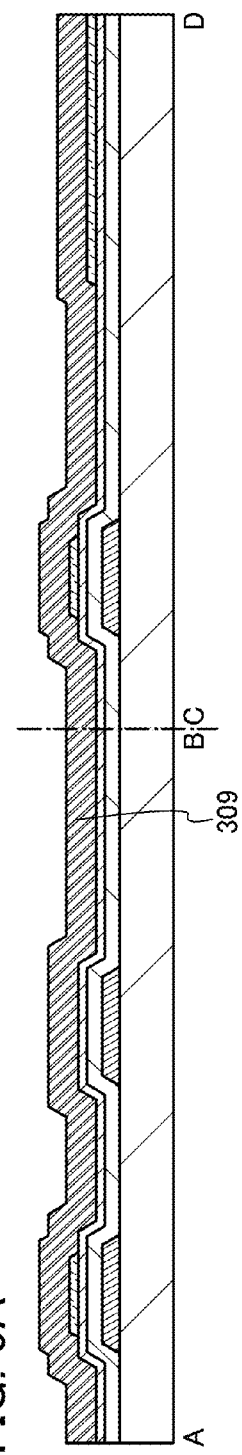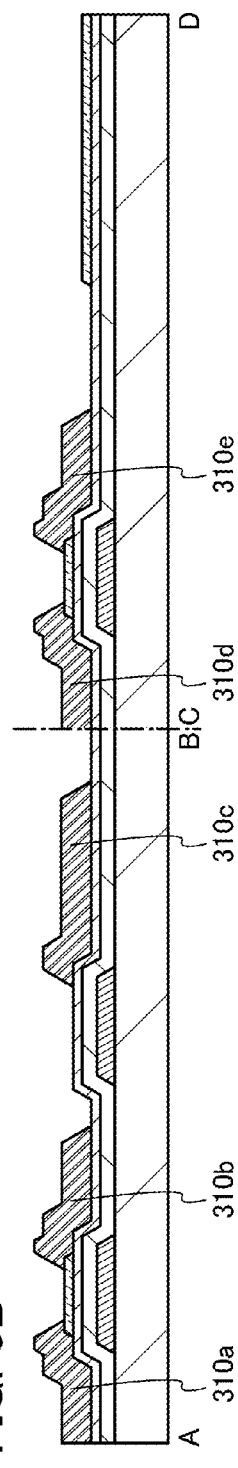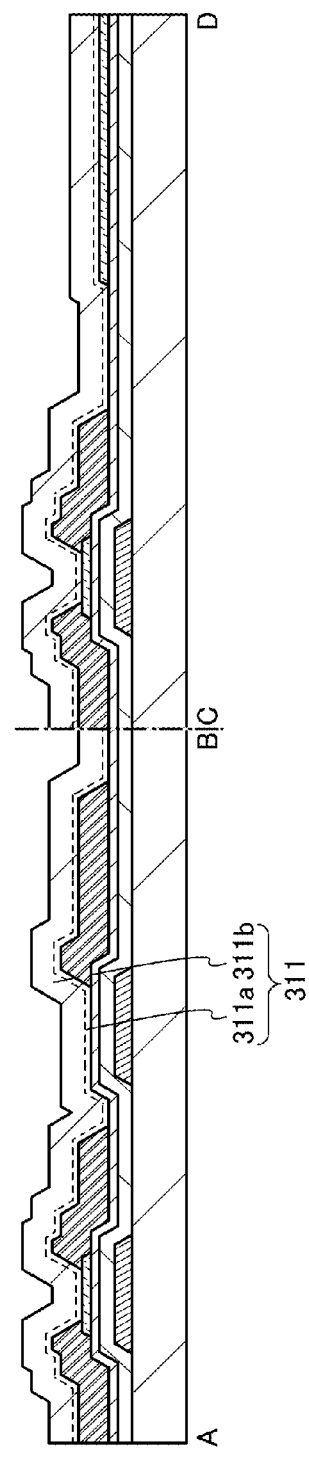

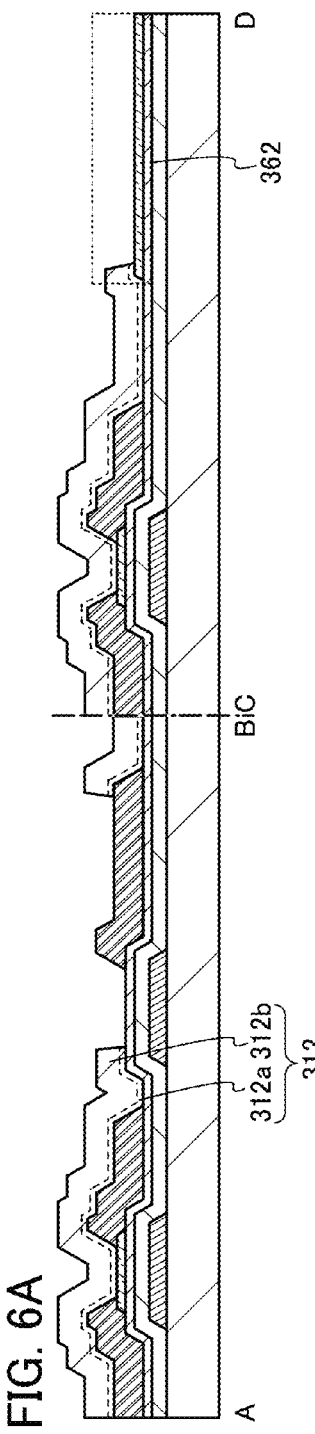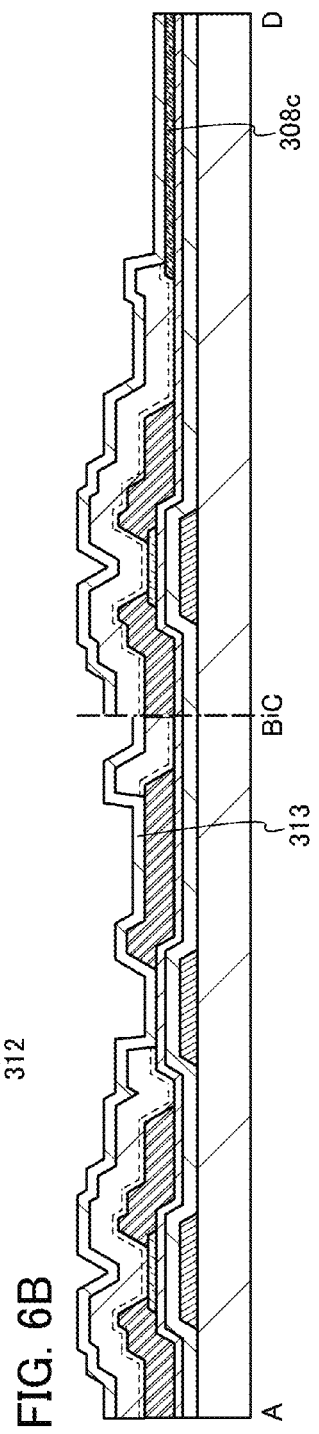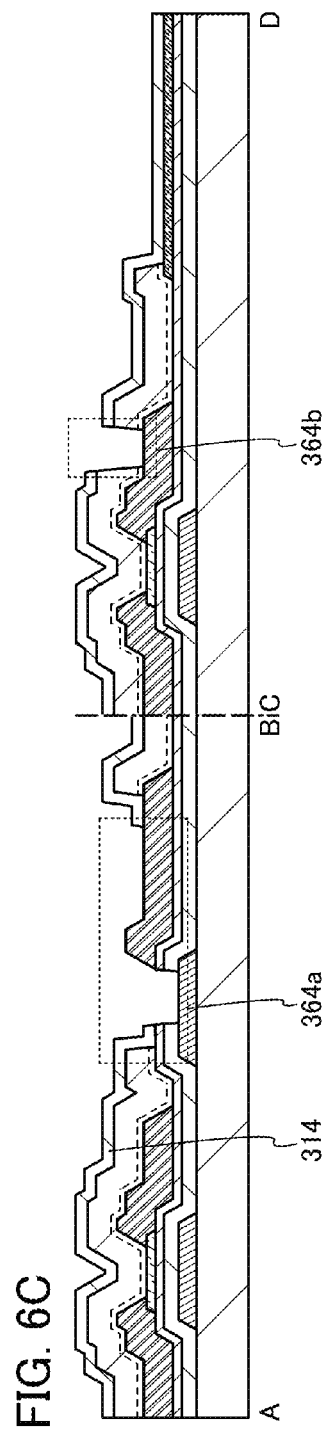

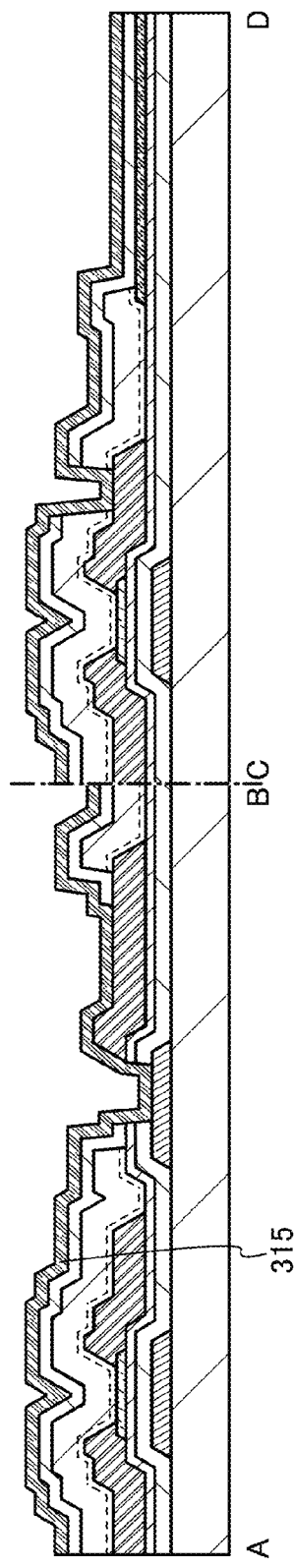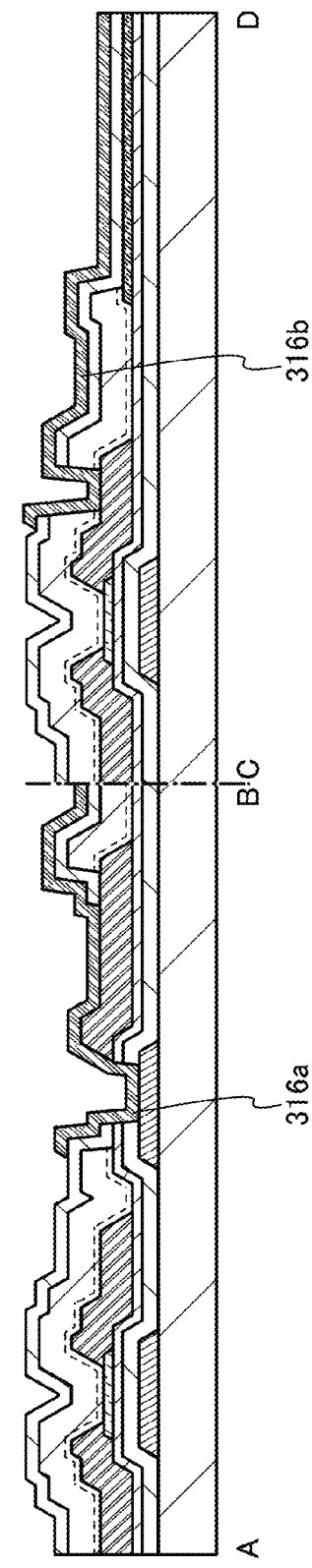

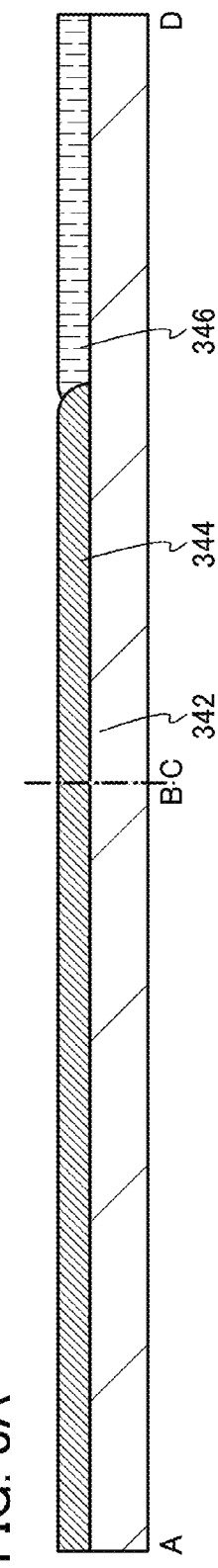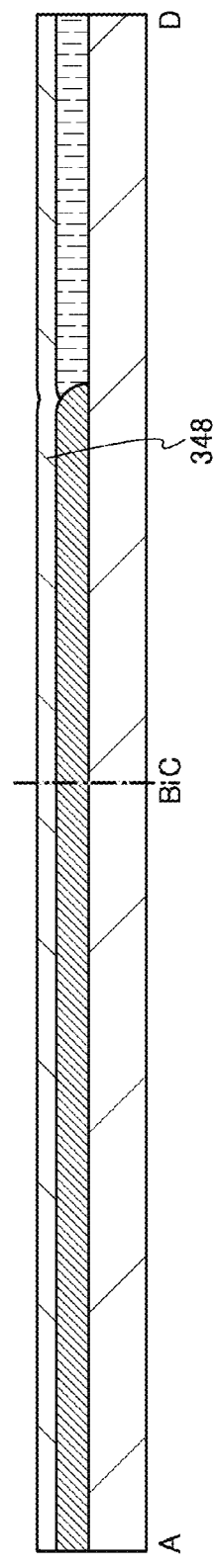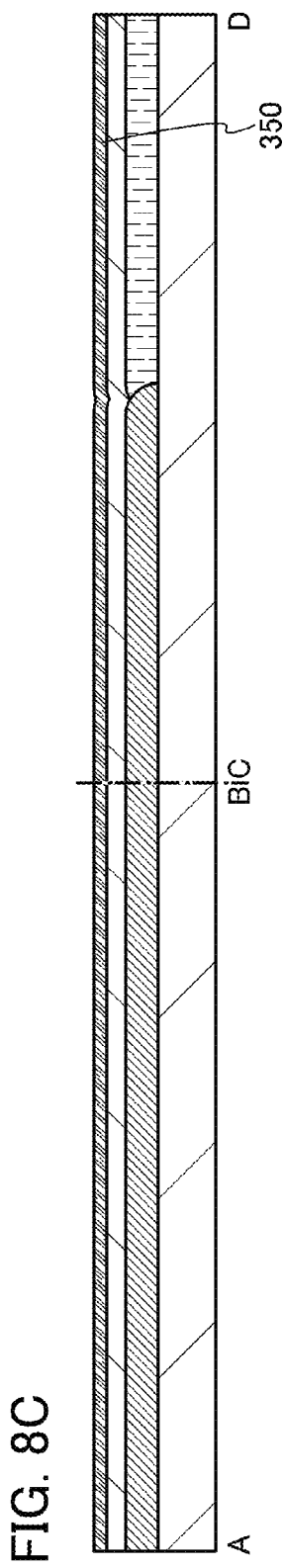
FIG. 8A
FIG. 8B
FIG. 8C

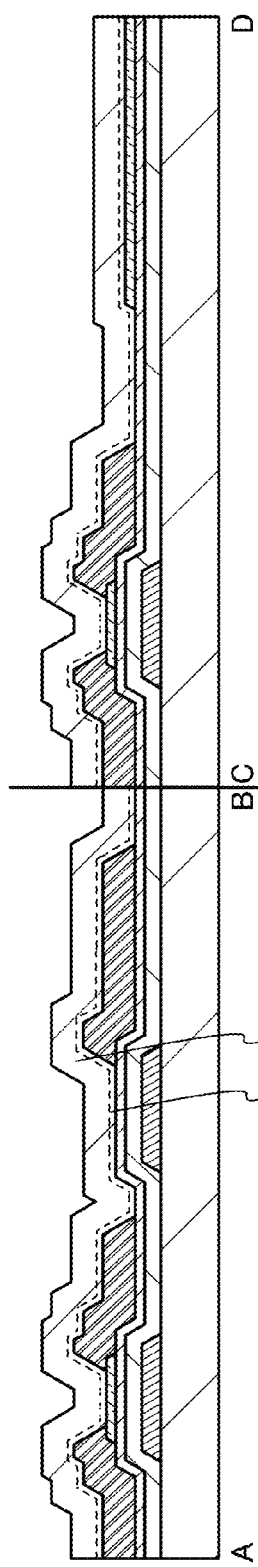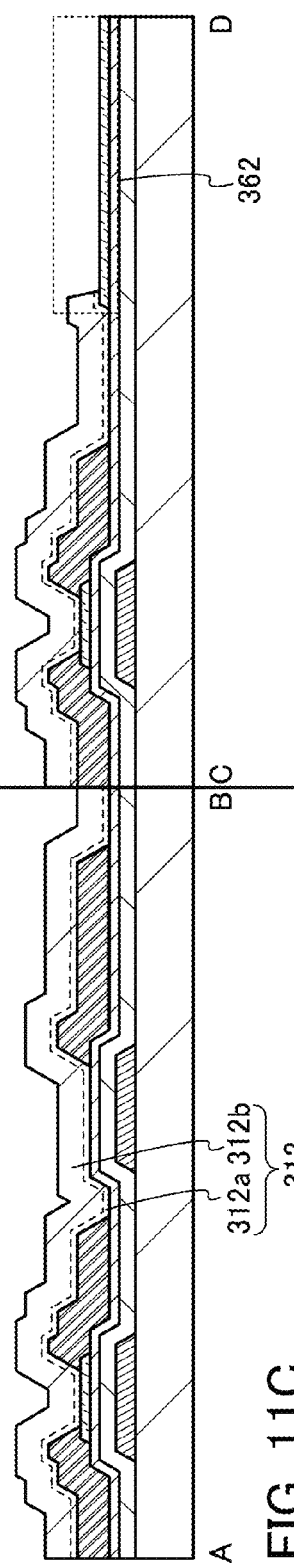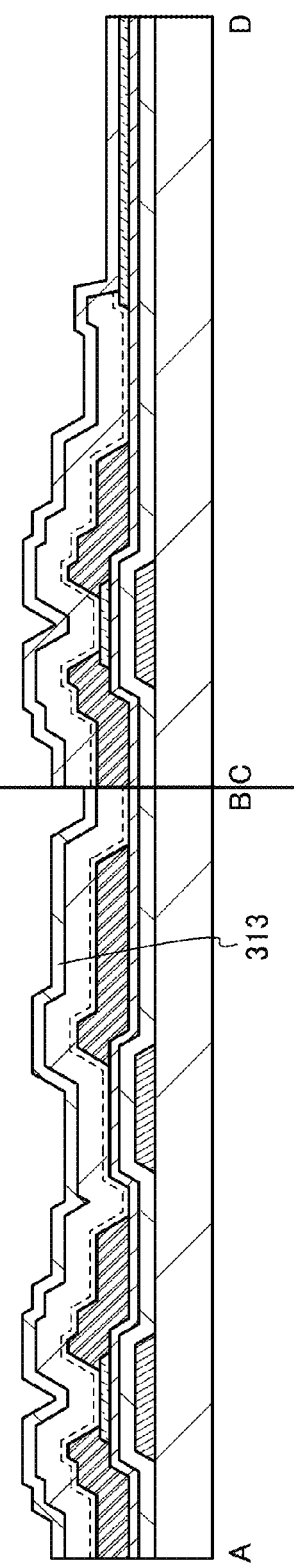

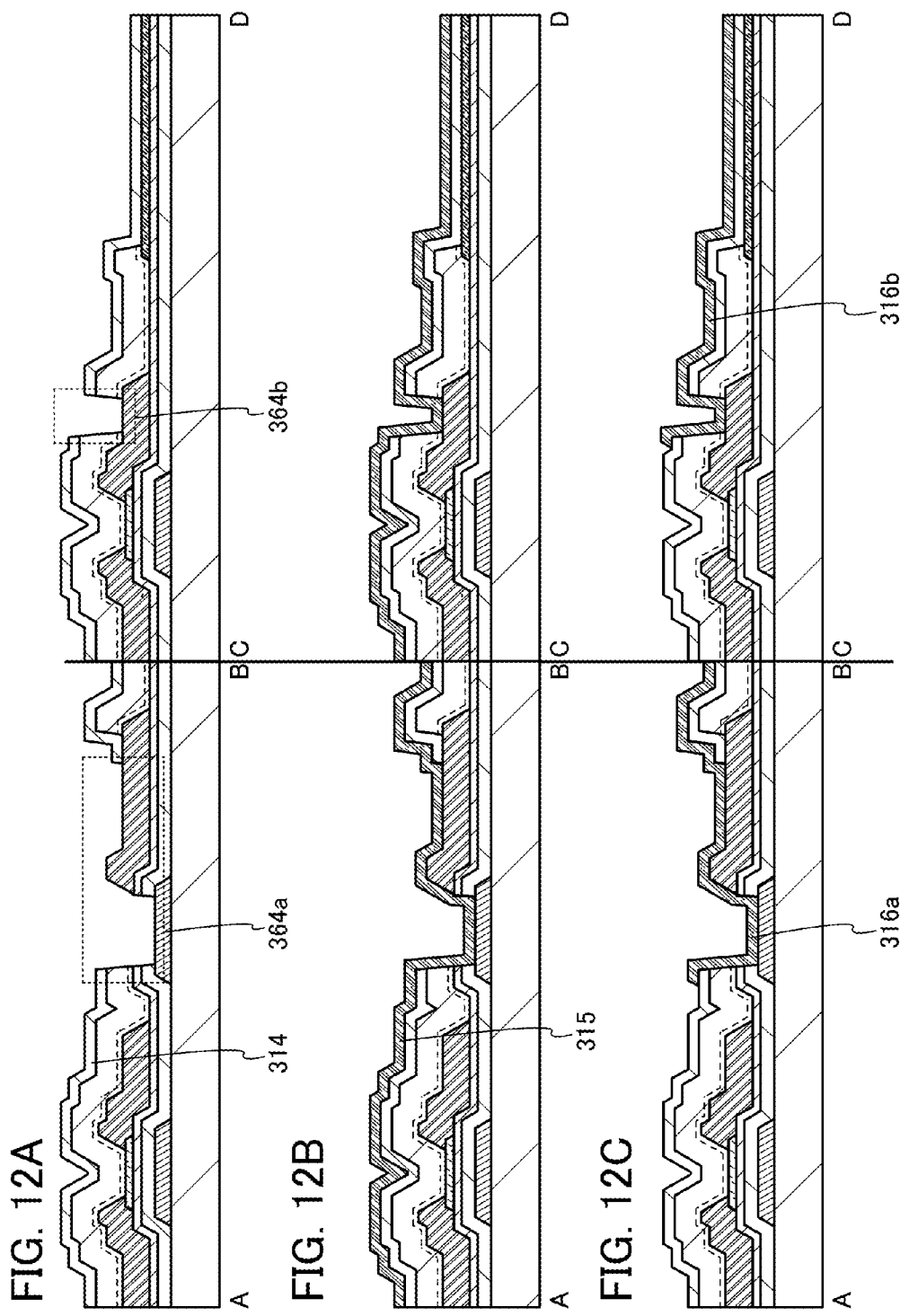

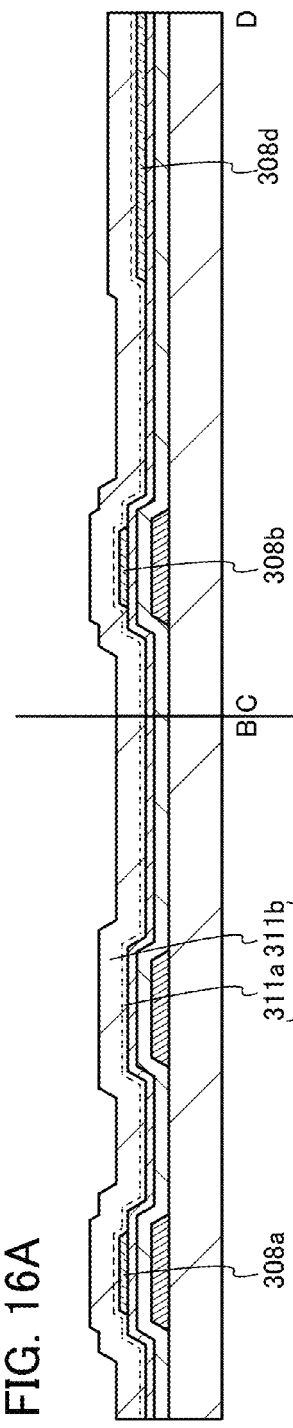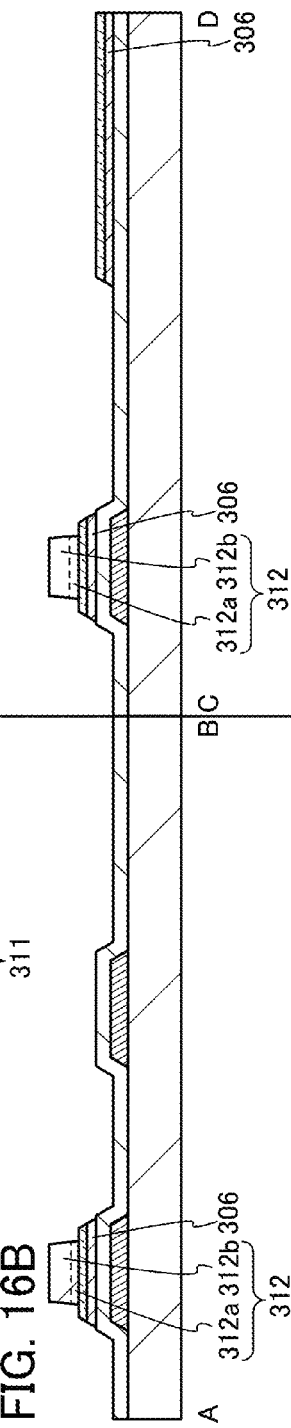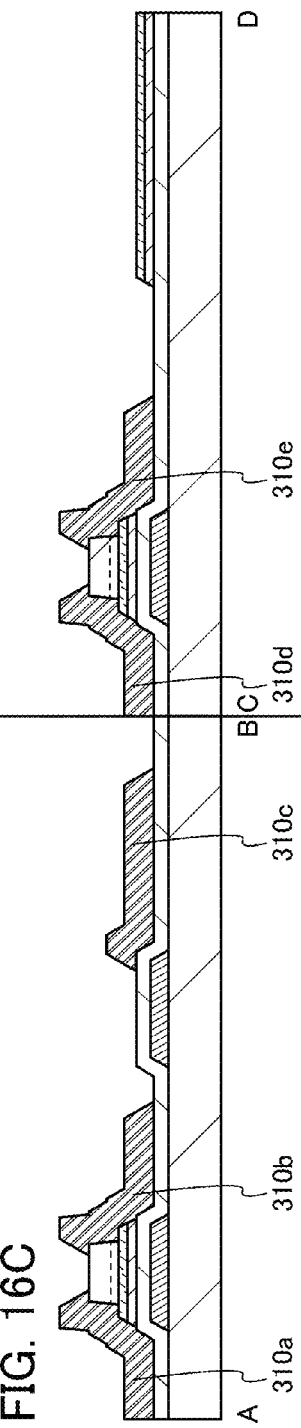

CAAC-OS nc-OS 367a 304b    367b 310c 304b  364a  310c

SEMICONDUCTOR DEVICE, DRIVER CIRCUIT, AND DISPLAY DEVICE

TECHNICAL FIELD

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a driving method thereof, or a manufacturing method thereof. The present invention particularly relates to a semiconductor device, a display device, or a light-emitting device each including an oxide semiconductor, for example. In particular, the present invention relates to, for example, a semiconductor device including a transistor and a method for manufacturing the semiconductor device.

BACKGROUND ART

Transistors used for most flat panel displays typified by a liquid crystal display device or a light-emitting display device are formed using a silicon semiconductor such as amorphous silicon, single crystal silicon, or polycrystalline silicon provided over a glass substrate. Further, such a transistor employing such a silicon semiconductor is used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor.

For example, such a technique is disclosed that a transistor is manufactured using zinc oxide or an In—Ga—Zn-based oxide as an oxide semiconductor and the transistor is used as a switching element or the like in a pixel of a display device (see Patent Documents 1 and 2).

PATENT DOCUMENT

[Patent Document 1] Japanese Published Patent Application No. 2007-123861

[Patent Document 2] Japanese Published Patent Application No. 2007-096055

DISCLOSURE OF INVENTION

In a capacitor, a dielectric film is provided between a pair of electrodes at least one of which is formed, in many cases, using a light-blocking film partly serving as a gate electrode, a source electrode, a drain electrode, or the like of a transistor.

In a liquid crystal display device, as the capacitance value of a capacitor is increased, a period during which the alignment of liquid crystal molecules of a liquid crystal element can be kept constant in the state where an electric field is applied can be made longer. When the period can be made longer in a display device which displays a still image, the number of times of rewriting image data can be reduced, leading to a reduction in power consumption.

One of methods for increasing the charge capacity of a capacitor is to increase the area occupied by the capacitor, specifically, to increase the area of a region where two electrodes of the capacitor overlap with each other. However, in a liquid crystal display device, when the area of a light-blocking conductive film is increased to increase the area of a region where a pair of electrodes overlaps with each other, the aperture ratio of a pixel is lowered and thus display quality of an image is degraded. Such a problem is remarkable particularly in a liquid crystal display device with high resolution.

A reduction in area except a display region of the display device is required.

In view of the above, one object of one embodiment of the present invention is to provide a semiconductor device or the like having a high aperture ratio and including a capacitor capable of increasing capacitance. Another object of one embodiment of the present invention is to provide a semiconductor device with reduced display defects. Another object of one embodiment of the present invention is to provide a semiconductor device with a narrow bezel.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device which includes a transistor over a substrate; a first conductive film over a surface over which a gate electrode of the transistor is provided; a second conductive film over a surface over which a pair of electrodes of the transistor is provided; and a first light-transmitting conductive film electrically connected to the first conductive film and the second conductive film. The second conductive film overlaps the first conductive film with a gate insulating film of the transistor laid between the second conductive film and the first conductive film.

Note that in the above structure, the semiconductor device may include a second light-transmitting conductive film over the substrate; an oxide insulating film which covers the transistor and in which an opening is provided to expose part of the second light-transmitting conductive film; a nitride insulating film which is over the oxide insulating film and is in contact with the second light-transmitting conductive film through the opening; and a third light-transmitting conductive film which is connected to the transistor and which has a depressed portion in the opening.

Note that the transistor includes a gate electrode over the substrate, a gate insulating film in contact with the gate electrode, an oxide semiconductor film in contact with the gate insulating film, and a pair of conductive films in contact with the oxide semiconductor film. The second light-transmitting conductive film is in contact with the gate insulating film.

The oxide semiconductor film is over a surface over which the second light-transmitting conductive film is formed.

The second light-transmitting conductive film and the oxide semiconductor film each contain In, Ga, or Zn.

According to one embodiment of the present invention, a semiconductor device or the like having a high aperture ratio and including a capacitor capable of increasing capacitance can be formed. According to one embodiment of the present invention, a semiconductor device with reduced display defects can be formed. According to one embodiment of the present invention, a semiconductor device with a narrow bezel can be formed.

BRIEF DESCRIPTION OF DRAWINGS

FIGS. 4A to 4C are cross-sectional views illustrating one aspect of a method for manufacturing a semiconductor device.

FIGS. 5A to 5C are cross-sectional views illustrating one aspect of a method for manufacturing a semiconductor device.

FIGS. 6A to 6C are cross-sectional views illustrating one aspect of a method for manufacturing a semiconductor device.

FIGS. 7A and 7B are cross-sectional views illustrating one aspect of a method for manufacturing a semiconductor device.

FIGS. 8A to 8C are cross-sectional views illustrating one aspect of a method for manufacturing a semiconductor device.

FIGS. 11A to 11C are cross-sectional views illustrating one aspect of a method for manufacturing a semiconductor device.

FIGS. 12A to 12C are cross-sectional views illustrating one aspect of a method for manufacturing a semiconductor device.

FIGS. 16A to 16C are cross-sectional views illustrating one aspect of a method for manufacturing a semiconductor device.

BEST MODE FOR CARRYING OUT THE INVENTION

Figure 1A:
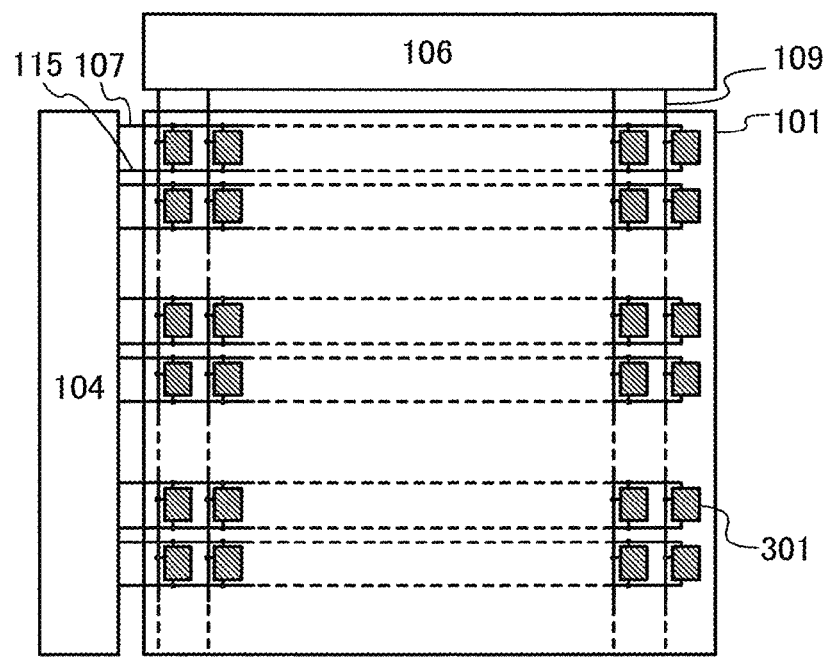
FIGS. 1A and 1B are a block diagram and a circuit diagram illustrating one aspect of a semiconductor device.

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be replaced with each other in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential is merely called a potential or a voltage, and a potential and a voltage are used as synonymous words in many cases. Thus, in this specification, a potential may be rephrased as a voltage and a voltage may be rephrased as a potential unless otherwise specified.

In this specification, in the case where an etching step is performed after a photolithography process, a mask formed in the photolithography process is removed after the etching step.

Embodiment 1

In this embodiment, a semiconductor device which is one embodiment of the present invention and a manufacturing method thereof will be described with reference to drawings.

FIG. 1A illustrates a liquid crystal display device as one example of a semiconductor device. The semiconductor device in FIG. 1A includes a pixel portion 101, a scan line driver circuit 104, a signal line driver circuit 106, m scan lines 107 which are arranged in parallel or substantially in parallel and whose potentials are controlled by the scan line driver circuit 104, and n signal lines 109 which are arranged in parallel or substantially in parallel and whose potentials are controlled by the signal line driver circuit 106. Further, the pixel portion 101 includes a plurality of pixels 301 arranged in a matrix. Capacitor lines 115 which are arranged in parallel or almost in parallel to the scan lines 107 are also provided. The capacitor lines 115 may be arranged in parallel or almost in parallel to the signal lines 109. The scan line driver circuit 104 and the signal line driver circuit 106 are collectively referred to as a driver circuit portion in some cases.

Each scan line 107 is electrically connected to the n pixels 301 in the corresponding row among the pixels 301 arranged in m rows and n columns in the pixel portion 101. Each signal line 109 is electrically connected to the m pixels 301 in the corresponding column among the pixels 301 arranged in m rows and n columns Note that m and n are each an integer of 1 or more. Each the capacitor line 115 is electrically connected to the n pixels 301 in the corresponding row among the pixels 301 arranged in m rows and n columns. Note that in the case where the capacitor lines 115 are arranged in parallel or substantially in parallel along the signal lines 109, each the capacitor line 115 is electrically connected to the m pixels 301 in the corresponding column among the pixels 301 arranged in m rows and n columns.

Figure 1B:
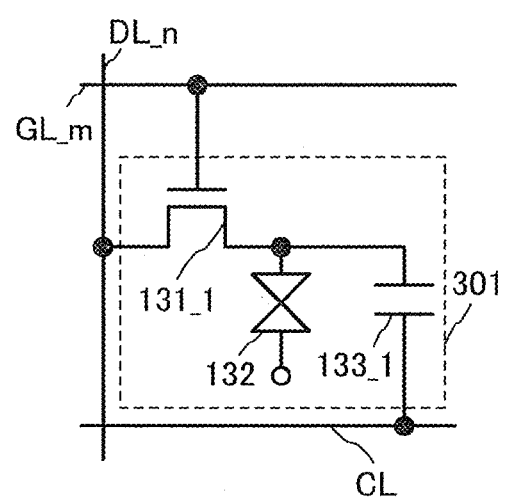

FIG. 1B illustrates a circuit structure that can be used for the pixel 301 in the liquid crystal display device illustrated in FIG. 1A.

The pixel 301 illustrated in FIG. 1B includes a liquid crystal element 132, a transistor 131_1, and a capacitor 133_1.

The potential of one of a pair of electrodes of the liquid crystal element 132 is set according to the specifications of the pixels 301 as appropriate. The alignment state of the liquid crystal element 132 depends on written data. A common potential may be applied to one of the pair of electrodes of the liquid crystal element 132 included in each of the plurality of pixels 301. Further, the potential supplied to one of a pair of electrodes of the liquid crystal element 132 in the pixel 301 in one row may be different from the potential supplied to one of a pair of electrodes of the liquid crystal element 132 in the pixel 301 in another row. Alternatively, in the IPS mode or the FFS mode, one of the pair of electrodes of the liquid crystal element 132 can be connected to a capacitor line CL.

As examples of a driving method of the liquid crystal display device including the liquid crystal element 132, any of the following modes can be given: a TN mode, an STN mode, a VA mode, an ASM (axially symmetric aligned micro-cell) mode, an OCB (optically compensated birefringence) mode, an FLC (ferroelectric liquid crystal) mode, an AFLC (antiferroelectric liquid crystal) mode, an MVA mode, a PVA (patterned vertical alignment) mode, an IPS mode, an FFS mode, a TBA (transverse bend alignment) mode, and the like. Other examples of the driving method of the liquid crystal display device include ECB (electrically controlled birefringence) mode, PDLC (polymer dispersed liquid crystal) mode, PNLC (polymer network liquid crystal) mode, and a guest-host mode. Note that the present invention is not limited to this, and various liquid crystal elements and driving methods can be used as a liquid crystal element and a driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel 301 in the m-th row and the n-th column, one of a source electrode and a drain electrode of the transistor 131_1 is electrically connected to a signal line DL_n, and the other is electrically connected to the other of a pair of electrodes of the liquid crystal element 132. A gate of the transistor 131_1 is electrically connected to the scan line GL_m. The transistor 131_1 has a function of controlling whether to write a data signal by being turned on or off.

One of a pair of electrodes of the capacitor 133_1 is electrically connected to a wiring to which a potential is supplied (hereinafter referred to as a capacitor line CL), and the other is electrically connected to the other of the pair of electrodes of the liquid crystal element 132. The potential of the capacitor line CL is set according to the specifications of the pixel 301 as appropriate. The capacitor 133_1 functions as a storage capacitor for storing written data. Note that in the IPS mode or the FFS mode, one of the pair of electrodes of the capacitor 133_1 can be electrically connected to one of the pair of electrodes of the liquid crystal element 132.

For example, in the liquid crystal display device including the pixel 301 in FIG. 1B, the pixels 301 are sequentially selected row by row by the scan line driver circuit 104, whereby the transistors 131_1 are turned on and a data signal is written.

When the transistors 131_1 are turned off, the pixels 301 in which the data has been written are brought into a holding state. This operation is sequentially performed row by row; thus, an image is displayed.

Note that in this specification and the like, examples of liquid crystal display devices having liquid crystal elements are a transmissive liquid crystal display device, a transflective liquid crystal display device, a reflective liquid crystal display device, a direct-view liquid crystal display device, and a projection liquid crystal display. An example of the liquid crystal element is an element that controls transmission or non-transmission of light by optical modulation action of liquid crystals. The element can include a pair of electrodes and a liquid crystal layer. The optical modulation action of liquid crystal is controlled by an electric field applied to the liquid crystal (including a horizontal electric field, a vertical electric field, and a diagonal electric field). Note that specifically, the following can be used for a liquid crystal element, for example: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a banana-shaped liquid crystal, and the like.

Instead of a liquid crystal display device, one example of a semiconductor device can be a display element, a display device, a light-emitting device, and the like. A display element, a display device which is a device including a display element, a light-emitting element, and a light-emitting device which is a device including a light-emitting element can employ various modes and can include various elements. Examples of a display element, a display device, a light-emitting element, or a light-emitting device include an LED (e.g., a white LED, a red LED, a green LED, or a blue LED), a transistor (a transistor which emits light depending on current), an electron emitter, a liquid crystal element, electronic ink, an electrophoretic element, an electrowetting element, a grating light valve (GLV), a plasma display panel (PDP), a micro electro mechanical system (MEMS), a digital micromirror device (DMD), a digital micro shutter (DMS), an interferometic modulator display (IMOD), a piezoelectric ceramic display, or a carbon nanotube, which are display media whose contrast, luminance, reflectivity, transmittance, or the like is changed by electromagnetic action. Display devices having electron emitters include a field emission display (FED), an SED-type flat panel display (SED: surface-conduction electron-emitter display), and the like. Display devices having electronic ink or electrophoretic elements include electronic paper and the like.

Figure 2:
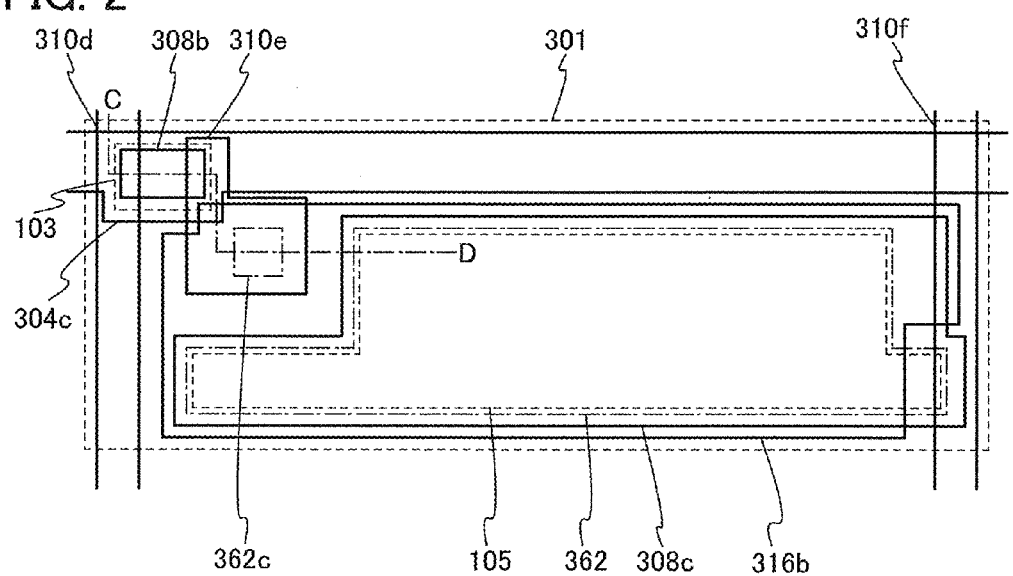
FIG. 2 is a top view illustrating one aspect of a semiconductor device.

Next, a specific example of a liquid crystal display device using the pixel 301 as a liquid crystal element. FIG. 2 is a top view of the pixel 301 illustrated in FIG. 1B. Note that in FIG. 2, the counter electrode and the liquid crystal element are omitted.

In FIG. 2, a conductive film 304c serving as a scan line extends substantially perpendicularly to the signal line (in the horizontal direction in the drawing). A conductive film 310d serving as a signal line extends substantially perpendicularly to the scan line (in the vertical direction in the drawing). A conductive film 310f serving as a capacitor line extends in parallel to the signal line. Note that the conductive film 304c serving as a scan line is electrically connected to the scan line driver circuit 104 (see FIG. 1A), and the conductive film 310d serving as a signal line and the conductive film 310f serving as a capacitor line are electrically connected to the signal line driver circuit 106 (see FIG. 1A).

The transistor 103 is provided at a region where the scan line and the signal line cross each other. The transistor 103 includes the conductive film 304c serving as a gate electrode; the gate insulating film (not illustrated in FIG. 2); an oxide semiconductor film 308b where a channel region is formed, over the gate insulating film; and the conductive films 310d and 310e serving as a source electrode and a drain electrode. The conductive film 304c also serves as a scan line, and a region of the conductive film 304c that overlaps with the oxide semiconductor film 308b serves as the gate electrode of the transistor 103. In addition, the conductive film 310d also serves as a signal line, and a region of the conductive film 310d that overlaps with the oxide semiconductor film 308b serves as the source electrode or drain electrode of the transistor 103. Further, in the top view of FIG. 2, an end portion of the scan line is located on the outer side than an end portion of the oxide semiconductor film 308b. Thus, the scan line functions as a light-blocking film for blocking light from a light source such as a backlight. For this reason, the oxide semiconductor film 308b included in the transistor is not irradiated with light, so that a variation in the electrical characteristics of the transistor can be suppressed.

The conductive film 310e is electrically connected to the light-transmitting conductive film 316b that serves as a pixel electrode, through an opening 362c.

A capacitor 105 consists of a light-transmitting conductive film 308c formed over the gate insulating film, a light-transmitting conductive film 316b functioning as a pixel electrode, and a dielectric film formed of a nitride insulating film formed over the transistor 103. That is, the capacitor 105 transmits light. Further, the capacitor 105 is connected to the conductive film 310f serving as a capacitor line through the opening 362.

Here, the light-transmitting conductive film 316b preferably has a rectangular shape as illustrated in FIG. 2. Note that one embodiment of the present invention is not limited thereto. For example, the light-transmitting conductive film 316b can have a comb shape or a shape having a slit like a pixel electrode provided in a liquid crystal display device of an FFS mode, an IPS mode, or an MVA mode.

Owing to the light-transmitting property of the capacitor 105, the capacitor 105 can be formed large (covers a large area) in the pixel 301. Thus, a liquid crystal display device having charge capacity increased while improving the aperture ratio, typically to 50% or more, preferably 55% or more, more preferably 60% or more can be obtained. For example, in a liquid crystal display device with a high resolution, the area of a pixel is small and thus the area of a capacitor is also small. For this reason, the charge capacity of the capacitor is small in the high-resolution liquid crystal display device. However, since the capacitor 105 of this embodiment transmits light, when it is provided in a pixel, enough charge capacity can be obtained in the pixel and the aperture ratio can be improved. Typically, the capacitor 105 can be favorably used in a high-resolution liquid crystal display device with a pixel density of 200 ppi or more, or furthermore, 300 ppi or more.

The pixel 301 illustrated in FIG. 2 has a shape in which a side parallel to the conductive film 310d serving as a signal line is shorter than a side parallel to the conductive film 304c serving as a scan line and the conductive film 310f serving as a capacitor line extends in parallel to the conductive film 310d serving as a signal line. As a result, the area where the conductive film 310f occupies the pixel 301 can be decreased, thereby increasing the aperture ratio. In addition, the conductive film 310f serving as a capacitor line does not use a connection electrode, and is in a direct contact with the light-transmitting conductive film 308c and thus the aperture ratio can be further increased.

Further, according to one embodiment of the present invention, the aperture ratio can be improved even in a liquid crystal display device with a high resolution, which makes it possible to use light from a light source such as a backlight efficiently, so that power consumption of the liquid crystal display device can be reduced.

Figure 3:
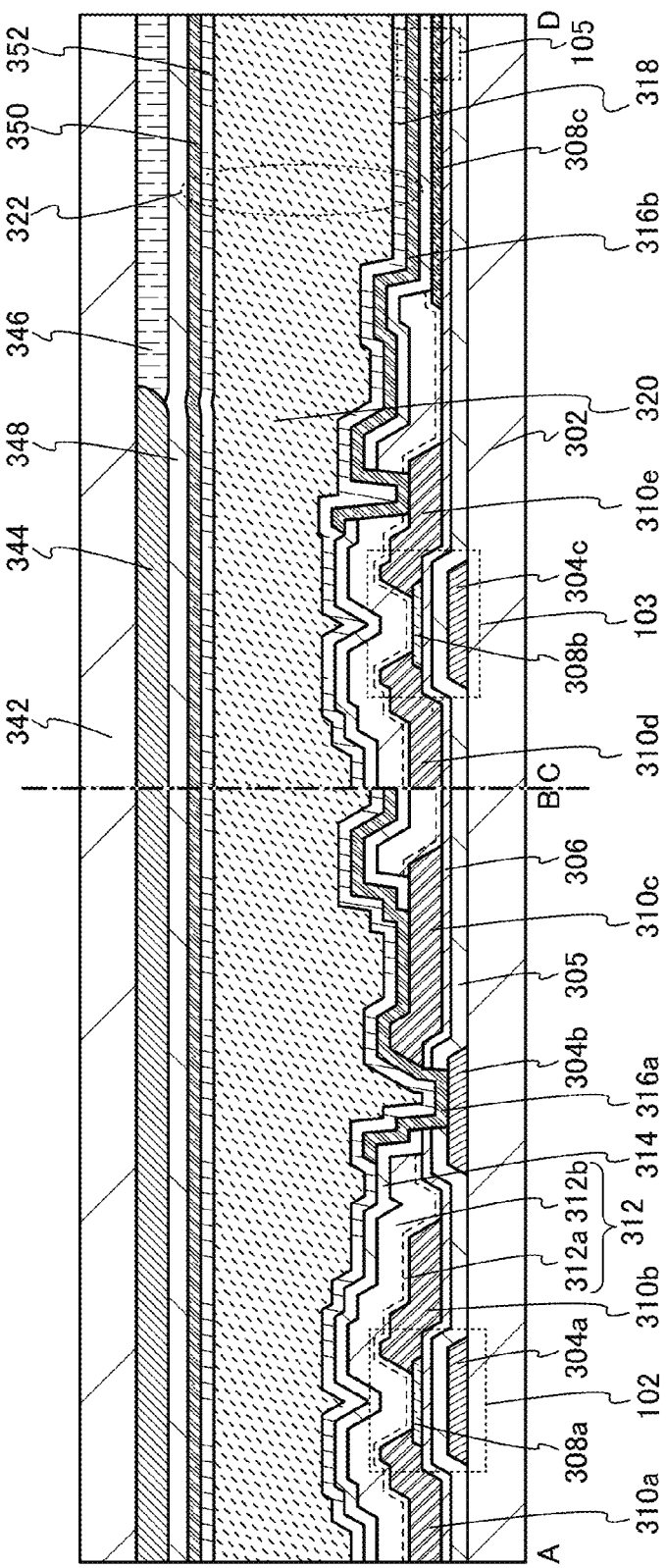
FIG. 3 is a cross-sectional view illustrating one aspect of a semiconductor device.

Next, FIG. 3 shows a cross section taken along dashed-dotted line C-D in FIG. 2. Note that a cross section A-B in FIG. 3 is a cross-sectional view of a driver circuit portion (a top view thereof is omitted) including the scan line driver circuit 104 and the signal line driver circuit 106. In this embodiment, as a semiconductor device, a liquid crystal display device of a vertical electric field mode is described.

In the liquid crystal display device described in this embodiment, a liquid crystal element 322 is provided between a pair of substrates (a substrate 302 and a substrate 342).

The liquid crystal element 322 includes the light-transmitting conductive film 316b over the substrate 302, films controlling alignment (hereinafter referred to as alignment films 318 and 352), a liquid crystal layer 320, and a conductive film 350. Note that the light-transmitting conductive film 316b functions as one electrode of the liquid crystal element 322, and the conductive film 350 functions as the other electrode of the liquid crystal element 322.

Thus, a "liquid crystal display device" refers to a device including a liquid crystal element. Note that the liquid crystal display device includes a driver circuit for driving a plurality of pixels and the like. The liquid crystal display device may also be referred to as a liquid crystal module including a control circuit, a power supply circuit, a signal generation circuit, a backlight module, and the like provided over another substrate.

In the driver circuit portion, the transistor 102 includes the conductive film 304a functioning as a gate electrode, insulating films 305 and 306 collectively functioning as a gate insulating film, the oxide semiconductor film 308a in which a channel region is formed, and the conductive films 310a and 310b functioning as a source electrode and a drain electrode. The oxide semiconductor film 308a is provided over the gate insulating film. Further, insulating films 312 and 314 are provided as protective films over the conductive films 310a and 310b.

In the pixel portion, the transistor 103 includes the conductive film 304c functioning as a gate electrode, the insulating films 305 and 306 collectively functioning as a gate insulating film, the oxide semiconductor film 308b which is formed over the gate insulating film and in which a channel region is formed, and the conductive films 310d and 310e functioning as a source electrode and a drain electrode. The oxide semiconductor film 308b is provided over the gate insulating film. Further, insulating films 312 and 314 are provided as protective films over the conductive films 310d and 310e.

The light-transmitting conductive film 316b functioning as a pixel electrode is connected to the conductive film 310e through an opening provided in the insulating films 312 and 314.

Further, the capacitor 105 includes the light-transmitting conductive film 308c functioning as one electrode of the capacitor 105, the insulating film 314 functioning as a dielectric film, and the light-transmitting conductive film 316b functioning as the other electrode of the capacitor 105. The light-transmitting conductive film 308c is provided over the gate insulating film.

In the driver circuit portion, the conductive film 304b formed at the same time as the conductive films 304a and 304c and the conductive film 310c formed at the same time as the conductive films 310a, 310b, 310d, and 310e are connected to each other via the light-transmitting conductive film 316a formed at the same time as the light-transmitting conductive film 316b.

The conductive film 304b and the light-transmitting conductive film 316a are connected in an opening formed in the insulating film 312, the insulating film 314, the insulating film 305, and the insulating film 306. The conductive film 310c and the light-transmitting conductive film 316a are connected in the opening formed in the insulating film 312, the insulating film 314, the insulating film 305, and the insulating film 306. Note that in this embodiment, a nitride insulating film is used as the insulating film 314.

In this embodiment, an opening is provided in the insulating film 312 to increase the conductivity of the light-transmitting conductive film 308c which serves as one electrode of the capacitor 105. By being in contact with the insulating film 314 formed of a nitride insulating film in the opening, the light-transmitting conductive film 308c has a higher conductivity. The reason for high conductivity will be described later in detail.

Here, components of the display device shown in FIG. 3 are described below.

The conductive films 304a, 304b, and 304c are formed over the substrate 302. The conductive film 304a functions as a gate electrode of the transistor in the driver circuit portion. The conductive film 304c is formed in the pixel portion 101 and functions as a gate electrode of the transistor in the pixel portion. The conductive film 304b is formed in the scan line driver circuit 104 and connected to the conductive film 310c.

There is no particular limitation on a material and the like of the substrate 302 as long as the material has heat resistance high enough to withstand at least heat treatment performed later. For example, a glass substrate, a ceramic substrate, a quartz substrate, or a sapphire substrate may be used as the substrate 302. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used. Still alternatively, any of these substrates provided with a semiconductor element may be used as the substrate 302. In the case where a glass substrate is used as the substrate 302, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm) Thus, a large-sized liquid crystal display device can be manufactured.

Alternatively, a flexible substrate may be used as the substrate 302, and the transistor may be provided directly on the flexible substrate. Alternatively, a separation layer may be provided between the substrate 302 and the transistor. The separation layer can be used when part or the whole of an element portion formed over the separation layer is completed and separated from the substrate 302 and transferred to another substrate. In such a case, the transistor can be transferred to a substrate having low heat resistance or a flexible substrate as well.

The conductive films 304a, 304b, and 304c each can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese or zirconium may be used. The conductive films 304a, 304b, and 304c each may have a single-layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The conductive films 304a, 304b, and 304c each can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of a metal nitride (such as InN or ZnN), or the like may be provided between the conductive films 304a, 304b, and 304c and the insulating film 305 serving as part of the gate insulating film. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, in the case of using an In—Ga—Zn-based oxynitride semiconductor film, an In—Ga—Zn-based oxynitride semiconductor film whose nitrogen concentration is higher than at least those of the oxide semiconductor films 308a and 308b, specifically, an In—Ga—Zn-based oxynitride semiconductor film whose nitrogen concentration is higher than or equal to 7 at. % is used.

The insulating films 305 and 306 are formed over the substrate 302 and the conductive films 304a, 304c, and 304b. The insulating films 305 and 306 function as a gate insulating film of the transistor in the driver circuit portion and a gate insulating film of the transistor in the pixel portion 101.

The insulating film 305 is preferably formed of a nitride insulating film containing silicon nitride, silicon nitride oxide, aluminum nitride, or aluminum nitride oxide, for example.

The insulating film 306 can be formed to have a single-layer structure or a stacked-layer structure using, for example, any of silicon oxide, silicon oxynitride, silicon nitride oxide, silicon nitride, aluminum oxide, hafnium oxide, gallium oxide, and Ga—Zn-based metal oxide. The insulating film 306 may be formed using a high-k material such as hafnium silicate ($HfSi_xO_y$), hafnium silicate to which nitrogen is added, hafnium aluminate ($HfAl_xO_y$), hafnium aluminate to which nitrogen is added, hafnium oxide, or yttrium oxide, so that gate leakage current of the transistor can be reduced.

The total thickness of the insulating films 305 and 306 is greater than or equal to 5 nm and less than or equal to 400 nm, preferably greater than or equal to 10 nm and less than or equal to 300 nm, further preferably greater than or equal to 50 nm and less than or equal to 250 nm.

The oxide semiconductor films 308a and 308b and the light-transmitting conductive film 308c are formed over the insulating film 306. The oxide semiconductor film 308a is formed in a position overlapping with the conductive film 304a and functions as a channel region of the transistor in the driver circuit portion. The oxide semiconductor film 308b is formed in a position overlapping with the conductive film 304c and functions as a channel region of the transistor in the pixel portion. The light-transmitting conductive film 308c functions as one electrode of the capacitor 105.

The oxide semiconductor films 308a and 308b and the light-transmitting conductive film 308c each are typically an In—Ga oxide film, an In—Zn oxide film, or an In-M-Zn oxide film (M represents Al, Ti, Ga, Y, Zr, La, Ce, Nd, or Hf).

Note that in the case where the oxide semiconductor films 308a and 308b and the light-transmitting conductive film 308c each are an In-M-Zn oxide film, the proportions of In and M when summation of In and M is assumed to be 100 atomic % are preferably as follows: the atomic percentage of In is greater than or equal to 25 atomic % and the atomic percentage of M is less than 75 atomic %; further preferably, the atomic percentage of In is greater than or equal to 34 atomic % and the atomic percentage of M is less than 66 atomic %.

The energy gap of each of the oxide semiconductor films 308a and 308b and the light-transmitting conductive film 308c is 2 eV or more, preferably 2.5 eV or more, more preferably 3 eV or more. With the use of an oxide semiconductor having such a wide energy gap, the off-state current of the transistor can be reduced.

The thickness of each of the oxide semiconductor films 308a and 308b and the light-transmitting conductive film 308c is greater than or equal to 3 nm and less than or equal to 200 nm, preferably greater than or equal to 3 nm and less than or equal to 100 nm, more preferably greater than or equal to 3 nm and less than or equal to 50 nm.

As each of the oxide semiconductor films 308a and 308b and the light-transmitting conductive film 308c, an In—Ga—Zn oxide with an atomic ratio of In:Ga:Zn=1:1:1 or 3:1:2 can be used. Note that the atomic ratio of each of the oxide semiconductor films 308a and 308b and the light-transmitting conductive film 308c varies within a range of ±20% of the above atomic ratio as an error.

Both the oxide semiconductor films 308a and 308b and the light-transmitting conductive film 308c are formed over the gate insulating film (here, over the insulating film 306) but differ in impurity concentration. Specifically, the light-transmitting conductive film 308c has a higher impurity concentration than the oxide semiconductor films 308a and 308b. For example, the concentration of hydrogen contained in each of the oxide semiconductor films 308a and 308b is lower than $5 \times 10^{19}$ atoms/cm$^3$, preferably lower than $5 \times 10^{18}$ atoms/cm$^3$, more preferably lower than or equal to $1 \times 10^{18}$ atoms/cm$^3$, further preferably lower than or equal to $5 \times 10^{17}$ atoms/cm$^3$, still further preferably lower than or equal to $1 \times 10^{16}$ atoms/cm$^3$. The concentration of hydrogen contained in the light-transmitting conductive film 308c is higher than or equal to $8 \times 10^{19}$ atoms/cm$^3$, preferably higher than or equal to $1 \times 10^{20}$ atoms/cm$^3$, further preferably higher than or equal to $5 \times 10^{20}$ atoms/cm$^3$. The concentration of hydrogen contained in the light-transmitting conductive film 308c is greater than or equal to 2 times, preferably greater than or equal to 10 times those in the oxide semiconductor films 308a and 308b.

The light-transmitting conductive film 308c has lower resistivity than the oxide semiconductor films 308a and 308b. The resistivity of the light-transmitting conductive film 308c is preferably greater than or equal to $1 \times 10^{-8}$ times and less than or equal to $1 \times 10^{-1}$ times the resistivity of the oxide semiconductor films 308a and 308b. The resistivity of the light-transmitting conductive film 308c is typically greater than or equal to $1 \times 10^{-3}$ Ωcm and less than $1 \times 10^4$ Ωcm, preferably greater than or equal to $1 \times 10^{-3}$ Ωcm and less than $1 \times 10^{-1}$ Ωcm.

When silicon or carbon which is one of elements belonging to Group 14 is contained in the oxide semiconductor films 308a and 308b, oxygen vacancies are increased, and the oxide semiconductor films 308a and 308b each have an n-type region. Thus, the concentration of silicon or carbon (the concentration is measured by SIMS) of each of the oxide semiconductor films 308a and 308b is lower than or equal to $2\times10^{18}$ atoms/cm$^3$, preferably lower than or equal to $2\times10^{17}$ atoms/cm$^3$.

Further, the concentration of alkali metal or alkaline earth metal of each of the oxide semiconductor films 308a and 308b, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of each of the oxide semiconductor films 308a and 308b.

Further, when containing nitrogen, the oxide semiconductor films 308a and 308b each easily have an n-type region by generation of electrons serving as carriers and an increase of carrier density. Thus, a transistor including an oxide semiconductor which contains nitrogen is likely to be normally on. For this reason, nitrogen in the oxide semiconductor film is preferably reduced as much as possible; the concentration of nitrogen which is measured by SIMS is preferably set to, for example, lower than or equal to $5\times10^{18}$ atoms/cm$^3$.

An oxide semiconductor film with low carrier density is used as the oxide semiconductor films 308a and 308b. For example, an oxide semiconductor film whose carrier density is $1\times10^{17}$ /cm$^3$ or lower, preferably $1\times10^{15}$ /cm$^3$ or lower, more preferably $1\times10^{13}$ /cm$^3$ or lower, much more preferably $1\times10^{11}$ /cm$^3$ or lower is used as the oxide semiconductor films 308a and 308b.

Note that, without limitation to that described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor films 308a and 308b be set to be appropriate.

The oxide semiconductor films 308a and 308b are in contact with the films each formed using a material which can improve characteristics of the interface with the oxide semiconductor film, such as the insulating film 306 and the insulating film 312. Thus, the oxide semiconductor films 308a and 308b function as semiconductors, so that the transistors including the oxide semiconductor films 308a and 308b have excellent electrical characteristics.

Note that it is preferable to use, as the oxide semiconductor films 308a and 308b, an oxide semiconductor film in which the impurity concentration is low and density of defect states is low, in which case the transistor can have excellent electrical characteristics. Here, the state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor film in which a channel region is formed rarely has a negative threshold voltage (is rarely normally-on). A highly purified intrinsic or substantially highly purified intrinsic oxide semiconductor film has a low density of defect states and accordingly has few carrier traps in some cases. Further, the highly purified intrinsic or substantially highly purified intrinsic oxide semiconductor film has an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. Examples of the impurities include hydrogen, nitrogen, alkali metal, and alkaline earth metal.

The light-transmitting conductive film 308c is in contact with the insulating film 314 formed of a nitride insulating film in the opening 362 (see FIG. 6A). The insulating film 314 is formed using a material which prevents diffusion of impurities from the outside, such as water, alkali metal, and alkaline earth metal, into the oxide semiconductor film, and the material further includes hydrogen. Thus, when hydrogen in the insulating film 314 is diffused into the oxide semiconductor film formed at the same time as the oxide semiconductor films 308a and 308b, hydrogen is bonded to oxygen and electrons serving as carriers are generated in the oxide semiconductor film. As a result, the oxide semiconductor film has higher conductivity and functions as a conductor; in other words, the oxide semiconductor film can be an oxide semiconductor film with high conductivity. Here, a metal oxide which contains a material similar to those of the oxide semiconductor films 308a and 308b as a main component and has higher conductivity because hydrogen concentration of the metal oxide is higher than those of the oxide semiconductor films 308a and 308b is referred to as the "light-transmitting conductive film 308c".

The oxide semiconductor films 308a and 308b and the light-transmitting conductive film 308c may have a non-single crystal structure, for example. The non-single crystal structure includes a c-axis aligned crystalline oxide semiconductor (CAAC-OS) which is described later, a polycrystalline structure, a microcrystalline structure described later, or an amorphous structure, for example. Among the non-single crystal structure, the amorphous structure has the highest density of defect levels, whereas CAAC-OS has the lowest density of defect levels. Note that the oxide semiconductor films 308a and 308b and the light-transmitting conductive film 308c have the same crystallinity.

Note that the oxide semiconductor films 308a and 308b and the light-transmitting conductive film 308c each may be a mixed film including two or more of the following: a region having an amorphous structure, a region having a microcrystalline structure, a region having a polycrystalline structure, a CAAC-OS region, and a region having a single-crystal structure. The mixed film has two or more of a region having an amorphous structure, a region having a microcrystalline structure, a region having a polycrystalline structure, a CAAC-OS region, and a region having a single-crystal structure in some cases. Further, the mixed film has a stacked-layer structure of two or more of a region having an amorphous structure, a region having a microcrystalline structure, a region having a polycrystalline structure, a CAAC-OS region, and a region having a single-crystal structure in some cases.

Note that one embodiment of the present invention is not limited thereto, and it is possible that the light-transmitting conductive film 308c be not in contact with the insulating film 314 depending on circumstances.

Further, one embodiment of the present invention is not limited thereto, and the light-transmitting conductive film 308c may be formed by a different process from that of the oxide semiconductor film 308a or the oxide semiconductor film 308b depending on circumstances. In that case, the light-transmitting conductive film 308c may include a different material from that of the oxide semiconductor film 308a or the oxide semiconductor film 308b. For example, the light-transmitting conductive film 308c may include indium tin oxide (hereinafter referred to as ITO), indium zinc oxide, or the like.

In the liquid crystal display device illustrated in this embodiment, one electrode of the capacitor is formed at the same time as the oxide semiconductor film of the transistor. In addition, the light-transmitting conductive film that serves as a pixel electrode is used as the other electrode of the capacitor. Thus, a step of forming another conductive film is not needed to form the capacitor, and the number of steps of manufacturing the liquid crystal display device can be reduced. Further, since the capacitor has a pair of electrodes formed with the light-transmitting conductive film, it can have a light-transmitting property. As a result, the area occupied by the capacitor can be increased and the aperture ratio in a pixel can be increased.

The conductive films 310a, 310b, 310c, 310d, and 310e are formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

By forming the conductive film 310c to overlap the conductive film 304b, the bezel can be narrower. Therefore, the area of the driver circuit portion can be reduced. Accordingly, the bezel of the display device can be narrower.

The insulating films 312 and 314 are formed over the insulating film 306, the oxide semiconductor films 308a and 308b, the light-transmitting conductive film 308c, and the conductive films 310a, 310b, 310c, 310d, and 310e. For the insulating film 312, in a manner similar to that of the insulating film 306, a material which can improve characteristics of the interface with the oxide semiconductor film is preferably used. The insulating film 312 can be formed using an oxide insulating film. Here, the insulating film 312 is formed by stacking insulating films 312a and 312b.

The insulating film 312a is an oxide insulating film through which oxygen is passed. Note that the insulating film 312a also serves as a film which relieves damage to the oxide semiconductor films 308a and 308b and the light-transmitting conductive film 308c at the time of forming the insulating film 312b later.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 312a. Note that in this specification, a "silicon oxynitride film" refers to a film that contains oxygen at a higher proportion than nitrogen, and a "silicon nitride oxide film" refers to a film that contains nitrogen at a higher proportion than oxygen.

Further, it is preferable that the amount of defects in the insulating film 312a be small, typically the spin density of a signal which appears at g=2.001 due to a dangling bond of silicon, be lower than or equal to $3 \times 10^{17}$ spins/cm$^3$ by ESR measurement. This is because if the density of defects in the insulating film 312a is high, oxygen is bonded to the defects and the amount of oxygen that passes through the insulating film 312a is decreased.

Further, it is preferable that the amount of defects at the interface between the insulating film 312a and the oxide semiconductor film 308a, the oxide semiconductor film 308b, and the light-transmitting conductive film 308c be small, typically the spin density of a signal which appears at g=1.93 due to an oxygen vacancy in the oxide semiconductor films 308a and 308b and the light-transmitting conductive film 308c be lower than or equal to $1 \times 10^{17}$ spins/cm$^3$, more preferably lower than or equal to the lower limit of detection by ESR measurement.

Note that in the insulating film 312a, all oxygen entering the insulating film 312a from the outside does not move to the outside of the insulating film 312a and some oxygen remains in the insulating film 312a. Further, movement of oxygen occurs in the insulating film 312a in some cases in such a manner that oxygen enters the insulating film 312a and oxygen contained in the insulating film 312a is moved to the outside of the insulating film 312a.

When the oxide insulating film through which oxygen is passed is formed as the insulating film 312a, oxygen released from the insulating film 312b provided over the insulating film 312a can be moved to the oxide semiconductor films 308a and 308b and the light-transmitting conductive film 308c through the insulating film 312a.

The insulating film 312b is formed in contact with the insulating film 312a. The insulating film 312b is preferably formed using an oxide insulating film which contains oxygen at a higher proportion than the stoichiometric composition. Part of oxygen is released by heating from the oxide insulating film which contains oxygen at a higher proportion than the stoichiometric composition. The oxide insulating film containing oxygen at a higher proportion than the stoichiometric composition is an oxide insulating film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 312b.

Further, it is preferable that the amount of defects in the insulating film 312b be small, typically the spin density of a signal which appears at g=2.001 originating from a dangling bond of silicon, be lower than $1.5 \times 10^{18}$ spins/cm$^3$, more preferably lower than or equal to $1 \times 10^{18}$ spins/cm$^3$ by ESR measurement. Note that the insulating film 312b is provided more apart from the oxide semiconductor films 308a and 308b and the light-transmitting conductive film 308c than the insulating film 312a is; thus, the insulating film 312b may have higher defect density than the insulating film 312a.

Further, it is possible to prevent outward diffusion of oxygen from the oxide semiconductor films 308a and 308b and the light-transmitting conductive film 308c by providing the nitride insulating film having a blocking effect against oxygen, hydrogen, water, alkali metal, alkaline earth metal, and the like as the insulating film 314. The nitride insulating film is formed using silicon nitride, silicon nitride oxide, aluminum nitride, aluminum nitride oxide, or the like.

Note that over the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, aluminum oxide, aluminum oxynitride, gallium oxide, gallium oxynitride, yttrium oxide, yttrium oxynitride, hafnium oxide, and hafnium oxynitride can be given. In order to control the charge capacity of the capacitor, a nitride insulating film or an oxide insulating film may be further provided over the nitride insulating film having a blocking effect against oxygen, hydrogen, water, alkali metal, alkaline earth metal, and the like, as appropriate.

Further, the light-transmitting conductive films 316a and 316b are provided over the insulating film 314. The light-transmitting conductive film 316a is electrically connected to the conductive films 304b and 310c through the opening 364a (see FIG. 6C). That is, the light-transmitting conductive film 316a functions as a connection electrode which connects the conductive film 304b and the conductive film 310c. The light-transmitting conductive film 316b is electrically connected to the conductive film 310e through the opening 364b (see FIG. 6C) and functions as the pixel electrode of a pixel. Further, the light-transmitting conductive film 316b can function as one of the pair of electrodes of the capacitor.

In order to form a connection structure in which the conductive film 304b is in direct contact with the conductive film 310c, it is necessary to perform patterning for forming an opening in the insulating films 305 and 306 and to form a mask before the conductive film 310c is formed. However, when the conductive film 304b is connected to the conductive film 310c with the light-transmitting conductive film 316a as shown in FIG. 3, it is not necessary to form a connection portion where the conductive film 304b is in contact with the conductive film 310c. Thus, the number of photomasks can be reduced by one. That is, steps of forming a liquid crystal display device can be reduced.

For the light-transmitting conductive films 316a and 316b, a light-transmitting conductive material such as indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added can be used.

The alignment film 318 can be formed using an organic resin such as polyimide. The thickness of the alignment film 318 is greater than or equal to 40 nm and less than or equal to 100 nm, preferably greater than or equal to 50 nm and less than or equal to 90 nm With such a thickness, the pretilt angles of the liquid crystal molecules can be made large, which can reduce disclination.

A film having a colored property (hereinafter referred to as a colored film 346) is formed on the substrate 342. The colored film 346 functions as a color filter. Further, a light-blocking film 344 adjacent to the colored film 346 is formed on the substrate 342. The light-blocking film 344 functions as a black matrix. The colored film 346 is not necessarily provided in the case where the liquid crystal display device is a monochrome display device, for example.

The colored film 346 is a colored film that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used.

The light-blocking film 344 preferably has a function of blocking light in a particular wavelength region, and can be a metal film or an organic insulating film including a black pigment.

An insulating film 348 is formed on the colored film 346. The insulating film 348 functions as a planarization layer or suppresses diffusion of impurities in the colored film 346 to the liquid crystal element side.

The conductive film 350 is formed on the insulating film 348. The conductive film 350 functions as the other of the pair of electrodes of the liquid crystal element in the pixel portion. Note that the alignment film 318 is formed over the light-transmitting conductive films 316a and 316b and the insulating film 352 is formed over the conductive film 350.

The liquid crystal layer 320 is formed between the light-transmitting conductive film 316a and the conductive film 350, and the light-transmitting conductive film 316b and the conductive film 350. The liquid crystal layer 320 is sealed between the substrate 302 and the substrate 342 with the use of a sealant (not illustrated). The sealant is preferably in contact with an inorganic material to prevent entry of moisture and the like from the outside.

A spacer may be provided between the light-transmitting conductive film 316a and the conductive film 350, and the light-transmitting conductive film 316b and the conductive film 350 to maintain the thickness of the liquid crystal layer 320 (also referred to as a cell gap).

A formation method of the element portion over the substrate 302 in the liquid crystal display device illustrated in FIG. 3 is described with reference to FIGS. 4A to 4C, FIGS. 5A to 5C, FIGS. 6A to 6C, and FIGS. 7A and 7B. Here, the element portion provided over the substrate 302 refers to a region sandwiched between the substrate 302 and the alignment film 318.

First, the substrate 302 is prepared. Here, a glass substrate is used as the substrate 302.

Then, a conductive film is formed over the substrate 302 and processed into desired regions, so that the conductive films 304a, 304b, and 304c are formed. The conductive films 304a, 304b, and 304c can be formed in such a manner that a mask is formed over the desired regions by first patterning and regions not covered with the mask are etched (see FIG. 4A).

The conductive films 304a, 304b, and 304c can be typically formed by an evaporation method, a CVD method, a sputtering method, a spin coating method, or the like.

Next, the insulating film 305 is formed over the substrate 302 and the conductive films 304a, 304b, and 304c, and then the insulating film 306 is formed over the insulating film 305 (see FIG. 4A).

The insulating films 305 and 306 can be formed by a sputtering method, a CVD method, or the like. Note that it is preferable that the insulating films 305 and 306 be formed in succession in a vacuum, in which case entry of impurities is suppressed.

Next, an oxide semiconductor film 307 is formed over the insulating film 306 (see FIG. 4B).

The oxide semiconductor film 307 can be formed by a sputtering method, a coating method, a pulsed laser deposition method, a laser ablation method, or the like.

Next, the oxide semiconductor film 307 is processed into desired regions, so that the island-shaped oxide semiconductor films 308a, 308b, and 308d are formed. The oxide semiconductor films 308a, 308b, and 308d can be formed in such a manner that a mask is formed over the desired regions by second patterning and regions not covered with the mask are etched. For the etching, dry etching, wet etching, or a combination of both can be employed (see FIG. 4C).

After that, hydrogen, water, and the like may be released from the oxide semiconductor films 308a, 308b, and 308d by heat treatment and hydrogen and water in the oxide semiconductor films 308a, 308b, and 308d may be reduced. As a result, highly purified oxide semiconductor films 308a, 308b, and 308d can be formed. The heat treatment is performed typically at a temperature higher than or equal to 250° C. and lower than or equal to 650° C., preferably higher than or equal to 300° C. and lower than or equal to 500° C. The heat treatment is performed typically at a temperature higher than or equal to 300° C. and lower than or equal to 400° C., preferably higher than or equal to 320° C. and lower than or equal to 370° C., whereby warp or shrinking of a large-sized substrate can be reduced and yield can be improved.

An electric furnace, an RTA apparatus, or the like can be used for the heat treatment. With the use of an RTA apparatus, the heat treatment can be performed at a temperature of higher than or equal to the strain point of the substrate if the heating time is short. Thus, the heat treatment time can be shortened and warp of the substrate during the heat treatment can be reduced, which is particularly preferable in a large-sized substrate.

The heat treatment may be performed under an atmosphere of nitrogen, oxygen, ultra-dry air (air in which a water content is 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like. Further, after heat treatment performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the amount of oxygen vacancies in the oxide semiconductor film can be reduced.

Next, a conductive film 309 is formed over the insulating film 306 and the oxide semiconductor films 308a, 308b, and 308d (see FIG. 5A).

The conductive film 309 can be formed by a sputtering method, for example.

Then, the conductive film 309 is processed into desired regions, so that the conductive films 310a, 310b, 310c, 310d, and 310e are formed. The conductive films 310a, 310b, 310c, 310d, and 310e can be formed in such a manner that a mask is formed over the desired regions by third patterning and regions not covered with the mask are etched (see FIG. 5B).

Note that the conductive film 310c is formed to overlap the conductive film 304b, so that the conductive film 304b and the conductive film 310c can be electrically connected through the light-transmitting conductive film 316a at a short distance; therefore, the area of the driver circuit portion can be reduced. Accordingly, the bezel of the display device can be narrower. Further, a large area of contact between the light-transmitting conductive film 316a and the conductive film 310c enables reduction in contact resistance.

Next, an insulating film 311 in which insulating films 311a and 311b are stacked is formed to cover the insulating film 306, the oxide semiconductor films 308a, 308b, and 308d, and the conductive films 310a, 310b, 310c, 310d, and 310e (see FIG. 5C).

Note that after the insulating film 311a is formed, the insulating film 311b is preferably formed in succession without exposure to the air. After the insulating film 311a is formed, the insulating film 311b is formed in succession by adjusting at least one of the flow rate of a source gas, pressure, a high-frequency power, and a substrate temperature without exposure to the air, whereby the concentration of impurities attributed to the atmospheric component at the interface between the insulating film 311a and the insulating film 311b can be reduced and oxygen in the insulating film 311b can be moved to the oxide semiconductor films 308a, 308b, and 308d; accordingly, the amount of oxygen vacancies in the oxide semiconductor films 308a, 308b, and 308d can be reduced.

As the insulating film 311a, a silicon oxide film or a silicon oxynitride film can be formed under the following conditions: the substrate placed in a treatment chamber of a plasma CVD apparatus that is vacuum-evacuated is held at a temperature higher than or equal to 180° C. and lower than or equal to 400° C., preferably higher than or equal to 200° C. and lower than or equal to 370° C., the pressure is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber.

A deposition gas containing silicon and an oxidizing gas are preferably used as the source gas of the insulating film 311a. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

With the use of the above conditions, an oxide insulating film through which oxygen is passed can be formed as the insulating film 311a. Further, by providing the insulating film 311a, damage to the oxide semiconductor films 308a, 308b, and 308d can be reduced in a step of forming the insulating film 311b which is formed later.

As for the insulating film 311a, a silicon oxide film or a silicon oxynitride film can be formed as the insulating film 311a under the following conditions: the substrate placed in a treatment chamber of a plasma CVD apparatus that is vacuum-evacuated is held at a temperature higher than or equal to 280° C. and lower than or equal to 400° C., the pressure is greater than or equal to 100 Pa and less than or equal to 250 Pa with introduction of a source gas into the treatment chamber, and a high-frequency power is supplied to an electrode provided in the treatment chamber.

Under the above film formation conditions, the bonding strength of silicon and oxygen becomes strong when the substrate temperature is the deposition temperature of the insulating film 311a. Thus, as the insulating film 311a, a dense and hard oxide insulating film through which oxygen is passed, typically, a silicon oxide film or a silicon oxynitride film of which etching using hydrofluoric acid of 0.5 wt % at 25° C. is performed at a rate of lower than or equal to 10 nm/min, preferably lower than or equal to 8 nm/min can be formed.

The insulating film 311a is formed while heating is performed; thus, hydrogen, water, or the like contained in the oxide semiconductor films 308a, 308b, and 308d can be released in the step.

Further, time for heating in a state where the oxide semiconductor films 308a, 308b, and 308d are exposed can be shortened because heating is performed in a step of forming the insulating film 311a. Thus, the amount of oxygen released from the oxide semiconductor film by heat treatment can be reduced. That is, the amount of oxygen vacancies in the oxide semiconductor film can be reduced.

Note that by setting the pressure in the treatment chamber to be greater than or equal to 100 Pa and less than or equal to 250 Pa, the amount of water contained in the insulating film 311a is reduced; thus, variation in electrical characteristics of the transistor can be reduced and change in threshold voltage can be inhibited.

Further, by setting the pressure in the treatment chamber to be greater than or equal to 100 Pa and less than or equal to 250 Pa, damage to the oxide semiconductor films 308a, 308b, and 308d can be reduced when the insulating film 311a is formed, so that the amount of oxygen vacancies contained in the oxide semiconductor films 308a, 308b, and 308d can be reduced. In particular, when the film formation temperature of the insulating film 311a or the insulating film 311b which is formed later is set to be high, typically higher than 220° C., part of oxygen contained in the oxide semiconductor films 308a, 308b, and 308d is released and oxygen vacancies are easily formed. Further, when the film formation conditions for reducing the amount of defects in the insulating film 311b which is formed later are used to increase reliability of the transistor, the amount of released oxygen is easily reduced. Thus, it is difficult to reduce oxygen vacancies in the oxide semiconductor films 308a, 308b, and 308d in some cases. However, by setting the pressure in the treatment chamber to be greater than or equal to 100 Pa and less than or equal to 250 Pa to reduce damage to the oxide semiconductor films 308a, 308b, and 308d at the time of forming the insulating film 311a, oxygen vacancies in the oxide semiconductor films 308a, 308b, and 308d can be reduced even when the amount of oxygen released from the insulating film 311b is small.

Note that when the ratio of the amount of the oxidizing gas to the amount of the deposition gas containing silicon is 100 or higher, the hydrogen content in the insulating film 311a can be reduced. Consequently, the amount of hydrogen entering the oxide semiconductor films 308a, 308b, and 308d can be reduced; thus, the negative shift in the threshold voltage of the transistor can be inhibited.

As the insulating film 311b, a silicon oxide film or a silicon oxynitride film is formed under the conditions as follows: the substrate placed in a vacuum-evacuated treatment chamber of a plasma CVD apparatus is held at a temperature higher than or equal to 180° C. and lower than or equal to 280° C., preferably higher than or equal to 200° C. and lower than or equal to 240° C.; to the treatment chamber is charged a source gas at a pressure greater than or equal to 100 Pa and less than or equal to 250 Pa, preferably greater than or equal to 100 Pa and less than or equal to 200 Pa; and high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

A deposition gas containing silicon and an oxidizing gas are preferably used as the source gas of the insulating film 311b. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

As the film formation conditions of the insulating film 311b, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content in the insulating film 311b becomes higher than the stoichiometric composition. However, when the substrate temperature is the deposition temperature of the insulating film 311b, the bond between silicon and oxygen is weak, and accordingly, part of oxygen is released by heat treatment. Thus, it is possible to form an oxide insulating film which contains oxygen at a higher proportion than the stoichiometric composition and from which part of oxygen is released by heating. Further, the insulating film 311a is provided over the oxide semiconductor films 308a, 308b, and 308d. Accordingly, in the step of forming the insulating film 311b, the insulating film 311a serves as a protective film of the oxide semiconductor films 308a, 308b, and 308d. Consequently, the insulating film 311b can be formed using the high-frequency power having a high power density while damage to the oxide semiconductor films 308a, 308b, and 308d is reduced.

Note that in the film formation conditions of the insulating film 311b, the flow rate of the deposition gas containing silicon relative to the oxidizing gas can be increased, whereby the amount of defects in the insulating film 311b can be reduced. Typically, it is possible to form an oxide insulating film in which the amount of defects is small, i.e., the spin density of a signal which appears at g=2.001 originating from a dangling bond of silicon is lower than $6\times10^{17}$ spins/cm$^3$, preferably lower than or equal to $3\times10^{17}$ spins/cm$^3$, more preferably lower than or equal to $1.5\times10^{17}$ spins/cm$^3$ by ESR measurement. As a result, the reliability of the transistor can be improved.

Next, heat treatment is performed. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. The heat treatment is performed typically at a temperature higher than or equal to 300° C. and lower than or equal to 400° C., preferably higher than or equal to 320° C. and lower than or equal to 370° C., whereby warp or shrinking of a large-sized substrate can be reduced and yield can be improved.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

The heat treatment may be performed under an atmosphere of nitrogen, oxygen, ultra-dry air (air in which a water content is 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the insulating film 311b can be moved to the oxide semiconductor films 308a, 308b, and 308d to reduce the oxygen vacancies in the oxide semiconductor films 308a, 308b, and 308d. Consequently, the amount of oxygen vacancies in the oxide semiconductor films 308a, 308b, and 308d can be further reduced.

Further, in the case where water, hydrogen, or the like is contained in the insulating film 311a and the insulating film 311b, when the insulating film 313 having a function of blocking water, hydrogen, and the like is formed later and heat treatment is performed, water, hydrogen, or the like contained in the insulating film 311a and the insulating film 311b are moved to the oxide semiconductor films 308a, 308b, and 308d, so that defects are generated in the oxide semiconductor films 308a, 308b, and 308d. However, by the heating, water, hydrogen, or the like contained in the insulating film 311a and the insulating film 311b can be released; thus, variation in electrical characteristics of the transistor can be reduced, and change in threshold voltage can be inhibited.

Note that when the insulating film 311b is formed over the insulating film 311a while being heated, oxygen can be moved to the oxide semiconductor films 308a, 308b, and 308d to compensate the oxygen vacancies in the oxide semiconductor films 308a, 308b, and 308d; thus, the heat treatment is not necessarily performed.

Further, when the conductive films 310a, 310b, 310d, and 310e are formed, the oxide semiconductor films 308a, 308b, and 308d are damaged by the etching of the conductive film, so that oxygen vacancies are generated on the back channel sides (the sides of the oxide semiconductor films 308a and 308b which are opposite to the sides facing the conductive films 304a and 304c which serve as gate electrodes) of the oxide semiconductor films 308a and 308b. However, with the use of the oxide insulating film containing oxygen at a higher proportion than the stoichiometric composition as the insulating film 311b, the oxygen vacancies generated on the back channel side can be repaired by heat treatment. By this, defects contained in the oxide semiconductor films 308a and 308b can be reduced, and thus, the reliability of the transistor can be improved.

Note that the heat treatment may be performed after the formation of the opening 362 to be formed later.

Next, the insulating film 311 is processed into desired regions so that the insulating film 312 and the opening 362 are formed. The insulating film 311 and the opening 362 can be formed in such a manner that a mask is formed over the desired regions by fourth patterning and regions not covered with the mask are etched (see FIG. 6A). Note that part of the insulating film 311 in a region overlapping the conductive film 304b is also etched.

The opening 362 is formed so as to expose the surface of the oxide semiconductor film 308d. An example of a formation method of the opening 362 includes, but not limited to, a dry etching method. Alternatively, a wet etching method or a combination of dry etching and wet etching can be employed for formation of the opening 362.

Next, an insulating film 313 is formed over the insulating films 306 and 312 and the oxide semiconductor film 308d (see FIG. 6B).

The insulating film 313 is preferably formed using a material that can prevent an external impurity such as oxygen, hydrogen, water, alkali metal, or alkaline earth metal, from diffusing into the oxide semiconductor film, more preferably formed using the material including hydrogen, and typically an inorganic insulating material containing nitrogen, such as a nitride insulating film, can be used. The insulating film 313 can be formed by a CVD method, for example.

The insulating film 313 is formed using a material which prevents diffusion of impurities from the outside, such as water, an alkali metal, and an alkaline earth metal, into the oxide semiconductor film, and the material further includes hydrogen. Thus, when hydrogen in the insulating film 313 diffuses into the oxide semiconductor film 308d, hydrogen is bonded to oxygen in the oxide semiconductor film 308d, thereby producing an electron serving as a carrier. As a result, the conductivity of the oxide semiconductor film 308d is increased, so that the oxide semiconductor film 308d becomes a light-transmitting conductive film 308c.

The silicon nitride film is preferably formed at a high temperature to have an improved blocking property; for example, the silicon nitride film is preferably formed at a temperature in the range from the substrate temperature of 100° C. to 400° C., more preferably at a temperature in the range from 300° C. to 400° C. When the silicon nitride film is formed at a high temperature, a phenomenon in which oxygen is released from the oxide semiconductor used for the oxide semiconductor films 308a and 308b and the carrier density is increased is caused in some cases; therefore, the upper limit of the temperature is a temperature at which the phenomenon is not caused.

Then, the insulating film 313, the insulating film 312, the insulating film 306, and the insulating film 305 are processed into desired regions so that the insulating film 314 and the openings 364a and 364b are formed. The insulating film 314 and the openings 364a and 364b can be formed in such a manner that a mask is formed over the desired regions by fifth patterning and regions not covered by the mask are etched (see FIG. 6C).

The opening 364a is formed to expose the surfaces of the conductive film 304a and the conductive film 310c. The opening 364b is formed so as to expose the surface of the conductive film 310e.

An example of a formation method of the openings 364a and 364b includes, but not limited to, a dry etching method. Alternatively, a wet etching method or a combination of dry etching and wet etching can be employed for formation of the openings 364a and 364b.

By providing the opening 364a in this manner, the coverage of a film which is formed over the opening 364a, the insulating film 305, the insulating film 306, and the conductive film 310c, which are formed later, can be improved.

Next, a light-transmitting conductive film 315 is formed over the insulating film 314 to cover the opening 364a and the opening 364b (see FIG. 7A).

The light-transmitting conductive film 315 can be formed by a sputtering method, for example.

Then, the light-transmitting conductive film 315 is processed into desired regions so that the light-transmitting conductive films 316a and 316b are formed. The light-transmitting conductive films 316a and 316b are formed in such a manner that a mask is formed in the desired regions by sixth patterning and regions not covered with the mask are etched (see FIG. 7B).

Through the above process, the pixel portion and the driver circuit portion that include transistors can be formed over the substrate 302. In the manufacturing process described in this embodiment, the transistors and the capacitor can be formed at the same time by the first to sixth patterning or by the first to sixth patterning, that is, with the six masks or with the seven masks.

In this embodiment, the conductivity of the oxide semiconductor film 308d is increased by diffusing hydrogen contained in the insulating film 314 into the oxide semiconductor film 308d; however, the conductivity of the oxide semiconductor film 308d may be increased by covering the oxide semiconductor films 308a and 308b with a mask and adding impurities, typically, hydrogen, boron, phosphorus, tin, antimony, a rare gas element, alkali metal, alkaline earth metal, or the like to the oxide semiconductor film 308d. Hydrogen, boron, phosphorus, tin, antimony, a rare gas element, or the like is added to the oxide semiconductor film 308d by an ion doping method, an ion implantation method, or the like. Further, alkali metal, alkaline earth metal, or the like may be added to the oxide semiconductor film 308d by a method in which the oxide semiconductor film 308d is exposed to a solution that contains the impurity.

Only part of the opening 364a has a step in this embodiment, but the present invention is not limited thereto. A region of the insulating film 311 where the opening 364b is formed may be etched when the insulating film 311 is processed, and the opening 364b partly having a step may be formed in the formation of an opening which is performed after the insulating film 313 is formed.

Next, an element portion formed over the substrate 342 provided so as to face the substrate 302 is described below. Here, the element portion provided over the substrate 342 refers to a region sandwiched between the substrate 342 and the alignment film 352.

First, the substrate 342 is prepared. For materials of the substrate 342, the materials that can be used for the substrate 302 can be referred to. Then, the light-blocking film 344 and the colored film 346 are formed over the substrate 342 (see FIG. 8A).

The light-blocking film 344 and the colored film 346 each are formed in a desired position with any of various materials by a printing method, an inkjet method, an etching method using a photolithography technique, or the like.

Then, the insulating film 348 is formed over the light-blocking film 344 and the colored film 346 (see FIG. 8B).

For the insulating film 348, an organic insulating film containing acrylic resin, epoxy resin, polyimide, or the like can be used, for example. With the insulating film 348, an impurity or the like contained in the colored film 346 can be prevented from diffusing into the liquid crystal layer 320, for example. Note that the insulating film 348 is not necessarily formed.

Then, the conductive film 350 is formed over the insulating film 348 (see FIG. 8C). As the conductive film 350, a material that can be used for the light-transmitting conductive film 315 can be used.

Through the above process, the structure formed over the substrate 342 can be formed.

Next, the alignment film 318 and the alignment film 352 are formed over the substrate 302 and the substrate 342 respectively, specifically, over the insulating film 314 and the light-transmitting conductive films 316a and 316b formed over the substrate 302 and over the conductive film 350 formed over the substrate 342. The alignment films 318 and 352 are formed by a rubbing method, an optical alignment method, or the like. After that, the liquid crystal layer 320 is formed between the substrate 302 and the substrate 342. The liquid crystal layer 320 can be formed by a dispenser method (a dropping method), or an injecting method by which a liquid crystal is injected using a capillary phenomenon after the substrate 302 and the substrate 342 are bonded to each other.

Through the above process, the liquid crystal display device illustrated in FIG. 3 can be fabricated.

Although various films such as metal films, semiconductor films, and inorganic insulating films described in the embodiments can be formed by a sputtering method or a plasma CVD method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

The variety of films such as the metal film, the semiconductor film, and the inorganic insulating film which have been disclosed in the embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $(CH_3)_3In$. The chemical formula of trimethylgallium is $(CH_3)_3Ga$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, i.e., ozone ($O_3$) as an oxidizer and a source gas which is obtained by vaporizing liquid containing a solvent and a hafnium precursor compound (a hafnium alkoxide solution, typically tetrakis (dimethylamide)hafnium (TDMAH)) are used. Note that the chemical formula of tetrakis (dimethylamide)hafnium is $Hf[N (CH_3)_2]_4$. Examples of another material liquid include tetrakis (ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing a solvent and liquid containing an aluminum precursor compound (e.g., trimethylaluminum (TMA)) are used. Note that the chemical formula of trimethylaluminum is $Al (CH_3)_3$. Examples of another material liquid include tris (dimethylamide)aluminum, triisobutylaluminum, and aluminum tris (2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Further, instead of an $In (CH_3)_3$ gas, an $In (C_2H_5)_3$ gas may be used. Instead of a $Ga (CH_3)_3$ gas, a $Ga (C_2H_5)_3$ gas may be used. Further, instead of an $In (CH_3)_3$ gas, an $In (C_2H_5)_3$ gas may be used. Furthermore, a $Zn (CH_3)_2$ gas may be used.

This embodiment can be combined with any of the other embodiments in this specification as appropriate.

Modification Example 1

Figure 9:
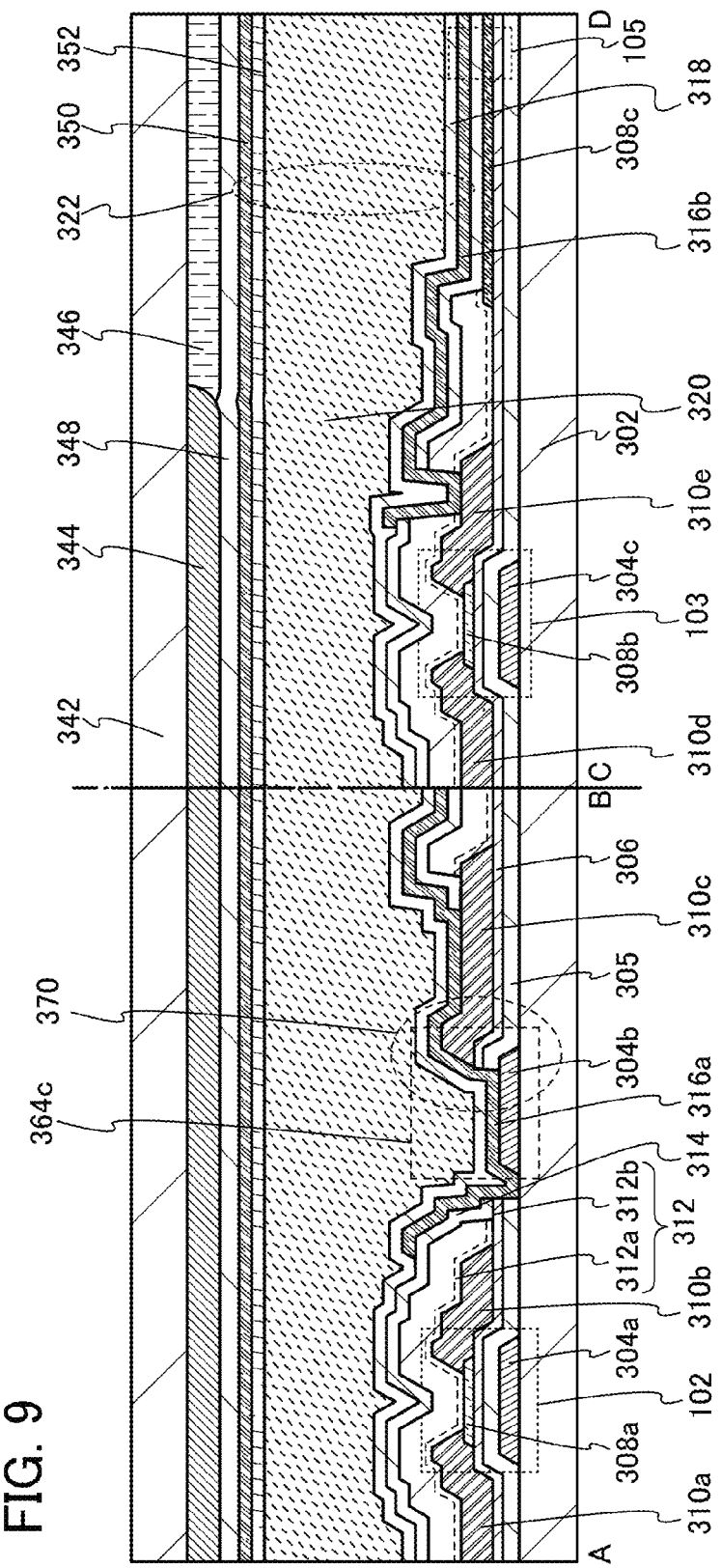
FIG. 9 is a cross-sectional view illustrating one aspect of a semiconductor device.

A modification example of the opening 364a in Embodiment 1 is described with reference to FIG. 9. In FIG. 9, as in FIG. 3, the cross-sectional view of the driver circuit portion is shown in the range of A-B, and the cross-sectional view of the pixel portion is shown in the range of C-D.

In the opening 364a, the light-transmitting conductive film 316a is provided only over the conductive film 304b in FIG. 3, whereas in an opening 364c, the light-transmitting conductive film 316a is in contact with not only the conductive film 304b but also the substrate 302 in FIG. 9. In such a structure, an area of contact between the light-transmitting conductive film 316a and the conductive film 304b is set to large, so that contact resistance can be reduced.

A region 370 in FIG. 9 surrounded by a dotted circle has the structure in which an insulating film covers one end portion of the conductive film 304b, the conductive film 310c is over the insulating film (here, gate insulating film), and a conductive film (here, the light-transmitting conductive film 316a) electrically connects the conductive film 304b and the conductive film 310c. The structure can be used for the terminal portion of the semiconductor device, which similarly results in reducing contact resistance.

Modification Example 2

Figure 10:
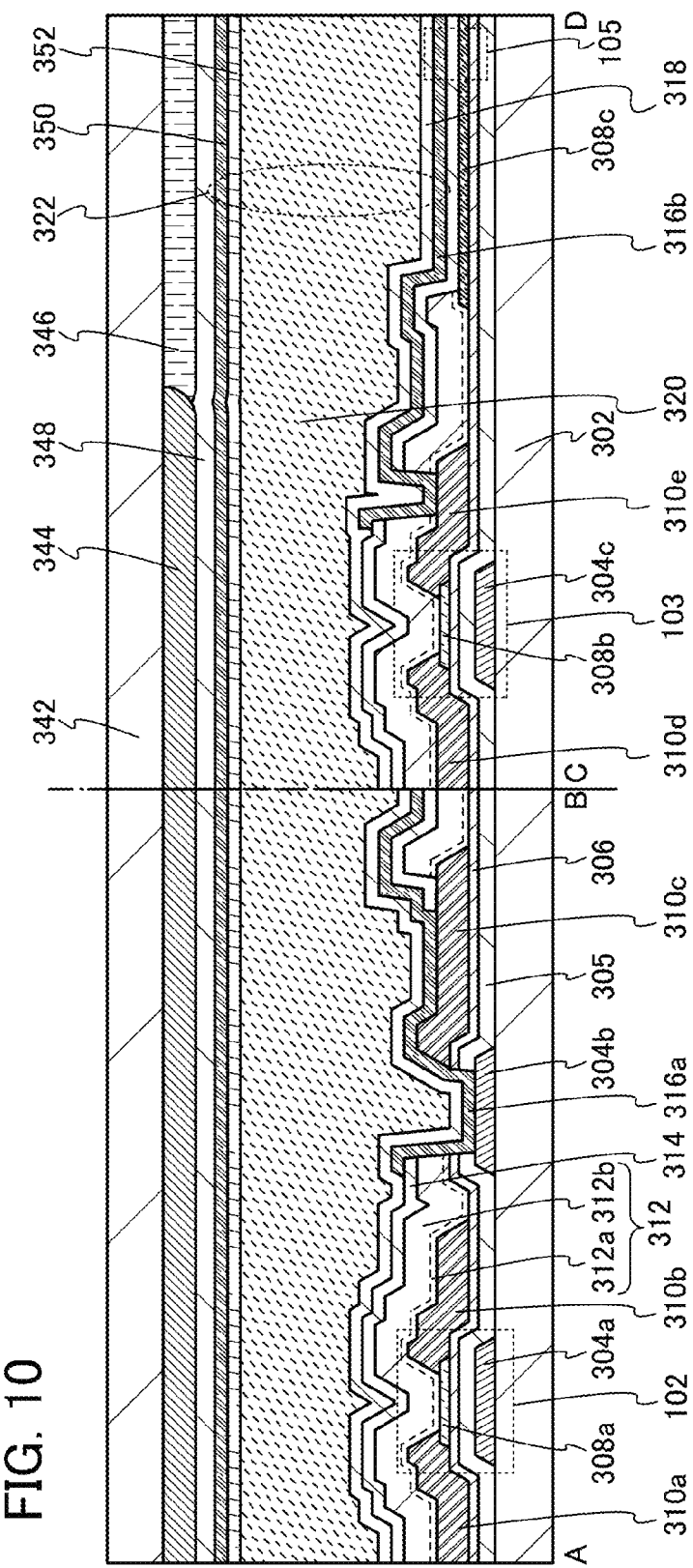
FIG. 10 is a cross-sectional view illustrating one aspect of a semiconductor device.

Another modification example of the opening 364a in Embodiment 1 is described with reference to FIG. 10. In FIG. 10, as in FIG. 3, the cross-sectional view of the driver circuit portion is shown in the range of A-B, and the cross-sectional view of the pixel portion is shown in the range of C-D.

The cross-sectional view of FIG. 10 is different from the cross-sectional view of FIG. 3 in that the insulating film 314, the insulating film 312, the insulating film 306, and the insulating film 305 are etched at once to form the opening.

Here, a method for manufacturing the liquid crystal display device illustrated in FIG. 10 is described with reference to FIGS. 4A to 4C, FIGS. 5A to 5C, FIGS. 11A to 11C, and FIGS. 12A to 12C.

In a manner similar to that of Embodiment 1, through the steps in FIGS. 4A to 4C and FIGS. 5A to 5C, as illustrated in FIG. 11A, the conductive films 304a, 304b, and 304c, each of which functions as a gate electrode, the insulating films 305 and 306, each of which functions as a gate insulating film, the oxide semiconductor films 308a, 308b, and 308d, the conductive films 310a, 310b, 310c, 310d, and 310e, and the insulating film 311 are formed over the substrate 302. In this step, the first patterning to the third patterning are performed to form the conductive film 304a, the conductive film 304b, the conductive film 304c, the oxide semiconductor film 308a, the oxide semiconductor film 308b, the oxide semiconductor film 308d, the conductive film 310a, the conductive film 310b, the conductive film 310c, the conductive film 310d, and the conductive film 310e.

Next, the insulating film 311 is processed into desired regions so that the insulating film 312 and the opening 362 are formed. The insulating film 311 and the opening 362 can be formed in such a manner that a mask is formed over the desired regions by fourth patterning and regions not covered with the mask are etched (see FIG. 11B).

Next, the insulating film 313 is formed over the insulating film 312 and the oxide semiconductor film 308d (see FIG. 11C).

Next, the insulating film 313, the insulating film 312, the insulating film 306, and the insulating film 305 are processed into desired regions so that the insulating film 314, the opening 364a, and the opening 364b are formed. The insulating film 314 and the openings 364a and 364b can be formed in such a manner that a mask is formed over the desired regions by fifth patterning and regions not covered by the mask are etched (see FIG. 12A).

By providing the opening 364a in this manner, the coverage of a film, which is formed later, over the opening 364a, the insulating film 305, the insulating film 306, and the conductive film 310c can be improved.

Next, the light-transmitting conductive film 315 is formed over the insulating film 314 to cover the opening 364a and the opening 364b (see FIG. 12B).

Then, the light-transmitting conductive film 315 is processed into desired regions so that the light-transmitting conductive films 316a and 316b are formed. The light-transmitting conductive films 316a and 316b are formed in such a manner that a mask is formed in the desired regions by sixth patterning and regions not covered with the mask are etched (see FIG. 12C).

Through the above process, the pixel portion and the driver circuit portion including transistors can be formed over the substrate 302. In the manufacturing process described in this embodiment, the transistors and the capacitor can be formed at the same time by the first to sixth patterning, that is, with the six masks.

Modification Example 3

Figure 13:
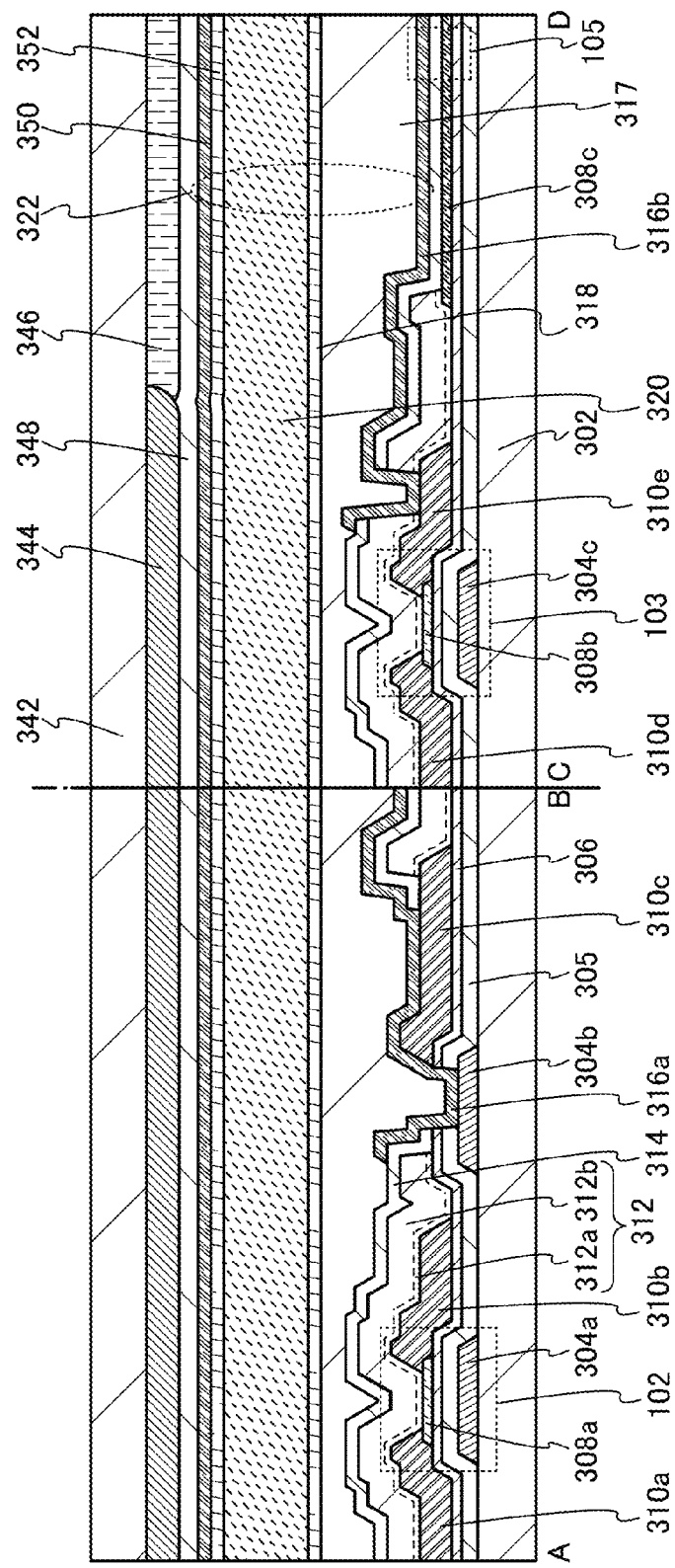
FIG. 13 is a cross-sectional view illustrating one aspect of a semiconductor device.

Here, a modification example of the liquid crystal display device in Embodiment 1 is described with reference to FIG. 13. In FIG. 13, as in FIG. 3, the cross-sectional view of the driver circuit portion is shown in the range of A-B, and the cross-sectional view of the pixel portion is shown in the range of C-D.

The cross-sectional view of FIG. 13 is different from the cross-sectional view of FIG. 3 in that a planarization film 317 is under the alignment film 318.

The planarization film 317 is an organic resin film with which a depressed portion of the light-transmitting conductive film 316b which functions as at least the pixel electrode is filled. A region which is the depressed portion of the light-transmitting conductive film 316b and transmits backlight of the liquid crystal display device (that is, the depressed portion provided in the opening of the light-transmitting conductive film 308c) is filled with the planarization film 317; accordingly, the unevenness of a region on which an alignment film is formed can be reduced. That is, the unevenness of the alignment film 318 formed over the light-transmitting conductive film 316b can be reduced. Note that the depth of the depressed portion corresponds to the thickness of the insulating film 312.

The planarization film 317 preferably transmits light. Note that an embodiment of the present invention is not limited thereto. For example, the planarization film 317 can have a function as a color filter or black matrix. For example, in the case of having a function as a color filter, the planarization film 317 colored in accordance with red pixels, blue pixels, and green pixels, for example, may be formed.

For the planarization film 317, organic resin such as acrylic resin, polyimide, or epoxy resin can be used. Note that the thickness of the planarization film 317 is the thickness of the insulating film 312 or larger and 1500 nm or smaller, preferably the thickness of the insulating film 312 or larger and 1000 nm or smaller. In the case where the thickness of the planarization film 317 is larger than or equal to the thickness of the insulating film 312, the depressed portion of the light-transmitting conductive film 316b can be filled with the planarization film 317; accordingly, the unevenness of the region on which the alignment film 318 is formed can be reduced. Note that in the case where the thickness of the planarization film 317 is large, a voltage applied to the light-transmitting conductive film 316b functioning as a pixel electrode is large in controlling the alignment of the liquid crystal layer 320, which results in high power consumption. Therefore, the thickness of the planarization film 317 is preferably 1500 nm or smaller.

By forming the planarization film 317 using an organic resin, at least the depressed portion of the light-transmitting conductive film 316b serving as the pixel electrode can be filled with the planarization film 317, so that the uneven alignment of the liquid crystal molecules included in the liquid crystal layer 320 can be reduced.

The planarization film 317 is formed by a wet method such as a spin coating method, a dip coating method, a slit coating method, an inkjet method, and a printing method, whereby the planarization film 317 having a flat surface can be formed without being affected by the unevenness of the region where the planarization film 317 is formed. In the case where the planarization film 317 is formed by a spin coating method, a dip coating method, or a slit coating method, a composition is applied, and then a mask is formed over desired regions by seventh patterning and regions not covered by the mask are etched, so that the planarization film 317 can be formed.

The liquid crystal display device illustrated in this modification example includes the planarization film 317 over the light-transmitting conductive film 316b serving as the pixel electrode, so that the depressed portion of the light-transmitting conductive film 316b is filled with the planarization film 317, and a surface of the planarization film 317 has little unevenness. As a result, unevenness of a surface of the alignment film 318 provided over the planarization film 317 and uneven alignment of the liquid crystal can be reduced. As the result, display defects of the liquid crystal display device can be reduced.

Modification Example 4

Figure 14:
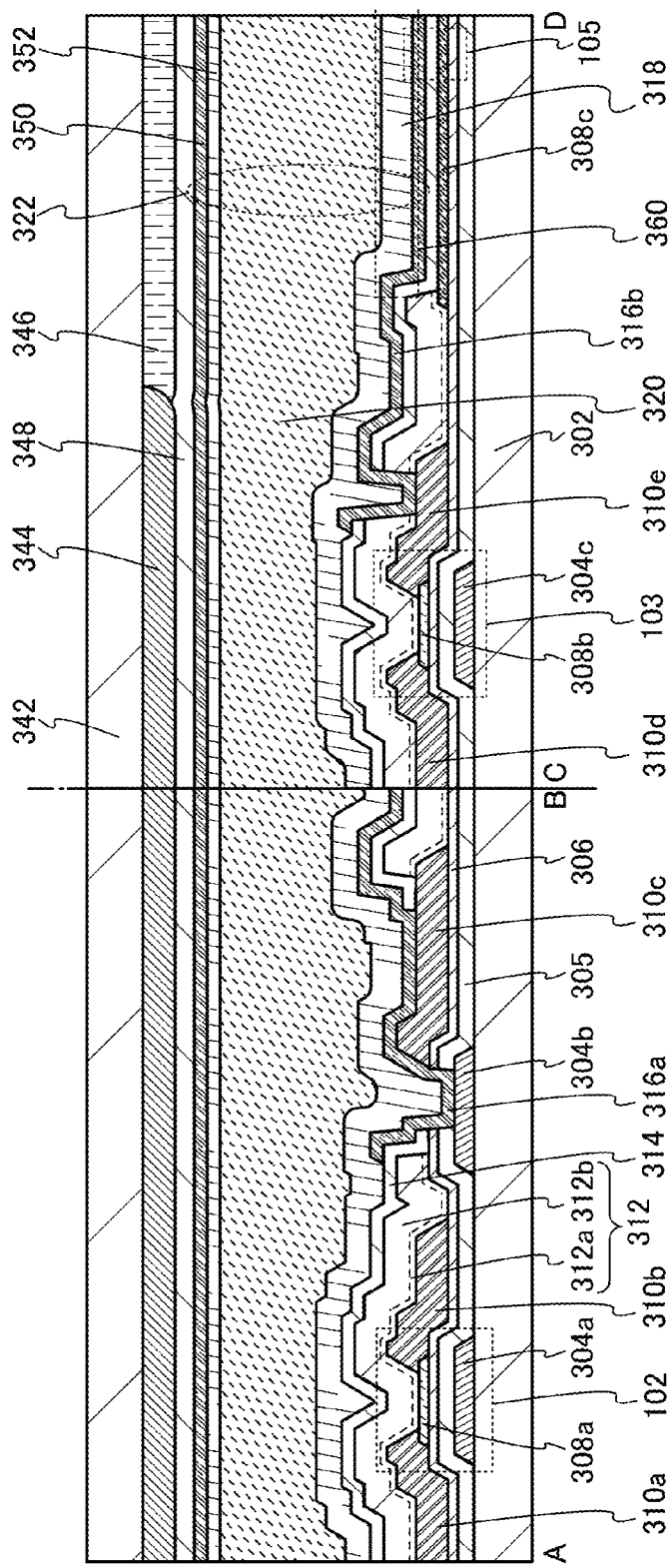
FIG. 14 is a cross-sectional view illustrating one aspect of a semiconductor device.

Here, a modification example of the liquid crystal display device in Embodiment 1 is described with reference to FIG. 14. In FIG. 14, as in FIG. 3, the cross-sectional view of the driver circuit portion is shown in the range of A-B, and the cross-sectional view of the pixel portion is shown in the range of C-D.

The cross-sectional view of FIG. 14 is different from the cross-sectional view of FIG. 3 in that the thickness of the alignment film 318 is set to large to reduce the unevenness of the pixel portion.

Note that in this example, a depressed portion 360 of the light-transmitting conductive film 316b, which is generated because of the insulating film 312, is completely filled with the alignment film 318 over the light-transmitting conductive film 316b of the pixel portion, but the present invention is not limited thereto. The alignment film 318 may be formed to have a gentle-shaped end portion and may fill part of the depressed portion 360.

Modification Example 5

A modification example of a liquid crystal display device in which a liquid crystal element is used for the pixel 301 is described. In the liquid crystal display devices illustrated in FIG. 3, FIG. 9, FIG. 10, FIG. 13 and FIG. 14, the light-transmitting conductive film 308c is in contact with the insulating film 314, but may be in contact with the insulating film 305. In this case, since the opening 362 illustrated in FIGS. 6A to 6C is not necessarily provided, the unevenness of the surfaces of the light-transmitting conductive film 316a and the light-transmitting conductive film 316b can be reduced. Thus, alignment disorder of the liquid crystal materials contained in the liquid crystal layer 320 can be reduced. A liquid crystal display device showing a high contrast can be manufactured.

To obtain such a structure, in FIG. 4B, the insulating film 306 may be selectively etched to expose part of the insulating film 305 before the formation of the oxide semiconductor film 307.

Modification Example 6

Figure 15:
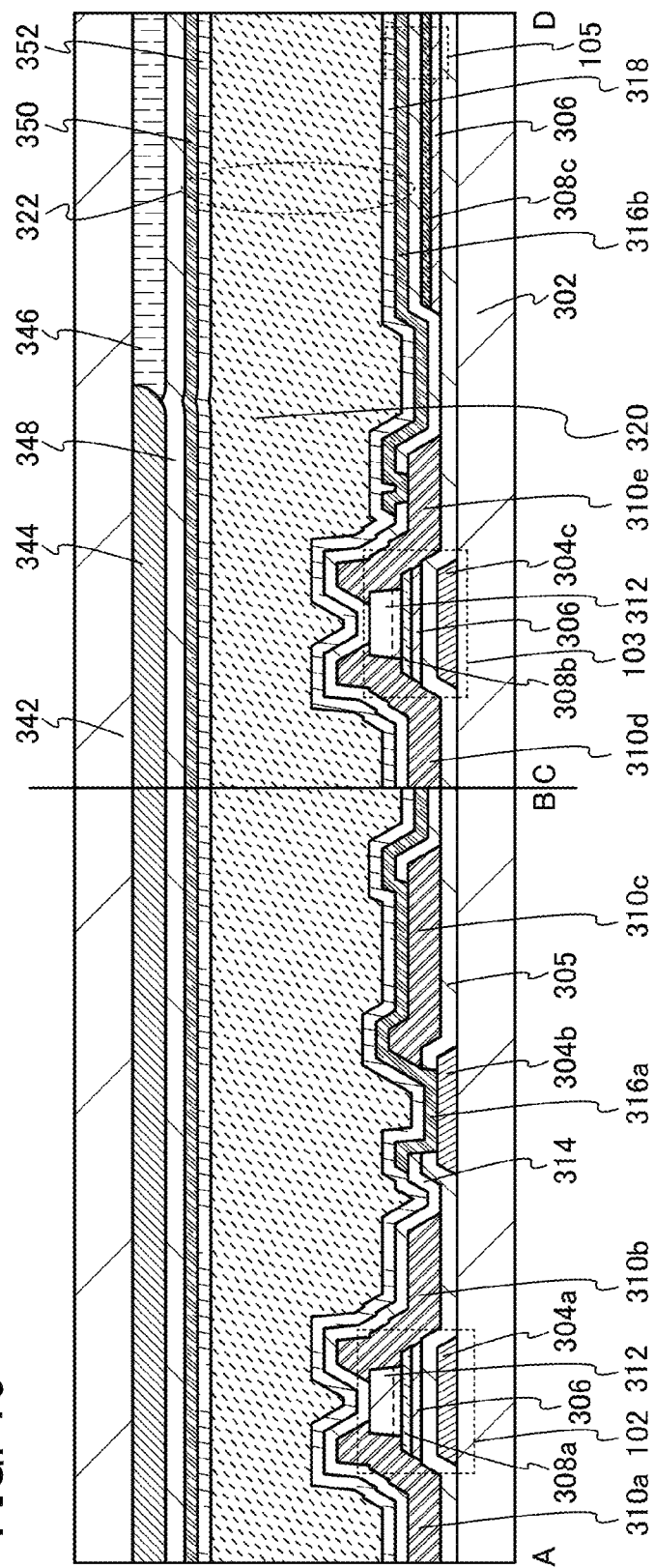
FIG. 15 is a cross-sectional view illustrating one aspect of a semiconductor device.

Here, a modification example of a liquid crystal display device described in Embodiment 1 is described with reference to FIG. 15, FIGS. 16A to 16C, and FIGS. 17A to 17C. In FIG. 15, the cross-sectional view of the driver circuit portion is shown in the range of A-B, and the cross-sectional view of the pixel portion is shown in the range of C-D. Note that here, Embodiment 1 is applied, but this modification example can be used for the other modification examples as appropriate.

A liquid crystal display device illustrated in FIG. 15 is different from the liquid crystal display device described in Embodiment 1 in that a channel-protection transistor is used.

In the driver circuit portion, the transistor 102 includes the conductive film 304a functioning as a gate electrode, insulating films 305 and 306 collectively functioning as a gate insulating film, the oxide semiconductor film 308a in which a channel region is formed, and the conductive films 310a and 310b functioning as a source electrode and a drain electrode. The insulating film 312 functioning as a channel protection film is provided after the oxide semiconductor film 308a and before the conductive film 310a and the conductive film 310b. Further, the insulating film 314 is provided as a protective film over the conductive films 310a, 310b, and 310c.

In the pixel portion, the transistor 103 includes the conductive film 304c functioning as a gate electrode, the insulating films 305 and 306 collectively functioning as a gate insulating film, the oxide semiconductor film 308b which is formed over the gate insulating film and in which a channel region is formed, and the conductive films 310d and 310e functioning as a source electrode and a drain electrode. The insulating film 312 serving as a channel protection film is provided after the oxide semiconductor film 308b and before the conductive film 310d and the conductive film 310e. Further, the insulating film 314 is provided as a protective film over the conductive films 310d and 310e.

The light-transmitting conductive film 316b functioning as a pixel electrode is connected to the conductive film 310e through an opening provided in the insulating film 314.

Further, the capacitor 105 includes the light-transmitting conductive film 308c functioning as one electrode of the capacitor 105, the insulating film 314 functioning as a dielectric film, and the light-transmitting conductive film 316b functioning as the other electrode of the capacitor 105.

In the driver circuit portion, the conductive film 304b formed at the same time as the conductive films 304a and 304c and the conductive film 310c formed at the same time as the conductive films 310a, 310b, 310d, and 310e are connected to each other via the light-transmitting conductive film 316a formed at the same time as the light-transmitting conductive film 316b.

In this modification example, the oxide semiconductor film 308a and the oxide semiconductor film 308b are covered with the insulating film 312 when the conductive film 310a, the conductive film 310b, the conductive film 310d, and the conductive film 310e are etched. Therefore, etching for forming the conductive film 310a, the conductive film 310b, the conductive film 310d, and the conductive film 310e does not cause damage to the oxide semiconductor film 308a and the oxide semiconductor film 308b. The insulating film 312 is an oxide insulating film which contains oxygen at a higher proportion than the stoichiometric composition. Accordingly, part of oxygen contained in the insulating film 312 can be transferred to the oxide semiconductor film 308a and the oxide semiconductor film 308b and can reduce the number of oxygen vacancies contained in the oxide semiconductor film 308a and the oxide semiconductor film 308b.

A formation method of the element portion over the substrate 302 in the liquid crystal device shown in FIG. 15 is described with reference to FIGS. 4A to 4C, FIGS. 16A to 16C, and FIGS. 17A to 17C.

As in Embodiment 1, through the steps of FIGS. 4A to 4C, the conductive film 304a, the conductive film 304b, and the conductive film 304c functioning as gate electrodes; the insulating film 305 and the insulating film 306 functioning as gate insulating films; the oxide semiconductor film 308a; the oxide semiconductor film 308b; and the oxide semiconductor film 308d are formed over the substrate 302. Note that in the step, the first patterning and the second patterning are performed to form the conductive film 304a, the conductive film 304b, the conductive film 304c, the oxide semiconductor film 308a, the oxide semiconductor film 308b, and the oxide semiconductor film 308d.

Next, as in Embodiment 1, the insulating film 311 in which the insulating film 311a and the insulating film 311b are stacked is formed (see FIG. 16A).

After that, as in Embodiment 1, heat treatment is performed to transfer part of oxygen contained in the insulating film 311 to the oxide semiconductor film 308a and the oxide semiconductor film 308b, so that the number of oxygen vacancies contained in the oxide semiconductor film 308a and the oxide semiconductor film 308b can be reduced.

Next, the insulating film 311 is processed into desired regions, so that the insulating film 312 is formed over the oxide semiconductor films 308a and 308b (see FIG. 16B). In the step, in the case where the insulating film 306 is formed of the same material as that of the insulating film 312, part of the insulating film 306 is etched, and only a region covered with the oxide semiconductor film 308a and the oxide semiconductor film 308b remains. Note that the insulating film 306 and the insulating film 312 can be formed in such a manner that a mask is formed over the desired regions by third patterning and regions not covered with the mask are etched.

After that, a conductive film is formed over the insulating film 305, the insulating film 306, the oxide semiconductor film 308a, and the oxide semiconductor film 308b; then, the conductive film 310a, the conductive film 310b, the conductive film 310c, the conductive film 310d, and the conductive film 310e are formed through the same process as that described in Embodiment 1 (see FIG. 16C). The conductive films 310a, 310b, 310c, 310d, and 310e can be formed in such a manner that a mask is formed over a desired region by fourth patterning and regions not covered with the mask are etched.

Figure 17A:
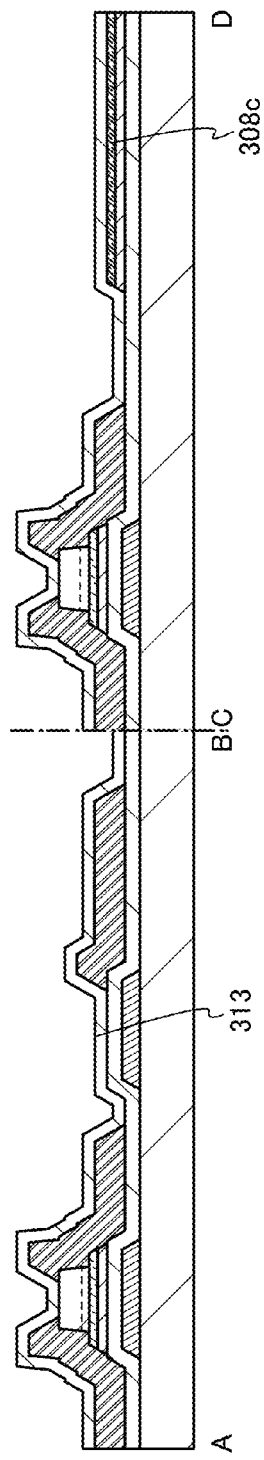
FIGS. 17A to 17C are cross-sectional views illustrating one aspect of a method for manufacturing a semiconductor device.
Figure 17B:
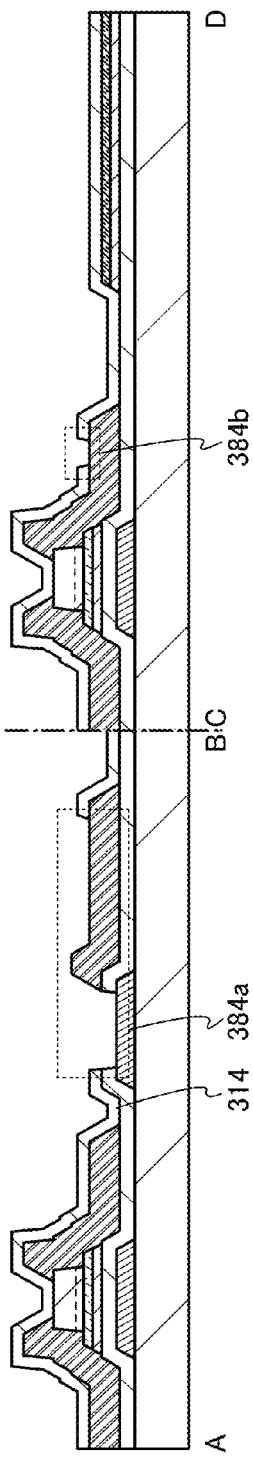
Figure 17C:
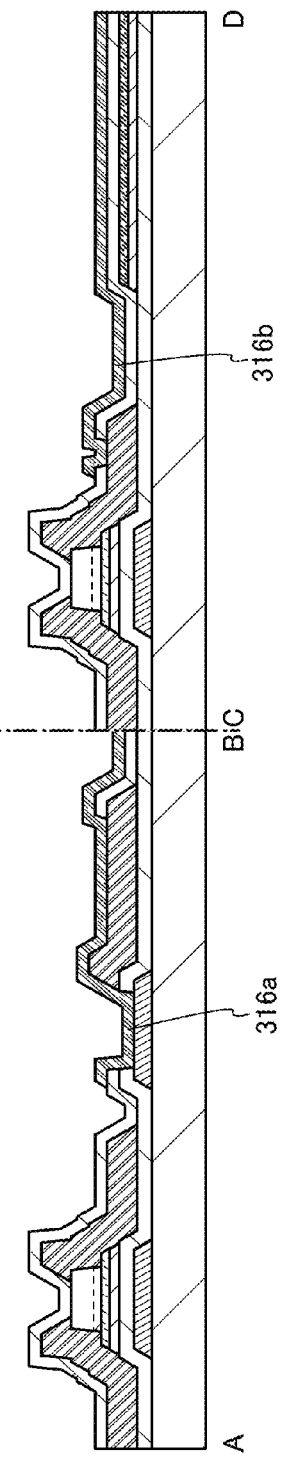

Then, the insulating film 313 is formed over the insulating film 305, the insulating film 312, the oxide semiconductor film 308d, the conductive film 310a, the conductive film 310b, the conductive film 310c, the conductive film 310d, and the conductive film 310e (see FIG. 17A).

Next, as in Modification Example 2, the insulating film 313 is processed into desired regions, so that the insulating film 314 and the openings 384a and 384b are formed. Note that the insulating film 314 and the openings 384a and 384b can be formed in such a manner that a mask is formed in the desired regions by fifth patterning and regions not covered with the mask are etched (see FIG. 17B).

Providing the opening 384a in this manner improves the coverage of a film which is formed later and is over the conductive film 304b, the insulating film 305, and the conductive film 310c.

Next, as in Embodiment 1, a light-transmitting conductive film is formed over the insulating film 314 to cover an opening 384a and an opening 384b. Then, the conductive film is processed into desired regions so that the light-transmitting conductive films 316a and 316b are formed. The light-transmitting conductive films 316a and 316b can be formed in such a manner that a mask is formed over the desired regions by sixth patterning and regions not covered with the mask are etched (see FIG. 17C).

Through the above process, the pixel portion and the driver circuit portion including transistors can be formed over the substrate 302. In the fabrication process described in this embodiment, the transistors and the capacitor can be formed at the same time by the first to sixth patterning, that is, with the six masks.

Modification Example 7

Figure 40:
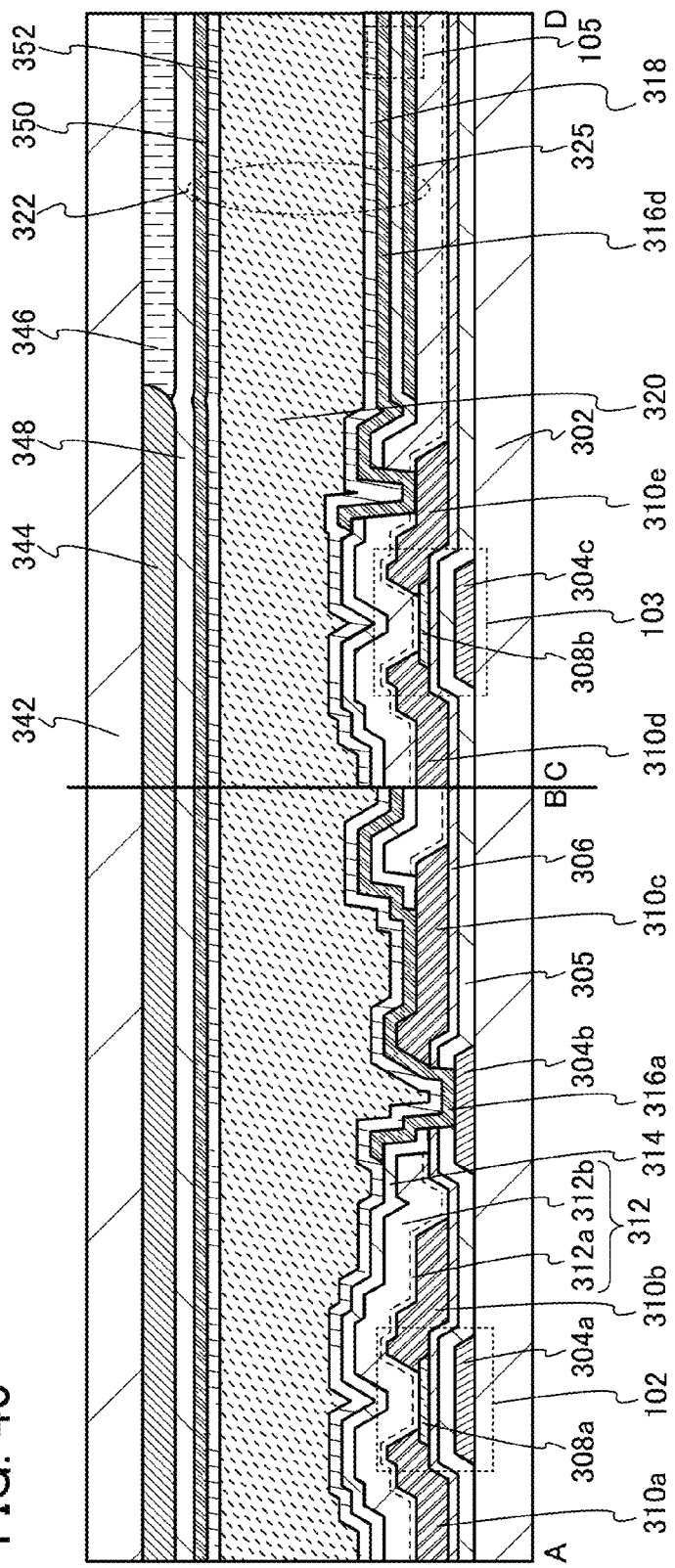
FIG. 40 is a cross-sectional view illustrating one aspect of a semiconductor device.
Figure 41:
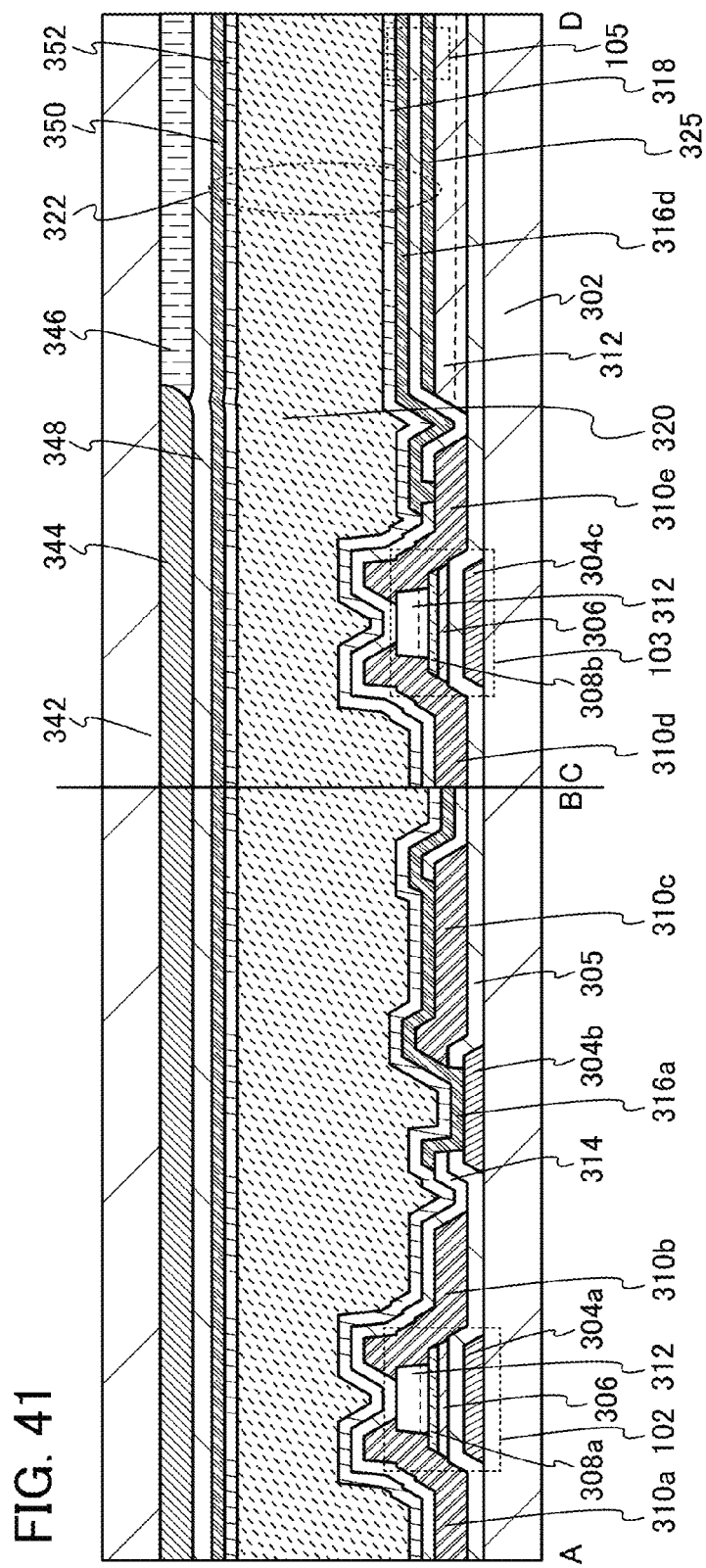
FIG. 41 is a cross-sectional view illustrating one aspect of a semiconductor device.

In this embodiment and the modification example, the light-transmitting conductive film 308c and the light-transmitting conductive film 316b are used as a pair of electrodes of the capacitor 105. Instead of the films, as illustrated in FIG. 40 and FIG. 41, a light-transmitting conductive film 325 is formed between the insulating film 312 and the insulating film 314, a light-transmitting conductive film 316d is formed over the insulating film 314, and the light-transmitting conductive film 325 and the light-transmitting conductive film 316d can be used as the pair of electrodes of the capacitor 105.

Further, an organic insulating film containing acrylic resin, epoxy resin, polyimide, or the like may be formed over the insulating film 312. The organic insulating film of an acrylic-based resin or the like can reduce the unevenness of the surface of the light-transmitting conductive film 316a because of its high planarity. Thus, alignment disorder of the liquid crystal materials contained in the liquid crystal layer 320 can be reduced. Further, a high-contrast semiconductor device can be fabricated.

Figure 42A:
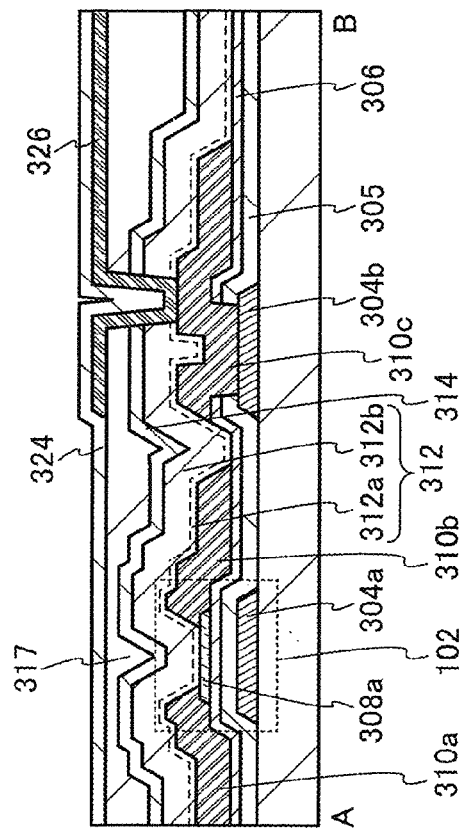
FIGS. 42A and 42B are cross-sectional views illustrating one aspect of a semiconductor device.
Figure 42B:
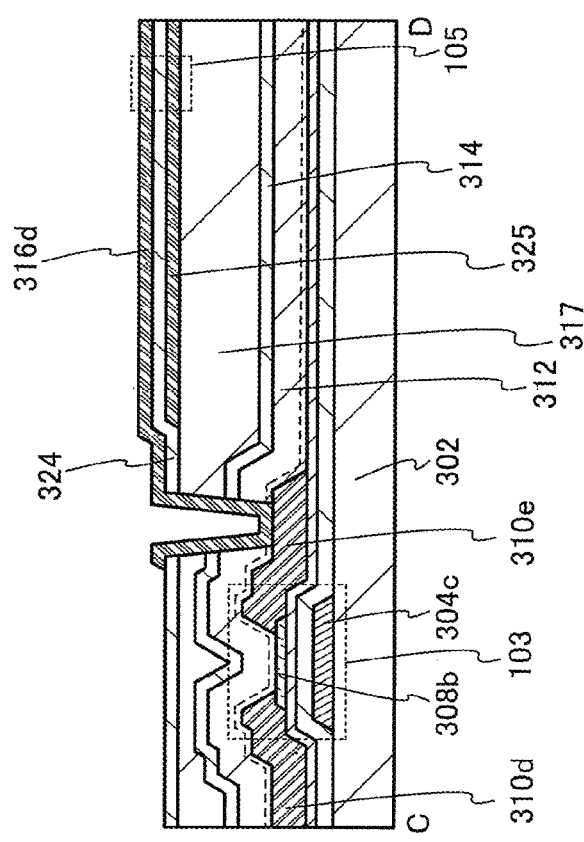

It is possible to employ the structure where as illustrated in FIG. 42A, the conductive film 304b and the conductive film 310c are in contact with each other; the planarization film 317 is formed over the insulating film 314; an opening is formed in the planarization film 317, the insulating film 314, and the insulating film 312; a light-transmitting conductive film 326 is formed to be in contact with the conductive film 310c through the opening; and an insulating film 324 is formed over the planarization film 317 and the light-transmitting conductive film 326. Further, as illustrated in FIG. 42B, the planarization film 317 is formed over the insulating film 314, the light-transmitting conductive film 325 is formed over the planarization film 317, the insulating film 324 is formed over the planarization film 317 and the light-transmitting conductive film 325, the light-transmitting conductive film 316d is formed over the insulating film 324, and the light-transmitting conductive film 325 and the light-transmitting conductive film 316d may be used as the pair of electrodes of the capacitor 105. Note that for the insulating film 324, a material similar to that of the insulating film 314 can be used.

Embodiment 2

In this embodiment, a modification example which can be applied to a transistor described in Embodiment 1 will be described.

Modification Example 1

Regarding Base Insulating Film

In the transistors 102 and 103 described in Embodiment 1, a base insulating film can be provided between the substrate 302 and the conductive films 304a, 304b, and 304c as necessary. As a material of the base insulating film, silicon oxide, silicon oxynitride, silicon nitride, silicon nitride oxide, gallium oxide, hafnium oxide, yttrium oxide, aluminum oxide, aluminum oxynitride, and the like can be given as examples. Note that when silicon nitride, gallium oxide, hafnium oxide, yttrium oxide, aluminum oxide, or the like is used as a material of the base insulating film, it is possible to suppress diffusion of impurities such as alkali metal, water, and hydrogen into the oxide semiconductor films 308a and 308b from the substrate 302.

The base insulating film can be formed by a sputtering method, a CVD method, or the like.

Modification Example 2

Regarding Gate Insulating Film

In the transistors 102 and 103 in Embodiment 1, the stacked-layer structure of the insulating film serving as the gate insulating film can be changed as needed. Here, description is made using the transistor 103.

Figure 18A:
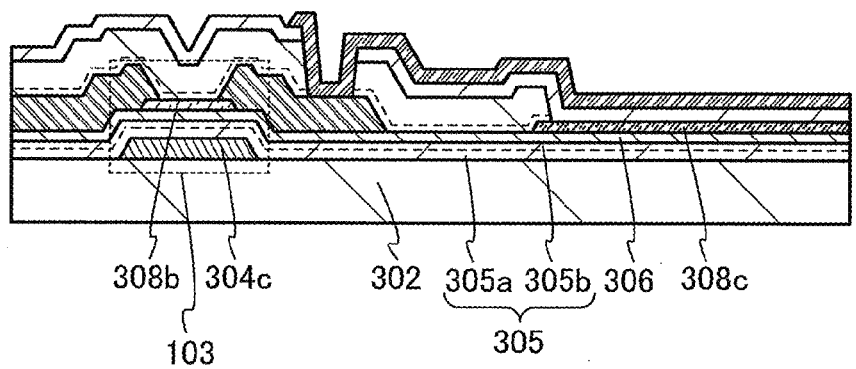
FIGS. 18A and 18B are cross-sectional views illustrating one aspect of a transistor.

As shown in FIG. 18A, in the gate insulating film, the insulating film 305 and the insulating film 306 are stacked in that order over the conductive film 304c serving as a gate electrode.

When the insulating film 305 formed using the nitride insulating film is provided over the conductive film 304c, an impurity, typically hydrogen, nitrogen, alkali metal, alkaline earth metal, or the like, can be prevented from moving from the conductive film 304c to the oxide semiconductor film 308b.

Further, when the insulating film 306 formed using the oxide insulating film is provided on the oxide semiconductor film 308b side, the density of defect states at the interface between the insulating film 306 and the oxide semiconductor film 308b can be reduced. Consequently, a transistor whose electrical characteristics are hardly degraded can be obtained. Note that it is preferable to form, as the insulating film 306, an oxide insulating film containing oxygen at a higher proportion than the stoichiometric composition like the oxide insulating film 312b. This is because the density of defect states at the interface between the insulating film 306 and the oxide semiconductor film 308b can be further reduced.

As shown in FIG. 18A, the insulating film 305 can have a stacked-layer structure in which a nitride insulating film 305a with few defects and a nitride insulating film 305b with a high blocking property against hydrogen are stacked in that order from the conductive film 304c side. When the nitride insulating film 305a with few defects is provided in the insulating film 305, the withstand voltage of the gate insulating film can be improved. Further, when the nitride insulating film 305b with a high blocking property against hydrogen is provided, hydrogen can be prevented from moving from the conductive film 304c and the nitride insulating film 305a to the oxide semiconductor film 308b.

An example of a method for forming the nitride insulating films 305a and 305b shown in FIG. 18A is described below. First, as the nitride insulating film 305a, a silicon nitride film with few defects is formed by a plasma CVD method in which a mixed gas of silane, nitrogen, and ammonia is used as a source gas. Then, as the nitride insulating film 305b, a silicon nitride film in which the hydrogen concentration is low and hydrogen can be blocked is formed by switching the source gas to a mixed gas of silane and nitrogen. By such a formation method, the gate insulating film having a stacked-layer structure of nitride insulating films with few defects and a blocking property against hydrogen can be formed.

Figure 18B:
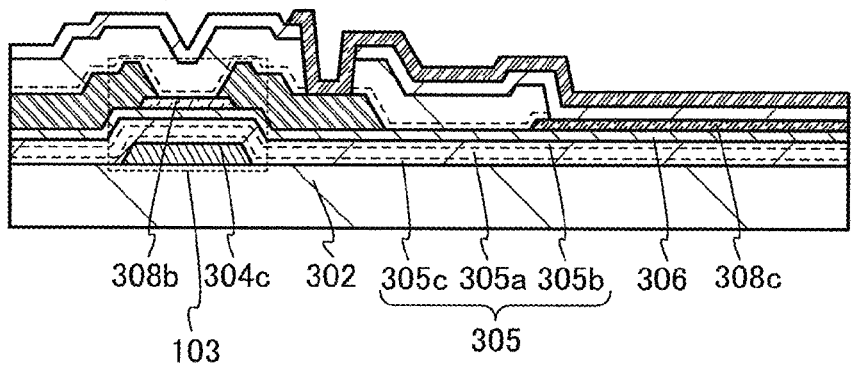

Alternatively, as shown in FIG. 18B, the insulating film 305 can have a stacked-layer structure in which a nitride insulating film 305c with a high blocking property against an impurity, the nitride insulating film 305a with few defects, and the nitride insulating film 305b with a high blocking property against hydrogen are stacked in that order from the conductive film 304c side. When the nitride insulating film 305c with a high blocking property against an impurity is provided in the insulating film 305, an impurity, typically hydrogen, nitrogen, alkali metal, alkaline earth metal, or the like, can be prevented from moving from the conductive film 304c to the oxide semiconductor film 308b.

An example of a method for forming the nitride insulating films 305a, 305b, and 305c shown in FIG. 18B is described below. First, as the nitride insulating film 305c, a silicon nitride film with a high blocking property against an impurity is formed by a plasma CVD method in which a mixed gas of silane, nitrogen, and ammonia is used as a source gas. Then, a silicon nitride film with few defects is formed as the nitride insulating film 305a by increasing the flow rate of ammonia. Then, as the nitride insulating film 305b, a silicon nitride film in which the hydrogen concentration is low and hydrogen can be blocked is formed by switching the source gas to a mixed gas of silane and nitrogen. By such a formation method, the insulating film 305 having a stacked-layer structure of nitride insulating films with few defects and a blocking property against an impurity can be formed.

Modification Example 3

Regarding Pair of Electrodes

In the liquid crystal display devices in Embodiment 1, a material used for the conductive films 310a, 310b, 310c, 310d, and 310e is described. Here, description is made using the transistor 103.

Figure 19:
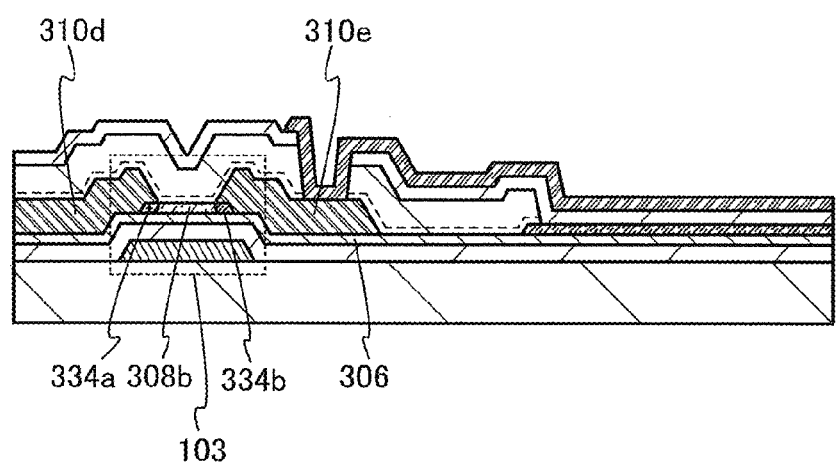
FIG. 19 is a cross-sectional view illustrating one aspect of a transistor.

As for the conductive films 310d and 310e provided in the transistor 103 described in Embodiment 1, it is preferable to use a conductive material which easily reacts with oxygen, such as tungsten, titanium, aluminum, copper, molybdenum, chromium, or tantalum, or an alloy thereof. Thus, oxygen contained in the oxide semiconductor film 308b and the conductive material contained in the conductive films 310d and 310e react with each other, so that an oxygen deficient region is formed in the oxide semiconductor film 308b. Further, in some cases, part of constituent elements of the conductive material that forms the conductive films 310d and 310e is mixed into the oxide semiconductor film 308b. Consequently, as shown in FIG. 19, low-resistance regions 334a and 334b are formed in the vicinity of regions of the oxide semiconductor film 308b which are in contact with the conductive films 310d and 310e. The low-resistance regions 334a and 334b are formed between the insulating film 306 and the conductive films 310d and 310e so as to be in contact with the conductive films 310d and 310e. Since the low-resistance regions 334a and 334b have high conductivity, contact resistance between the oxide semiconductor film 308b and the conductive films 310d and 310e can be reduced, and thus, the on-state current of the transistor can be increased.

Further, the conductive films 310d and 310e may each have a stacked-layer structure of the conductive material which easily reacts with oxygen and a conductive material which does not easily react with oxygen, such as titanium nitride, tantalum nitride, or ruthenium. With such a stacked-layer structure, oxidization of the conductive films 310d and 310e can be prevented at the interface between the conductive films 310d and 310e and the oxide semiconductor film 308b, so that the increase of the resistance of the conductive films 310d and 310e can be inhibited.

Modification Example 4

Regarding Oxide Semiconductor Film

In the method for manufacturing the transistors 102 and 103 described in Embodiment 1, after the conductive films 310a, 310b, 310d and 310e are formed, the oxide semiconductor films 308a and 308b may be exposed to plasma generated in an oxygen atmosphere, so that oxygen may be supplied to the oxide semiconductor films 308a and 308b. Atmospheres of oxygen, ozone, dinitrogen monoxide, nitrogen dioxide, and the like can be given as examples of oxidizing atmospheres. Further, in the plasma treatment, the oxide semiconductor films 308a and 308b are preferably exposed to plasma generated with no bias applied to the substrate 302 side. Consequently, the oxide semiconductor films 308a and 308b can be supplied with oxygen without being damaged; accordingly, the amount of oxygen vacancies in the oxide semiconductor films 308a and 308b can be reduced. Moreover, impurities, e.g., halogen such as fluorine or chlorine remaining on the surfaces of the oxide semiconductor films 308a and 308b due to the etching treatment can be removed.

Modification Example 5

Regarding Oxide Semiconductor Film

In the transistors 102 and 103 described in Embodiment 1, the oxide semiconductor film can have a stacked-layer structure as necessary. Here, description is made using the transistor 103.

Figure 20:
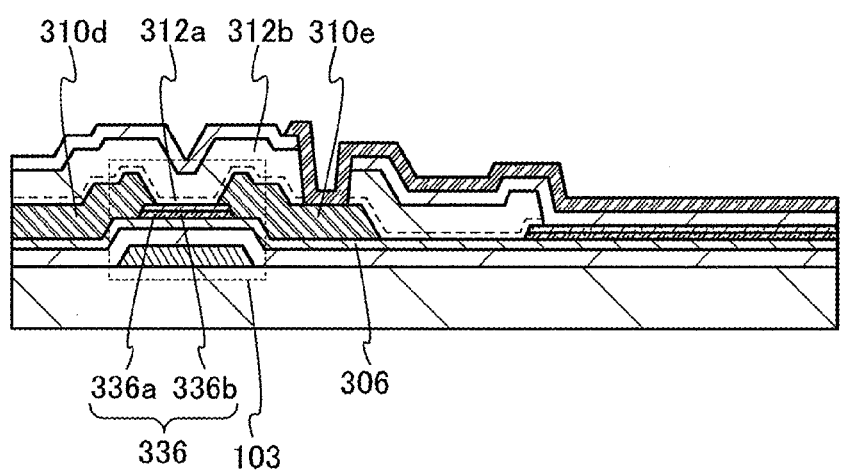
FIG. 20 is a cross-sectional view illustrating one aspect of a transistor.

In the transistor illustrated in FIG. 20, a multilayer film 336 including an oxide semiconductor film is formed between the insulating film 306 and the conductive films 310d and 310e.

The multilayer film 336 includes the oxide semiconductor film 336a and the oxide film 336b. That is, the multilayer film 336 has a two-layer structure. Further, part of the oxide semiconductor film 336a serves as a channel region. Furthermore, the insulating film 312a is formed in contact with the multilayer film 336, and the oxide film 336b is formed in contact with the insulating film 312a. That is, the oxide film 336b is provided between the oxide semiconductor film 336a and the insulating film 312a.

The oxide film 336b is an oxide film containing one or more elements which form the oxide semiconductor film 336a. Since the oxide film 336b contains one or more elements which form the oxide semiconductor film 336a, interface scattering is unlikely to occur at the interface between the oxide semiconductor film 336a and the oxide film 336b. Thus, the transistor can have a high field-effect mobility because the movement of carriers is not hindered at the interface.

The oxide film 336b is typically In—Ga oxide, In—Zn oxide, or In-M-Zn oxide (M represents Al, Ti, Ga, Y, Zr, La, Ce, Nd, or Hf). The energy at the conduction band bottom of the oxide film 336b is closer to a vacuum level than that of the oxide semiconductor film 336a is, and typically, the difference between the energy at the conduction band bottom of the oxide film 336b and the energy at the conduction band bottom of the oxide semiconductor film 336a is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of the oxide film 336b and the electron affinity of the oxide semiconductor film 336a is any one of 0.05 eV or more, 0.07 eV or more, 0.1 eV or more, and 0.15 eV or more, and any one of 2 eV or less, 1 eV or less, 0.5 eV or less, and 0.4 eV or less.

The oxide film 336b preferably contains In because carrier mobility (electron mobility) can be increased.

When the oxide film 336b contains a larger amount of Al, Ti, Ga, Y, Zr, La, Ce, Nd, or Hf in an atomic ratio than the amount of In in an atomic ratio, any of the following effects may be obtained: (1) the energy gap of the oxide film 336b is widened; (2) the electron affinity of the oxide film 336b decreases; (3) an impurity from the outside is blocked; (4) an insulating property increases as compared to the oxide semiconductor film 336a; and (5) oxygen vacancies are less likely to be generated in the oxide film 336b containing a larger amount of Al, Ti, Ga, Y, Zr, La, Ce, Nd, or Hf in an atomic ratio than the amount of In in an atomic ratio because Al, Ti, Ga, Y, Zr, La, Ce, Nd, or Hf is a metal element which is strongly bonded to oxygen.

In the case where the oxide film 336b is an In-M-Zn oxide film, the proportions of In and M when summation of In and M is assumed to be 100 atomic % are preferably as follows: the atomic percentage of In is less than 50 atomic % and the atomic percentage of M is greater than or equal to 50 atomic %; further preferably, the atomic percentage of In is less than 25 atomic % and the atomic percentage of M is greater than or equal to 75 atomic %.

Further, in the case where each of the oxide semiconductor film 336a and the oxide film 336b is In-M-Zn oxide (M represents Al, Ti, Ga, Y, Zr, La, Ce, Nd, or Hf), the proportion of M atoms (M represents Al, Ti, Ga, Y, Zr, La, Ce, Nd, or Hf) in the oxide film 336b is higher than that in the oxide semiconductor film 336a. Typically, the proportion of M in each of the films is 1.5 or more times, preferably twice or more, more preferably three or more times as high as that in the oxide semiconductor film 336a.

Furthermore, in the case where each of the oxide semiconductor film 336a and the oxide film 336b is In-M-Zn oxide film (M represents Al, Ti, Ga, Y, Zr, La, Ce, Nd, or Hf), when In:M:Zn=$x_1$:$y_1$:$z_1$ [atomic ratio] is satisfied in the oxide film 336b and In:M:Zn=$x_2$:$y_2$:$z_2$ [atomic ratio] is satisfied in the oxide semiconductor film 336a, $y_1/x_1$ is higher than $y_2/x_2$. It is preferable that $y_1/x_1$ be 1.5 or more times as high as $y_2/x_2$. It is further preferable that $y_1/x_1$ be twice or more as high as $y_2/x_2$. It is still further preferable that $y_1/x_1$ be three or more times as high as $y_2/x_2$. In this case, it is preferable that in the oxide semiconductor film, $y_1$ be higher than or equal to $x_1$ because a transistor including the oxide semiconductor film can have stable electric characteristics. However, when $y_1$ is larger than or equal to three or more times $x_1$, the field-effect mobility of the transistor including the oxide semiconductor film is reduced. Accordingly, $y_1$ is preferably smaller than three times $x_1$.

For example, for the oxide semiconductor film 336a, an In—Ga—Zn oxide with an atomic ratio of In:Ga:Zn=1:1:1 or 3:1:2 can be used. For the oxide film 336b, an In—Ga—Zn oxide with an atomic ratio of In:Ga:Zn=1:3:n (n is an integer greater than or equal to 2 and less than or equal to 8), 1:6:m (m is an integer greater than or equal to 2 and less than or equal to 10), or 1:9:6 can be used. Note that the atomic ratio of each of the oxide semiconductor film 336a and the oxide film 336b may vary within a range of ±20% of the above atomic ratio. In the oxide semiconductor film 336a, a percentage of Zn is preferably higher than or equal to a percentage of Ga because a CAAC-OS is easily formed.

The oxide film 336b also serves as a film which relieves damage to the oxide semiconductor film 336a at the time of forming the insulating film 312b later.

The thickness of the oxide film 336b is greater than or equal to 3 nm and less than or equal to 100 nm, preferably greater than or equal to 3 nm and less than or equal to 50 nm.

The oxide film 336b may have a non-single-crystal structure, for example, like the oxide semiconductor film 336a. The non-single crystal structure includes a c-axis aligned crystalline oxide semiconductor (CAAC-OS) which is described later, a polycrystalline structure, a microcrystalline structure described later, or an amorphous structure, for example.

Note that the oxide semiconductor film 336a and the oxide film 336b may each be a mixed film including two or more of the following: a region having an amorphous structure, a region having a microcrystalline structure, a region having a polycrystalline structure, a CAAC-OS region, and a region having a single-crystal structure. Further, the mixed film has a stacked-layer structure of two or more of a region having an amorphous structure, a region having a microcrystalline structure, a region having a polycrystalline structure, a CAAC-OS region, and a region having a single-crystal structure in some cases.

Here, the oxide film 336b is provided between the oxide semiconductor film 336a and the insulating film 312a. Hence, if trap states are formed between the oxide film 336b and the insulating film 312a owing to impurities and defects, electrons flowing in the oxide semiconductor film 336a are less likely to be captured by the trap states because there is a distance between the trap states and the oxide semiconductor film 336a. Accordingly, the amount of on-state current of the transistor can be increased, and the field-effect mobility can be increased. When the electrons are captured by the trap states, the electrons become negative fixed charges. As a result, a threshold voltage of the transistor varies. However, by the distance between the oxide semiconductor film 336a and the trap states, capture of the electrons by the trap states can be reduced, and accordingly a fluctuation of the threshold voltage can be reduced.

Further, impurities from the outside can be blocked by the oxide film 336b, and accordingly, the amount of impurities which move from the outside to the oxide semiconductor film 336a can be reduced. Further, an oxygen vacancy is less likely to be formed in the oxide film 336b. Consequently, the impurity concentration and the amount of oxygen vacancies in the oxide semiconductor film 336a can be reduced.

Note that the oxide semiconductor film 336a and the oxide film 336b are not formed by simply stacking each film, but are formed to form a continuous junction (here, in particular, a structure in which the energy of the bottom of the conduction band is changed continuously between each film). In other words, a stacked-layer structure in which there exist no impurity which forms a defect level such as a trap center or a recombination center at each interface is provided. If an impurity exists between the oxide semiconductor film 336a and the oxide film 336b which are stacked, a continuity of the energy band is damaged, and the carrier is captured or recombined at the interface and then disappears.

In order to form such a continuous energy band, it is necessary to form films continuously without being exposed to air, with use of a multi-chamber deposition apparatus (sputtering apparatus) including a load lock chamber. Each chamber in the sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

In FIG. 20, the multilayer film 336 has a two-layer structure of the oxide semiconductor film 336a and the oxide film 336b; however the multilayer film 336 may have a three-layer structure in which a film similar to the oxide film 336b is further provided between the insulating film 306 and the oxide semiconductor film 336a. In this case, the thickness of the oxide film provided between the insulating film 306 and the oxide semiconductor film 336a is preferably less than that of the oxide semiconductor film 336a. When the oxide film has a thickness greater than or equal to 1 nm and less than or equal to 5 nm, preferably greater than or equal to 1 nm and less than or equal to 3 nm, the amount of change in the threshold voltage of the transistor can be reduced.

Modification Example 6

Regarding Oxide Semiconductor Film

The structure of the multilayer film including the oxide semiconductor film in Modification Example 5 can be changed as appropriate. Here, description is made using the transistor 103.

Figure 21:
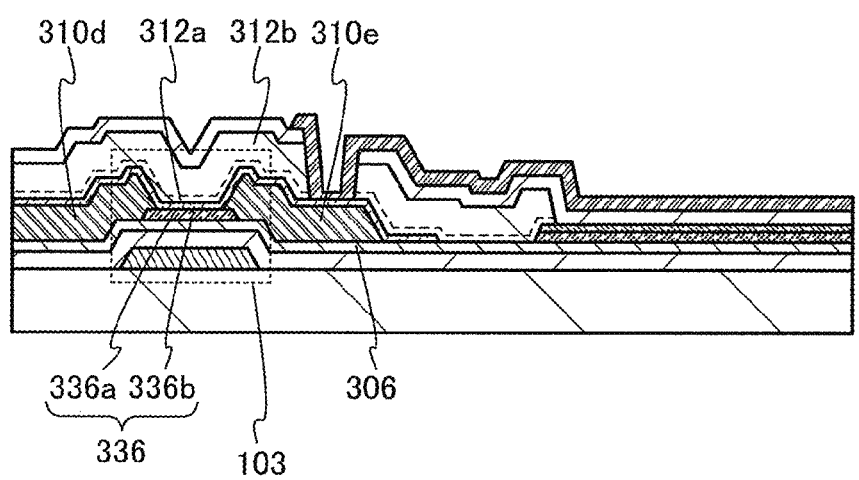
FIG. 21 is a cross-sectional view illustrating one aspect of a transistor.

As illustrated in FIG. 21, a multilayer film 336 including an oxide semiconductor film is formed between the insulating film 306 and the insulating film 312a.

The multilayer film 336 includes the oxide semiconductor film 336a formed between the insulating film 306 and the conductive films 310d and 310e and the oxide film 336b formed over the oxide semiconductor film 336a and the conductive films 310d and 310e. Further, part of the oxide semiconductor film 336a serves as a channel region. Furthermore, the insulating film 312a is formed in contact with the multilayer film 336, and the oxide film 336b is formed in contact with the insulating film 312a. That is, the oxide film 336b is provided between the oxide semiconductor film 336a and the insulating film 312a.

The transistor 103 in this modification example is a transistor in which the contact resistance between the oxide semiconductor film 336a and the conductive films 310d and 310e is lower than that of the transistor in Modification Example 5 and the on-state current is improved as compared to the transistor in Modification Example 5 because the conductive films 310d and 310e are in contact with the oxide semiconductor film 336a.

Further, since the conductive films 310d and 310e are in contact with the oxide semiconductor film 336a in the transistor 103 in this modification example, the oxide film 336b can be thickened without increase of the contact resistance between the oxide semiconductor film 336a and the conductive films 310d and 310e. Thus, it is possible to inhibit formation of a trap state, which occurs due to plasma damage at the time of forming the insulating film 312b, mixing of a constituent element of the insulating films 312a and 312b, or the like, in the vicinity of the interface between the oxide semiconductor film 336a and the oxide film 336b. That is, the transistor in this modification example can achieve both improvement of on-state current and reduction of change in threshold voltage.

Modification Example 7

Regarding Transistor Structure

In the transistors 102 and 103 in Embodiment 1, a plurality of gate electrodes facing each other with an oxide semiconductor film provided therebetween can be provided as needed. Here, description is made using the transistor 103.

Figure 22:
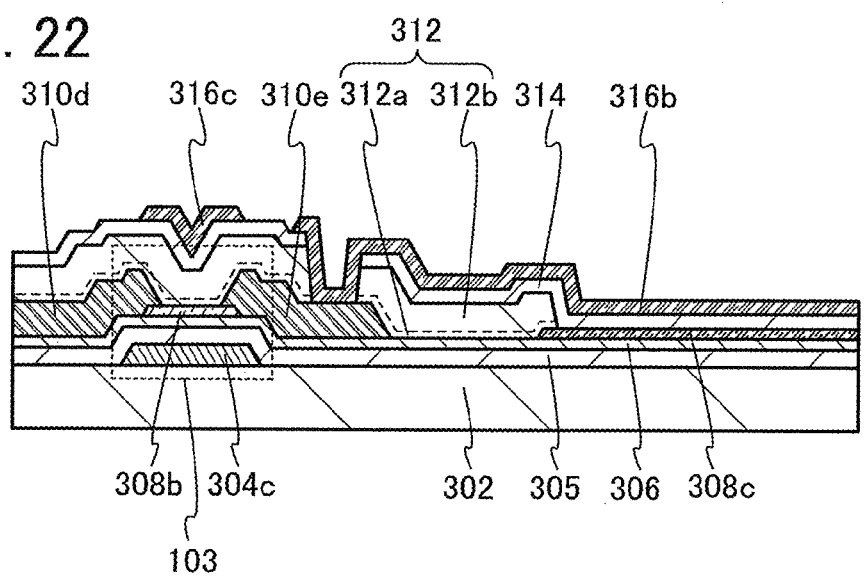
FIG. 22 is a cross-sectional view illustrating one aspect of a transistor.

The transistor 103 in FIG. 22 includes the conductive film 304c provided over the substrate 302, the insulating film 305 and the insulating film 306 which are formed over the substrate 302 and the conductive film 304c, the oxide semiconductor film 308b overlapping the conductive film 304c with the insulating films 305 and 306 provided therebetween, and the conductive film 310d and the conductive film 310e which are in contact with the oxide semiconductor film 308b. Further, the insulating film 312 in which the insulating film 312a and the insulating film 312b are stacked and the insulating film 314 are formed over the insulating film 306, the oxide semiconductor film 308b, and the conductive films 310d and 310e. In addition, the light-transmitting conductive film 316c overlapping the oxide semiconductor film 308b with the insulating films 312 and 314 provided therebetween is provided.

The conductive film 304c and the light-transmitting conductive film 316c face each other with the oxide semiconductor film 308b provided therebetween. The conductive films 304c and the light-transmitting conductive film 316c each function as a gate electrode. The light-transmitting conductive film 316c is preferably formed at the same time as the light-transmitting conductive film 316b because the number of steps can be reduced.

The transistor 103 in this modification example includes the conductive film 304c and the light-transmitting conductive film 316c facing each other with the oxide semiconductor film 308b provided therebetween. By applying different potentials to the conductive film 304c and the light-transmitting conductive film 316c, the threshold voltage of the transistor 103 can be controlled.

Note that the structures, methods, and the like described in this embodiment can be used as appropriate in combination with any of the structures, methods, and the like described in the other embodiments and examples.

Embodiment 3

In this embodiment, in a transistor contained in the semiconductor device described in the above embodiments, a mode which can be used for the oxide semiconductor film 308a, the oxide semiconductor film 308b, the light-transmitting conductive film 308c, and the multilayer film 336 will be described. Note that here, description is made by using an oxide semiconductor film as one example; however, an oxide film in a multilayer film can have a similar structure.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a CAAC-OS film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an In Ga Zn $O_4$ crystal is analyzed by an out-of-plane method, a peak appears frequently when the diffraction angle (2θ) is around 31°. This peak is derived from the (009) plane of the In Ga Zn $O_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the In Ga Zn $O_4$ crystal. Here, analysis (f scan) is performed under conditions where the sample is rotated around a normal vector of a sample surface as an axis (f axis) with 2q fixed at around 56°. In the case where the sample is a single-crystal oxide semiconductor film of In Ga Zn $O_4$, six peaks appear. The six peaks are derived from crystal planes equivalent to the (110) plane. On the other hand, in the case of a CAAC-OS film, a peak is not clearly observed even when 0 scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an In Ga Zn $O_4$ crystal is analyzed by an out-of-plane method, a peak of 2θ may also be observed at around 36°, in addition to the peak of 2θ at around 31°. The peak of 2l9 at around 36° indicates that a crystal having no c-axis alignment is included in part of the CAAC-OS film. It is preferable that in the CAAC-OS film, a peak of 2θ appears at around 31° and a peak of 2θ do not appear at around 36°.

With the use of the CAAC-OS film in a transistor, variation in electrical characteristics of the transistor due to irradiation with visible light or ultraviolet light is small. Thus, the transistor has high reliability.

Further, for example, spots (luminescent spots) are observed in an electron diffraction pattern of the CAAC-OS in some cases. An electron diffraction pattern obtained with an electron beam having a beam diameter of 10 nmϕ or smaller, or 5 nmϕ or smaller, is called a nanobeam electron diffraction pattern.

Figure 23A:
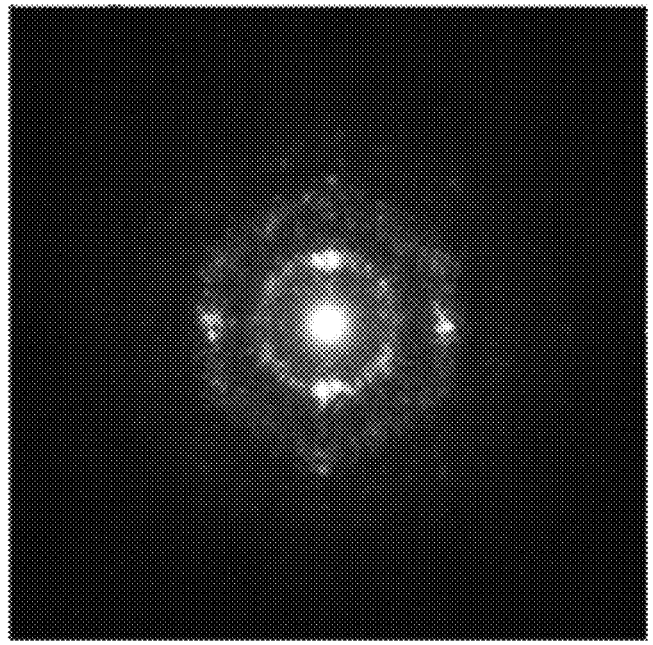
FIGS. 23A and 23B show nanobeam electron diffraction patterns of oxide semiconductors.

FIG. 23A is an example of a nanobeam electron diffraction pattern of a sample including a CAAC-OS film. Here, the sample is cut in the direction perpendicular to a formation surface of the CAAC-OS film and the thickness thereof is reduced to about 40 nm. Further, an electron beam with a diameter of 1 nmϕ enters in the direction perpendicular to the cut surface of the sample. In FIG. 23A, spots are observed in the nanobeam electron diffraction pattern of the CAAC-OS film.

Note that an oxide semiconductor film may be a stacked film including two or more kinds of an amorphous oxide semiconductor film, a microcrystalline oxide semiconductor film, and a CAAC-OS film, for example.

<Method for Forming CAAC-OS>

Since the c-axes of the crystal parts included in the CAAC-OS are aligned in the direction parallel to a normal vector of a surface where the CAAC-OS is formed or a normal vector of a surface of the CAAC-OS, the directions of the c-axes may be different from each other depending on the shape of the CAAC-OS (the cross-sectional shape of the surface where the CAAC-OS is formed or the cross-sectional shape of the surface of the CAAC-OS). Note that when the CAAC-OS is formed, the direction of c-axis of the crystal part is the direction parallel to a normal vector of the surface where the CAAC-OS is formed or a normal vector of the surface of the CAAC-OS. The crystal part is formed by film formation or by performing treatment for crystallization such as heat treatment after film formation.

There are three methods for forming a CAAC-OS.

The first method is to form an oxide semiconductor film at a temperature higher than or equal to 100° C. and lower than or equal to 450° C. to form, in the oxide semiconductor film, crystal parts in which the c-axes are aligned in the direction parallel to a normal vector of a surface where the oxide semiconductor film is formed or a normal vector of a surface of the oxide semiconductor film.

The second method is to form an oxide semiconductor film with a small thickness and then heat it at a temperature higher than or equal to 200° C. and lower than or equal to 700° C. to form, in the oxide semiconductor film, crystal parts in which the c-axes are aligned in the direction parallel to a normal vector of a surface where the oxide semiconductor film is formed or to a normal vector of a surface of the oxide semiconductor film.

The third method is to form a first oxide semiconductor film with a small thickness, then heat it at a temperature higher than or equal to 200° C. and lower than or equal to 700° C., and form a second oxide semiconductor film to form, in the second oxide semiconductor film, crystal parts in which the c-axes are aligned in the direction parallel to a normal vector of a surface where the second oxide semiconductor film is formed or to a normal vector of a surface of the second oxide semiconductor film.

Here, the first method for forming a CAAC-OS is described.

<Target and Formation Method Thereof>

The CAAC-OS is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle or the pellet-like sputtered particle reaches a surface on which the CAAC-OS is formed while maintaining its crystal state, whereby the CAAC-OS can be deposited.

For the deposition of the CAAC-OS, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the deposition chamber may be reduced. Furthermore, the concentration of impurities in a deposition gas may be reduced. Specifically, a deposition gas with a dew point of −80° C. or lower, preferably −100° C. or lower, more preferably −120° C. or lower is used.

By increasing the heating temperature of the surface on which the CAAC-OS is formed (e.g., the substrate heating temperature) during the deposition, migration of a sputtered particle is likely to occur after the sputtered particle reaches the surface on which the CAAC-OS is formed. Specifically, the temperature of the surface on which the CAAC-OS is formed during the deposition is higher than or equal to 100° C. and lower than or equal to 740° C., preferably higher than or equal to 200° C. and lower than or equal to 500° C. By increasing the temperature of the surface on which the CAAC-OS is formed during the deposition, when the flat-plate-like or the pellet-like sputtered particle reaches the surface on which the CAAC-OS is formed, migration occurs on the surface on which the CAAC-OS is formed, so that a flat plane of the sputtered particle is attached to the surface on which the CAAC-OS is formed. The diameter (equivalent circle diameter) of the plane of the sputtered particle, which is parallel to the a-b plane, is approximately greater than or equal to 1 nm and less than or equal to 30 nm or greater than or equal to 1 nm and less than or equal to 10 nm, though it differs depending on the kind of oxide. Note that the flat-plate-like or the pellet-like sputtered particle may have a hexagonal cylinder shape whose hexagonal plane is parallel to the a-b plane. In such a case, a direction perpendicular to the hexagonal plane is a c-axis direction.

When a cation of oxygen is ejected to a sputtering target in the sputtering, it is possible to reduce plasma damage at the deposition. Thus, when the ion collides with the surface of the sputtering target, a lowering in crystallinity of the sputtering target can be suppressed or a change of the sputtering target into an amorphous state can be suppressed.

When a cation of oxygen or argon is ejected to a sputtering target in the sputtering, in the case where a flat-plate-like or the pellet-like sputtered particle having a hexagonal columnar shape is sputtered, the corners of a hexagonal plane can be positively charged. When the corners of the hexagonal plane are positively charged, positive charges repel each other in one sputtered particle. Thus, flat-plate or pellet shapes of the sputtered particles can be maintained.

It is preferable to use a direct-current (DC) power source to positively charge the corners of the plane of the flat-plate-like or the pellet-like sputtered particle. Note that a radio frequency (RF) power source or an alternating-current (AC) power source can be used. Note that it is difficult to use an RF power source for a sputtering apparatus which is capable of deposition to a large-sized substrate. In addition, a DC power source is preferred to an AC power source from the viewpoint below.

In the AC power source, adjacent targets alternately have a cathode potential and an anode potential. In the case where the flat-plate-like or the pellet-like sputtered particle is positively charged, positive charges in the sputtered particle repel each other, whereby flat-plate or pellet shapes of the sputtered particles can be maintained. However, in the case where the AC power source is used, there is time during which an electric field is not applied instantaneously; therefore, some charges of the flat-plate-like or the pellet-like sputtered particle are lost and the structure of the sputtered particle might be broken. Thus, a DC power source is preferred to an AC power source.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The polycrystalline In—Ga—Zn-based compound target is made by mixing $InO_x$ powder, $GaO_y$ powder, and $ZnO_z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. Note that X, Y, and Z are each a given positive number. Here, the predetermined molar ratio of $InO_x$ powder to $GaO_y$ powder and $ZnO_z$ powder is, for example, 2:2:1, 8:4:3, 3:1:1, 1:1:1, 4:2:3, 3:1:2, 1:3:2, 1:6:4, or 1:9:6. The kinds of powder and the molar ratio for mixing powder may be determined as appropriate depending on the desired sputtering target.

With use of the sputtering target in the way as described above, an oxide semiconductor film having a uniform thickness and a uniform crystal orientation can be formed.

<Polycrystalline Oxide Semiconductor>

A polycrystalline oxide semiconductor includes a plurality of crystal grains. A polycrystalline oxide semiconductor includes, for example, amorphous parts in some cases.

In an image obtained with a TEM, for example, crystal grains can be found in the polycrystalline oxide semiconductor in some cases. In most cases, the size of a crystal grain in the polycrystalline oxide semiconductor is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in the TEM image, a boundary between crystal grains or a boundary between an amorphous part and a crystal grain can be found in the polycrystalline oxide semiconductor in some cases. Moreover, in the TEM image, a grain boundary can be found in the polycrystalline oxide semiconductor in some cases.

The polycrystalline oxide semiconductor may include a plurality of crystal grains, and the alignment of crystals may be different in the plurality of crystal grains. When a polycrystalline oxide semiconductor is analyzed by an out-of-plane method with an XRD apparatus, one or plural peaks appear in some cases. For example in the case of a polycrystalline IGZO film, a peak at 2θ of around 31° which shows alignment or plural peaks which show plural kinds of alignment appear in some cases. Further, spots are observed in a nanobeam electron diffraction pattern of the polycrystalline oxide semiconductor in some cases.

The polycrystalline oxide semiconductor has high crystallinity and thus has high electron mobility in some cases. Accordingly, a transistor including the polycrystalline oxide semiconductor in a channel region has high field-effect mobility. Note that there are cases in which an impurity is segregated at the grain boundary between the crystals in the polycrystalline oxide semiconductor. Moreover, the grain boundary of the polycrystalline oxide semiconductor becomes a defect state. Since the grain boundary of the polycrystalline oxide semiconductor may serve as a carrier trap or a carrier generation source, a transistor using the polycrystalline oxide semiconductor for a channel region has larger variation in electrical characteristics and lower reliability than a transistor using a CAAC-OS for a channel region in some cases.

The polycrystalline oxide semiconductor can be formed by high-temperature heat treatment or laser light treatment.

<Microcrystalline Oxide Semiconductor>

In an image obtained with a TEM, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with a TEM, for example, a boundary between crystal parts is not clearly detected in some cases. In an image of the nc-OS obtained with a TEM, for example, since a clear grain boundary does not exist, for example, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is unlikely to occur.

In the nc-OS, for example, a microscopic region (for example, a region with a size greater than or equal to 1 nm and less than or equal to 10 nm) has a periodic atomic order occasionally. Further, for example, in the nc-OS, crystal parts are not regularly-arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than that of a crystal part, a peak which shows alignment does not appear in some cases. Further, for example, a halo pattern is shown in some cases in an electron diffraction pattern of the nc-OS obtained by using an electron beam having a diameter larger than that of a crystal part (for example, a beam diameter of 20 nmϕ or more, or 50 nmϕ or more). For example, spots are shown in some cases in a nanobeam electron diffraction pattern of the nc-OS obtained by using an electron beam having a diameter smaller than or equal to that of a crystal part (for example, a beam diameter of 10 nmϕ or less, or 5 nmϕ or less). In a nanobeam electron diffraction pattern of the nc-OS, for example, regions with high luminance in a circular pattern are shown in some cases. In a nanobeam electron diffraction pattern of the nc-OS, for example, a plurality of spots are shown in the region in some cases.

Figure 23B:
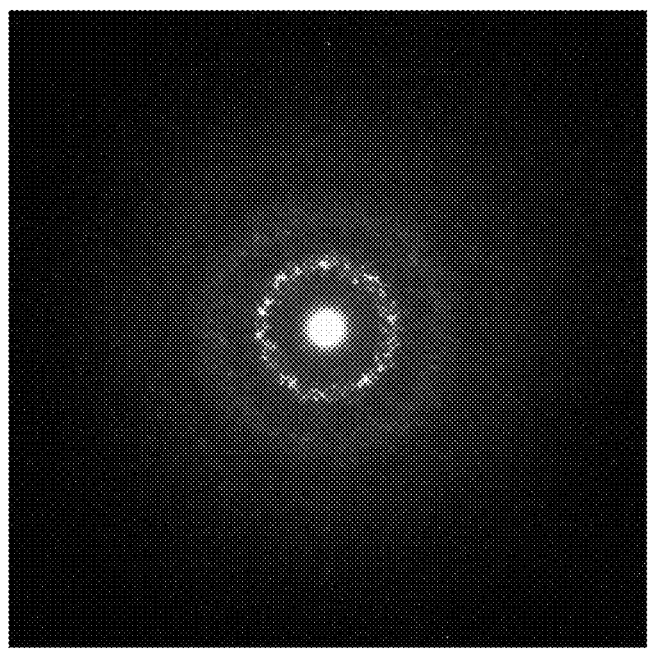

FIG. 23B is an example of a nanobeam electron diffraction pattern of a sample including nc-OS. Here, the sample is cut in the direction perpendicular to a surface where the nc-OS is formed and the thickness thereof is reduced to about 40 nm. Further, an electron beam with a diameter of 1 nmϕ enters from the direction perpendicular to the cut surface of the sample. FIG. 23B shows that regions with high luminance in a circular pattern are observed and a plurality of spots are observed in the region in the nanobeam electron diffraction pattern of the nc-OS.

Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS. Note that of the nc-OS, the absorption coefficient calculated by a constant photocurrent method (CPM) is lower than 1 /cm, preferably lower than $5\times10^{-1}$ /cm, further preferably lower than $5\times10^{-2}$ /cm.

Thus, the nc-OS may have a higher carrier density than the CAAC-OS. An oxide semiconductor with a high carrier density tends to have a high electron mobility. Therefore, a transistor using the nc-OS for a channel region has a high field-effect mobility in some cases. On the contrary, the nc-OS has higher density of defect states than the CAAC-OS and thus has higher density of trap states in some cases. Therefore, a transistor using the nc-OS for a channel region has larger variation in electrical characteristics and lower reliability than a transistor using the CAAC-OS for a channel region.

<Method of Forming Microcrystalline Oxide Semiconductor Film>

Next, a method of forming the microcrystalline oxide semiconductor film is described below. The microcrystalline oxide semiconductor film is formed by a sputtering method in an atmosphere containing oxygen at a temperature of higher than or equal to a room temperature and lower than or equal to 75° C., preferably higher than or equal to a room temperature and lower than or equal to 50° C. With the use of the atmosphere containing oxygen, oxygen vacancies in the microcrystalline oxide semiconductor film can be reduced and a film including a microcrystal part can be formed.

A reduction of oxygen vacancies in the microcrystalline oxide semiconductor film allows the formation of a film having stable physical properties. In particular, in the case where a semiconductor device is manufactured with the use of a microcrystalline oxide semiconductor film, oxygen vacancies in the microcrystalline oxide semiconductor film serve as donors, and electrons that are carriers are generated in the microcrystalline oxide semiconductor film, which causes change in electrical characteristics of the semiconductor device. Thus, a semiconductor device formed using a microcrystalline oxide semiconductor film in which oxygen vacancies are reduced can be highly reliable.

Note that it is preferable to increase the oxygen partial pressure in the deposition atmosphere because the oxygen vacancies in the microcrystalline oxide semiconductor film can be further reduced. More specifically, the oxygen partial pressure in the deposition atmosphere is preferably greater than or equal to 33%.

Note that for a target used in formation of a microcrystalline oxide semiconductor film by a sputtering method, a target and a forming method which are similar to those of the CAAC-OS can be used.

Note that the nc-OS can be formed easily as compared to the CAAC-OS because the nc-OS can be formed even when a relatively large amount of impurities are included; thus, depending on the purpose, the nc-OS can be favorably used in some cases. For example, the nc-OS may be formed by a deposition method such as a sputtering method using an AC power supply. The sputtering method using an AC power supply allows a film to be formed with high uniformity over a large substrate, so that a semiconductor device including a transistor using the nc-OS for a channel region can be manufactured with high productivity.

<Amorphous Oxide Semiconductor>

An amorphous oxide semiconductor, for example, has disordered atomic arrangement and no crystal part. An amorphous oxide semiconductor, for example, does not have a specific shape as in quartz and regularity in atomic arrangement.

In an image obtained with a TEM, for example, crystal parts cannot be found clearly in the amorphous oxide semiconductor film in some cases.

When an amorphous oxide semiconductor is analyzed by an out-of-plane method with an XRD apparatus, a peak which shows alignment does not appear in some cases. Further, a halo pattern is observed in an electron diffraction pattern of an amorphous oxide semiconductor film in some cases. In other cases, a halo pattern is observed instead of a spot in a nanobeam electron diffraction pattern of the amorphous oxide semiconductor film.

The amorphous oxide semiconductor can be formed in some cases, for example, by introducing a high-concentration impurity such as hydrogen. Thus, the amorphous oxide semiconductor contains impurities at a high concentration.

When an oxide semiconductor contains a high-concentration impurity, a defect state such as an oxygen vacancy is formed in the oxide semiconductor in some cases. This means that an amorphous oxide semiconductor with a high-concentration impurity has a high density of defect states. In addition, since the amorphous oxide semiconductor has low crystallinity, the density of defect states of the amorphous oxide semiconductor is higher than that of the CAAC-OS or the nc-OS.

Accordingly, the amorphous oxide semiconductor has much higher carrier density than the nc-OS. Therefore, a transistor including the amorphous oxide semiconductor for a channel region tends to be normally on. Thus, in some cases, such an amorphous oxide semiconductor can be applied to a transistor which needs to be normally on. Since the amorphous oxide semiconductor has a high density of defect states, density of carrier traps might be increased. Consequently, a transistor including the amorphous oxide semiconductor for a channel region has larger variation in electric characteristics and lower reliability than a transistor including the CAAC-OS or the nc-OS for a channel region. Note that the amorphous oxide semiconductor can be formed by a deposition method in which a relatively large amount of impurity is contained, and thus can be easily obtained and preferably used depending on the application. For example, the amorphous oxide semiconductor may be formed by a deposition method such as a spin coating method, a sol-gel method, an immersion method, a spray method, a screen printing method, a contact printing method, an ink-jet printing method, a roll coating method, or a mist CVD method. Hence, a semiconductor device including a transistor using the amorphous oxide semiconductor for a channel region can be manufactured with high productivity.

Note that when the oxide semiconductor has few defects, the density thereof is increased. When the oxide semiconductor has high crystallinity, the density thereof is increased. When the oxide semiconductor has a lower concentration of impurities such as hydrogen, the density thereof is increased. The single-crystal oxide semiconductor has higher density than the CAAC-OS in some cases. The CAAC-OS has higher density than the microcrystalline oxide semiconductor in some cases. The polycrystalline oxide semiconductor has higher density than the microcrystalline oxide semiconductor in some cases. The microcrystalline oxide semiconductor has higher density than the amorphous oxide semiconductor in some cases.

Embodiment 4

In this embodiment, the driver circuit portion of the display device described in the above embodiments will be described.

One mode of this embodiment is a driver circuit which includes a shift register unit, a demultiplexer circuit electrically connected to the shift register unit, and n signal lines (n is a natural number of four or more). The shift register unit is electrically connected to one or more of the n signal lines. The demultiplexer circuit is electrically connected to one to (n−3) of the n signal lines.

Another mode of this embodiment is a driver circuit which includes m shift register units (m is a natural number of three or more), m demultiplexer circuits electrically connected to the m shift register units, and n signal lines (n is a natural number of four or more). Each of the m shift register units is electrically connected to one or more of the n signal lines. Each of the m demultiplexer circuits is electrically connected to one to (n−3) of the n signal lines. To one of the m shift register units, one of outputs of a demultiplexer circuit electrically connected to a shift register unit in the previous stage of one of the m shift register units is input. To one of the m shift register units, one of outputs of the demultiplexer circuit electrically connected to the shift register unit in the next stage of the one of the m shift register units is input.

Another mode of this embodiment is a driver circuit which includes a shift register unit, a demultiplexer circuit, and n signal lines (n is a natural number of four or more). The shift register unit includes a set signal line, and a first transistor to a sixth transistor. One of a source and a drain of the first transistor is electrically connected to a high power supply potential line. The other of the source and the drain of the first transistor is electrically connected to one of a source and a drain of the second transistor and a demultiplexer circuit. A gate of the first transistor is electrically connected to the set signal line. The other of the source and the drain of the second transistor is electrically connected to a low power supply potential line. A gate of the second transistor is electrically connected to the demultiplexer circuit, one of a source and a drain of the fourth transistor, one of a source and a drain of the fifth transistor, and one of a source and a drain of the sixth transistor. One of a source and a drain of the third transistor is electrically connected to the high power supply potential line. The other of the source and the drain of the third transistor is electrically connected to the other of the source and the drain of the fourth transistor. A gate of the third transistor is electrically connected to one of the n signal lines. A gate of the fourth transistor is electrically connected to one of the n signal lines. The other of the source and the drain of the fifth transistor is electrically connected to the low power supply potential line. A gate of the fifth transistor is electrically connected to the set signal line. The other of the source and the drain of the sixth transistor is electrically connected to the high power supply potential line. A gate of the sixth transistor is electrically connected to a reset signal line. The demultiplexer circuit includes a buffers (a is a natural number of 1 or more and (n−3) or less). The a buffers are electrically connected to the other of the source and the drain of the first transistor and the gate of the second transistor. The a buffers are electrically connected to different signal lines of the n signal lines and each have an output terminal.

Figure 29:
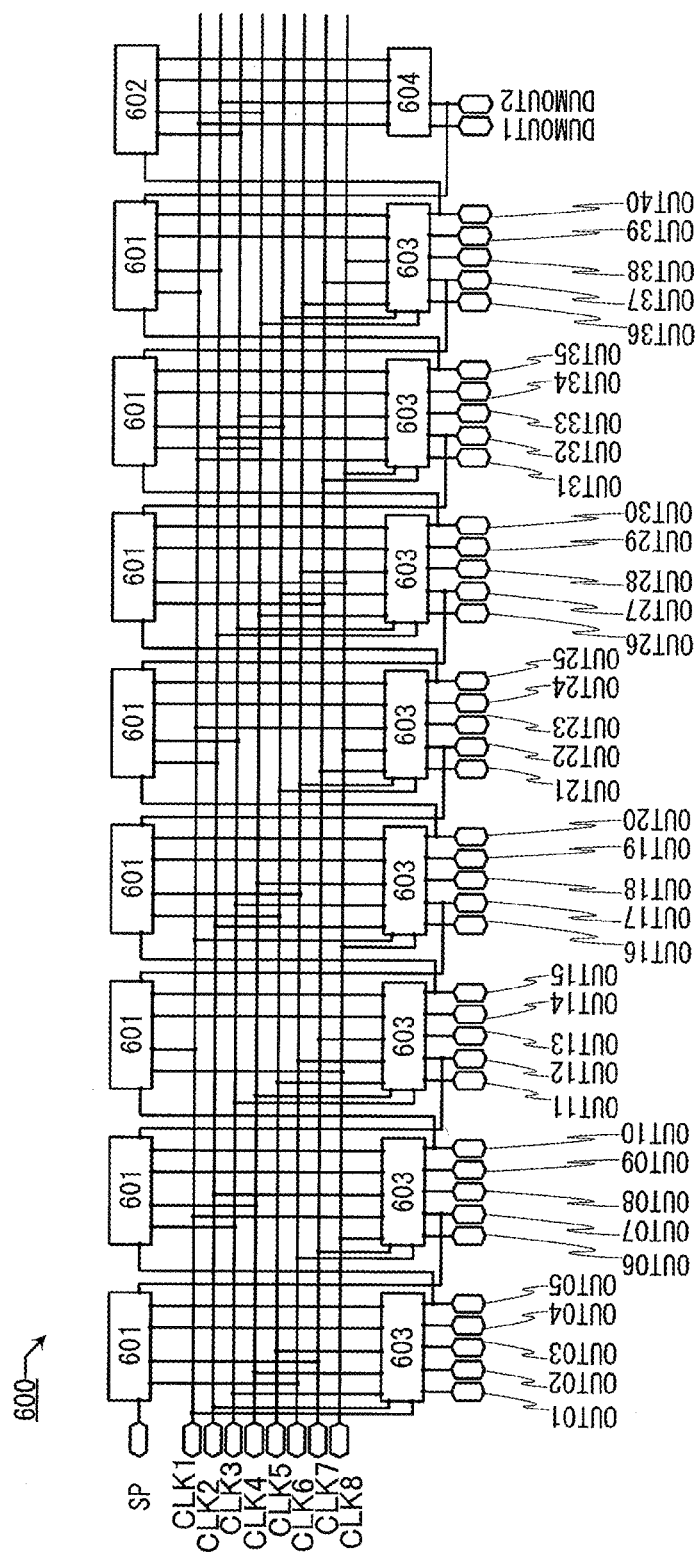
FIG. 29 illustrates an overall view of a gate driver circuit.

A specific structure is described with reference to the drawings. FIG. 29 is a diagram of an entire gate driver circuit as one example of a driver circuit of a display device.

A gate driver circuit 600 includes a plurality of shift register units (SR) 601, a shift register unit 602 (SR D) which is a dummy stage, demultiplexer circuits (DMP, also referred to as DEMUX) 603 electrically connected to the shift register unit 601, a demultiplexer circuit (DMP, also referred to as DEMUX) 604 electrically connected to the shift register unit 602, and a signal line transmitting a start pulse SP and clock signals (CLK1 to CLK8).

Figure 30A:
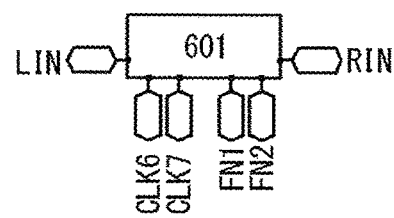
FIGS. 30A and 30B illustrate a shift register unit.
Figure 30B:
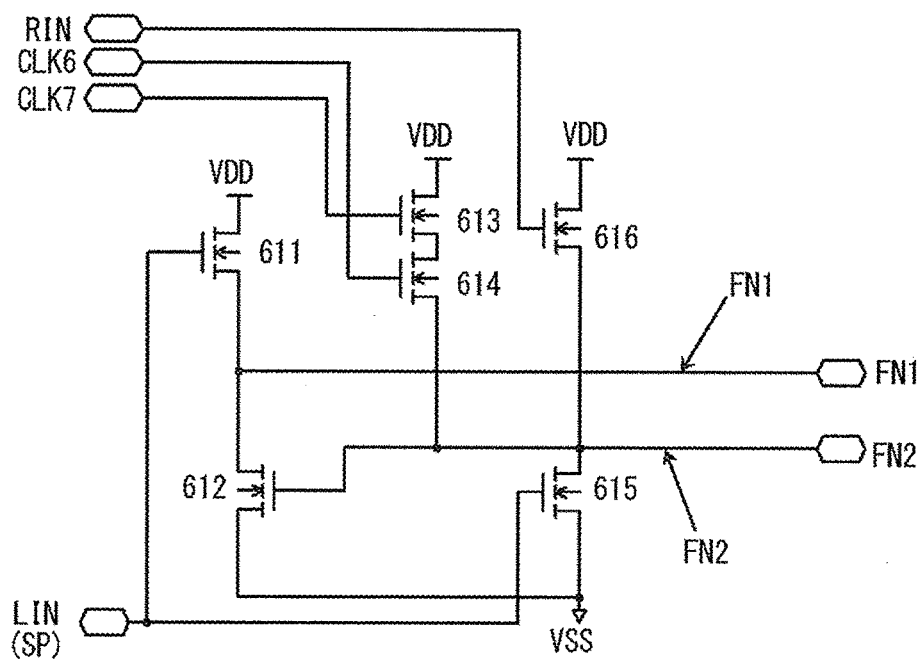

To the shift register unit 601 (here, description is made by using a shift register unit in the first stage), as shown in FIG. 30A, a set signal LIN (here, the start pulse SP), a reset signal RIN, and clock signals (here, CLK6 and CLK7) are input. FIG. 30B illustrates a specific circuit structure example. The shift register unit 601 includes a first transistor 611 to a sixth transistor 616.

One of a source and a drain of the first transistor 611 is connected to a high power supply potential line VDD. The other of the source and the drain of the first transistor 611 is connected to one of a source and a drain of the second transistor 612 and an input terminal FN1 of the demultiplexer circuit 603. The set signal LIN is input to a gate of the first transistor 611. The other of the source and the drain of the second transistor 612 is connected to a low power supply potential line VSS. A gate of the second transistor 612 is connected to an input terminal FN2 of the demultiplexer circuit 603, one of a source and a drain of the fourth transistor 614, one of a source and a drain of the fifth transistor 615, and one of a source and a drain of the sixth transistor 616. One of a source and a drain of the third transistor 613 is connected to the high power supply potential line VDD. The other of the source and the drain of the third transistor 613 is connected to the other of the source and the drain of the fourth transistor 614. The clock signal CLK7 is input to a gate of the third transistor 613. The clock signal CLK6 is input to a gate of the fourth transistor 614. The other of the source and the drain of the fifth transistor 615 is connected to the low power supply potential line VSS. The set signal LIN is input to a gate of the fifth transistor 615. The other of the source and the drain of the sixth transistor 616 is connected to the high power supply potential line VDD. The reset signal RIN is input to a gate of the sixth transistor 616. Note that a portion in which the other of the source and the drain of the first transistor 611 and the one of the source and the drain of the second transistor 612 are electrically connected is referred to as a node FN1. A portion in which the gate of the second transistor 612, the one of the source and the drain of the fourth transistor 614, the one of the source and the drain of the fifth transistor 615, and the one of the source and the drain of the sixth transistor 616 are electrically connected is referred to as a node FN2.

The clock signals CLK6 and CLK7 are input to the shift register unit 601 in the (8a+1)th stage (a is zero or a natural number). The clock signals CLK3 and CLK4 are input to the shift register unit 601 in the (8a+2)th stage (a is zero or a natural number). The clock signals CLK1 and CLK8 are input to the shift register unit 601 in the (8a+3)th stage (a is zero or a natural number). The clock signals CLK5 and CLK6 are input to the shift register unit 601 in the (8a+4)th stage (a is zero or a natural number). The clock signals CLK2 and CLK3 are input to the shift register unit 601 in the (8a+5)th stage (a is zero or a natural number). The clock signals CLK7 and CLK8 are input to the shift register unit 601 in the (8a+6)th stage (a is zero or a natural number). The clock signals CLK4 and CLK5 are input to the shift register unit 601 in the (8a+7)th stage (a is zero or a natural number).

The clock signals CLK1 and CLK2 are input to the shift register unit 601 in the 8(a+1)th stage (a is zero or a natural number).

Figure 31A:
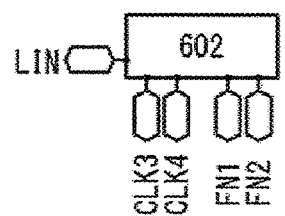
FIGS. 31A and 31B illustrate a shift register unit which is a dummy stage.
Figure 31B:
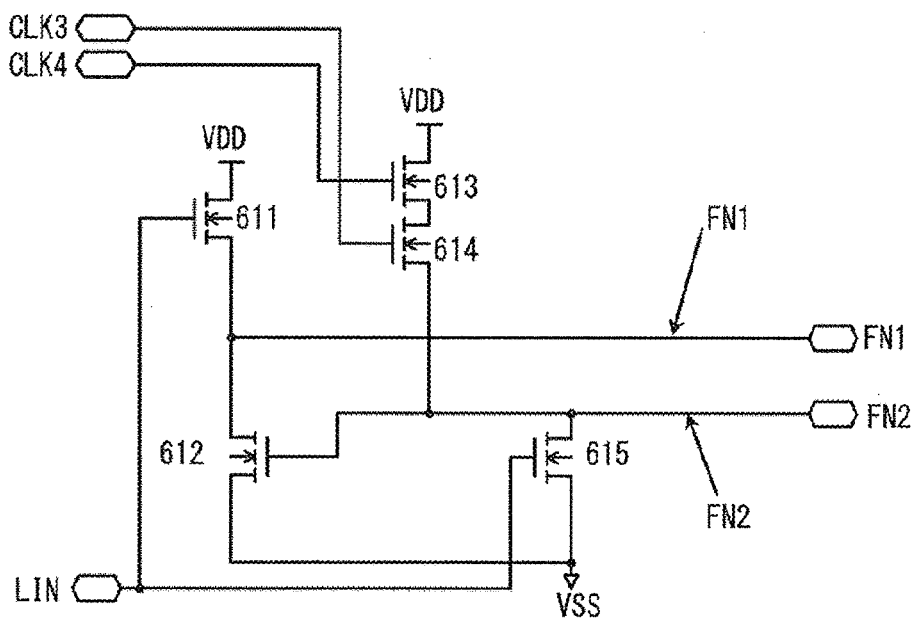

The set signal LIN and clock signals (here, CLK3 and CLK4) are input to the shift register unit 602 which is a dummy stage, as illustrated in FIG. 31A. FIG. 31B illustrates a specific circuit structure example. The shift register unit 602 includes the first transistor 611 to the fifth transistor 615.

The one of the source and the drain of the first transistor 611 is connected to the high power supply potential line VDD. The other of the source and the drain of the first transistor 611 is connected to the one of the source and the drain of the second transistor 612 and the input terminal FN1 of the demultiplexer circuit 604. The set signal LIN is input to the gate of the first transistor 611. The other of the source and the drain of the second transistor 612 is connected to the low power supply potential line VSS. The gate of the second transistor 612 is connected to the input terminal FN2 of the demultiplexer circuit 604, the one of the source and the drain of the fourth transistor 614, and the one of the source and the drain of the fifth transistor 615. The one of the source and the drain of the third transistor 613 is connected to the high power supply potential line VDD. The other of the source and the drain of the third transistor 613 is connected to the other of the source and the drain of the fourth transistor 614. The clock signal CLK4 is input to the gate of the third transistor 613. The clock signal CLK3 is input of the gate of the fourth transistor 614. The other of the source and the drain of the fifth transistor 615 is connected to the low power supply potential line VSS. The set signal LIN is input to the gate of the fifth transistor 615. Note that a portion in which the other of the source and the drain of the first transistor 611 and the one of the source and the drain of the second transistor 612 are electrically connected is referred to as the node FN1. A portion in which the gate of the second transistor 612, the one of the source and the drain of the fourth transistor 614, and the one of the source and the drain of the fifth transistor 615 are electrically connected is referred to as the node FN2.

Figure 32A:
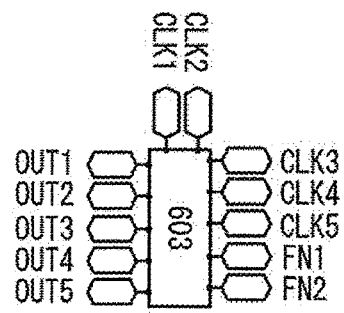
FIGS. 32A and 32B illustrate a demultiplexer.
Figure 32B:
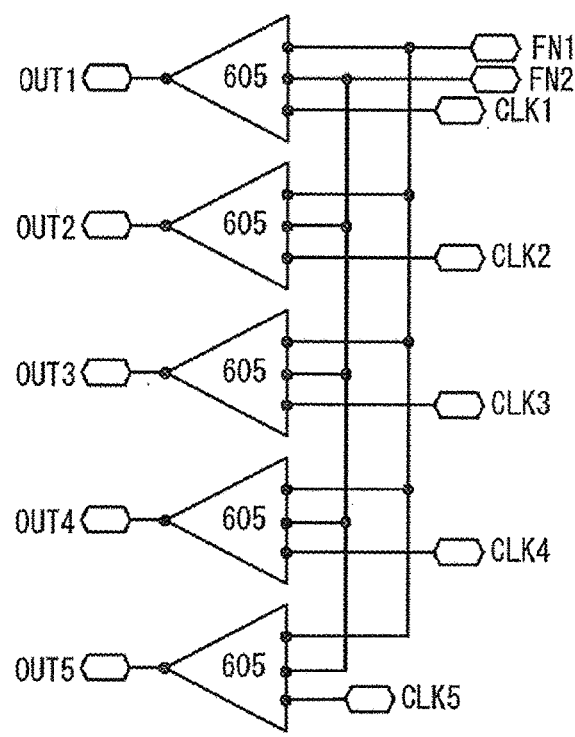
Figure 33A:
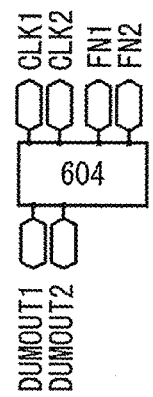
FIGS. 33A and 33B illustrate a demultiplexer.
Figure 33B:
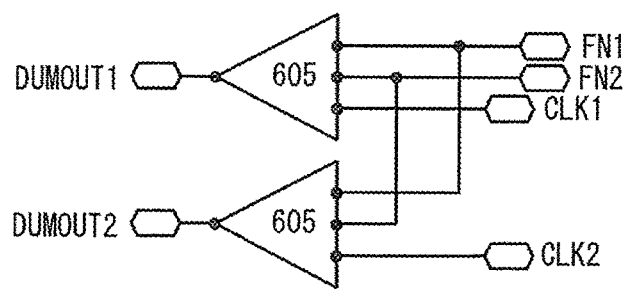

As illustrated in FIG. 32A and FIG. 33A, clock signals and output signals are input from the shift register unit 601 and the shift register unit 602 (signals input to the input terminal FN1 and the input terminal FN2) to the demultiplexer circuit 603 and the demultiplexer circuit 604, and the demultiplexer circuit 603 and the demultiplexer circuit 604 output output signals. FIG. 32B and FIG. 33B each illustrate a specific circuit structure example. The demultiplexer circuit 603 and the demultiplexer circuit 604 each include a buffer (BUF) 605.

Figure 34:
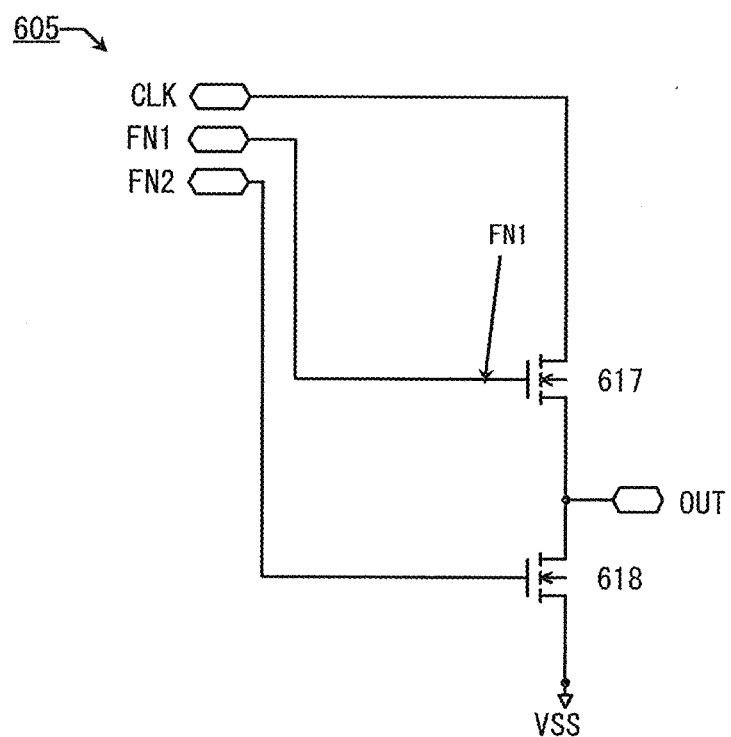
FIG. 34 illustrates a buffer.

FIG. 34 illustrates one example of a specific circuit structure of the buffer 605. A clock signal CLK (one of the clock signals CLK1 to CLK8) is input to one of a source and a drain of a seventh transistor 617. The other of the source and the drain of the seventh transistor 617 is connected to one of a source and a drain of an eighth transistor 618 and an output terminal A gate of the seventh transistor 617 is connected to the node FN1. The other of the source and the drain of the eighth transistor 618 is connected to the low power supply potential line VSS. A gate of the eighth transistor 618 is connected to the node FN2.

Figure 35A:
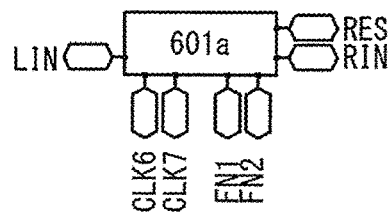
FIGS. 35A and 35B illustrate another shift register unit.
Figure 35B:
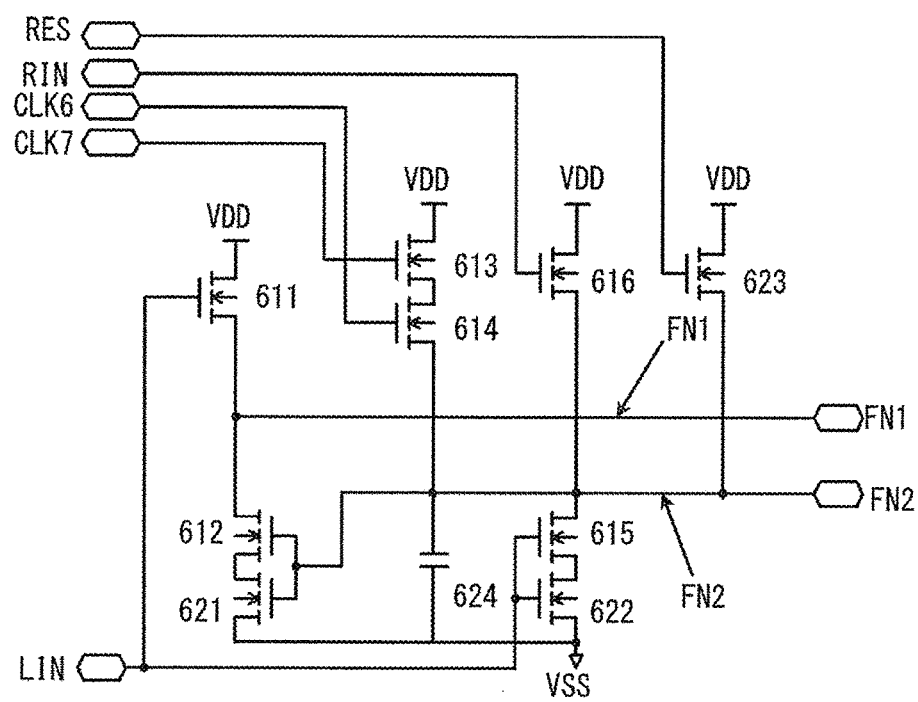

A shift register unit may be a shift register unit 601a which is illustrated in FIG. 35A and FIG. 35B and in which a transistor 621, a transistor 622, a transistor 623, and a capacitor 624 are added to the shift register unit 601. Note that a reset signal RES is input to a gate of the transistor 623.

Figure 36A:
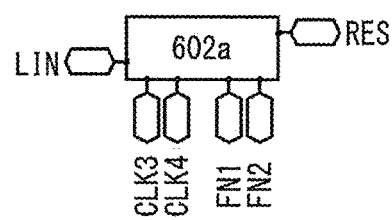
FIGS. 36A and 36B illustrate another shift register unit which is a dummy stage.
Figure 36B:
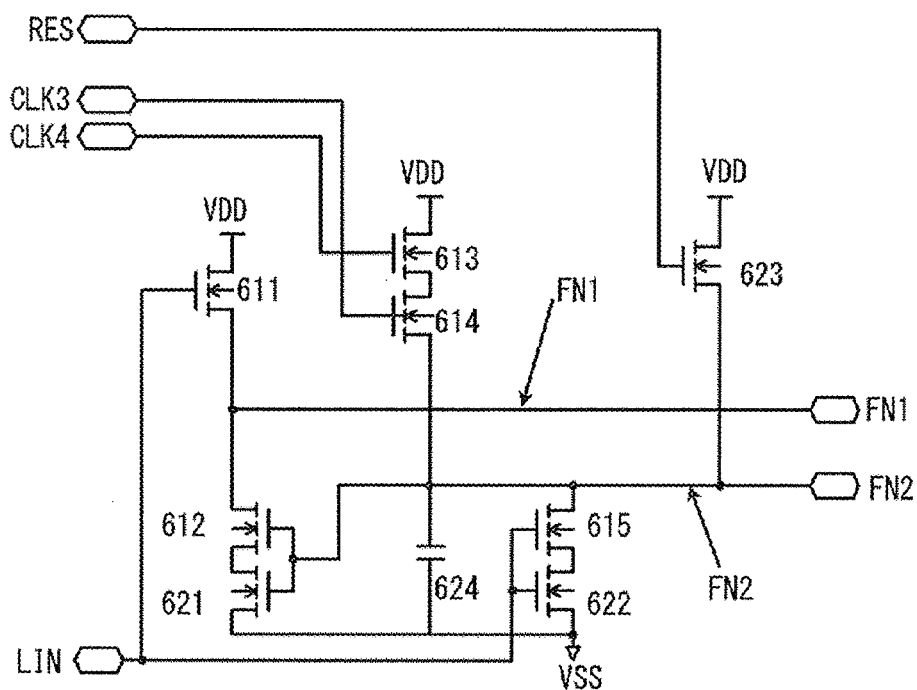

Similarly, a shift register unit which is a dummy stage may be a shift register unit 602a which is illustrated in FIG. 36A and FIG. 36B and in which the transistor 621, the transistor 622, the transistor 623, and the capacitor 624 are added to the shift register unit 602. Note that the reset signal RES is input to the gate of the transistor 623.

To initialize the shift register unit, a pulse of the reset signal RES is input to turn on the transistor 623, so that the potential of the node FN2 becomes equal to the potential of the high potential power supply line VDD. The second transistor 612 and the transistor 621 are turned on with the potential of the node FN2, so that the potential of the node FN1 becomes equal to the potential of the low potential power supply line VSS. Consequently, the shift register unit can be initialized. Note that the reset signal RES is input to all of the shift register units through a common signal line.

Figures 37A, 37B:
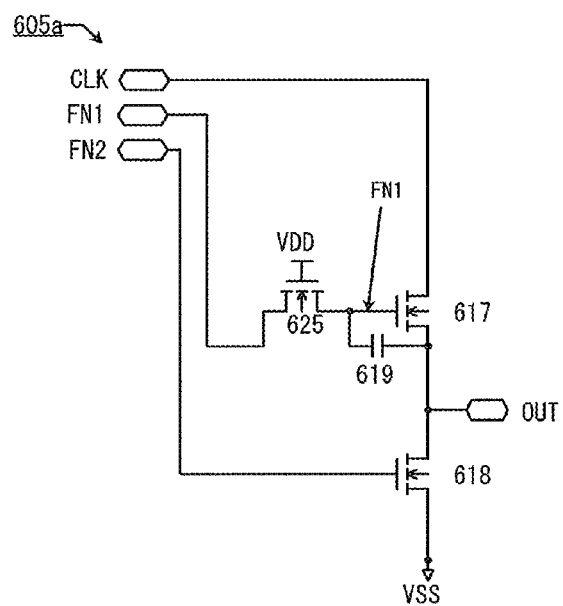
FIGS. 37A and 37B illustrate another buffer.

As illustrated in FIG. 37A and FIG. 37B, the buffer 605 can be replaced with a buffer 605a further provided with a transistor 625 and a capacitor 619.

The capacitor serves as storage capacitor for holding charge.

Note that each of the transistors in this embodiment is a transistor using an oxide semiconductor described in the above embodiment. In particular, the above embodiment is referred to for a portion where a gate of a transistor and one of a source and a drain of another transistor are electrically connected, which results in reducing the bezel area of a display device.

In the shift register unit 601 in the first stage, the clock signals CLK1 to CLK5 are input to the demultiplexer circuit 603 and the demultiplexer circuit 603 outputs output signals OUT1 to OUT5.

The potential of the node FN2 is fixed to a high potential in a period in which a gate selection output is not output, so that the second transistor 612 and the eighth transistor 618 are always on. In this way, the output is a low potential stably. However, in the case where the cutoff current (a drain current flowing at a gate voltage of 0 V) of the fifth transistor 615 is high, charge of the node FN2 leaks through the fifth transistor 615; therefore, charge needs to be regularly compensated. Thus, the third transistor 613 and the fourth transistor 614 are turned on with the clock signals CLK6 and CLK7, so that charge for the node FN2 is supplied from the high power supply potential line VDD. Note that a gate selection output period (the period in which the node FN1 is at high potential) of the shift register unit 601 in the first stage is a period from the rising (set) of the start pulse SP to the rising (reset) of the clock signal CLK7, which is described later. In the period, the gate selection output period and timing of regular compensation of charge are set not to overlap each other with two clock signals.

In the shift register unit 601 in the first stage, the clock signal CLK8 is not input to anywhere. The clock signal is also provided to avoid overlapping timing of regular compensation of charge.

Similarly, in the shift register unit 601 in the second stage, the clock signals CLK1, CLK2, and CLK6 to CLK8 are input to the demultiplexer circuit 603, and the demultiplexer circuit 603 outputs the output signals OUT1 to OUT5. The clock signals CLK3 and CLK4 function to regularly compensate charge. In the shift register unit 601 in the second stage, the clock signal CLK5 is not input to anywhere.

The same can be applied to the shift register units 601 in the third and the following stages. In other words, one stage of the shift register unit inputs five clock signals to the demultiplexer circuit 603, and the demultiplexer circuit 603 outputs five output signals. Other two clock signals function to regularly compensate charge and are input to the shift register unit 601. The other clock signal is not input to anywhere.

The same is also applied to the shift register unit 602 which is a dummy stage. The clock signals CLK1 and CLK2 are input to the demultiplexer circuit 604, and the demultiplexer circuit 604 outputs output signals DUMOUT1 and DUMOUT2. The clock signals CLK3 and CLK4 function to regularly compensate charge.

The number of clock signals are eight in this embodiment, but the present invention is not limited thereto. The number of clock signals may be any number as long as it is four or more. For example, when the number of clock signals is n, the number of output signals is (n−3) since three clock signals do not contribute to output signals.

In other words, by connecting n signal lines for transmitting clock signals to one stage of the shift register unit, (n−3) output signals can be output. The larger n becomes, the smaller the rate of signal lines for transmitting clock signals which do not contribute to output becomes; accordingly, the area of the shift register unit part is small compared to a conventional structure in which one stage of a shift register unit outputs one output signal. Therefore, the width of the gate driver circuit 600 can be reduced.

Figure 38A:
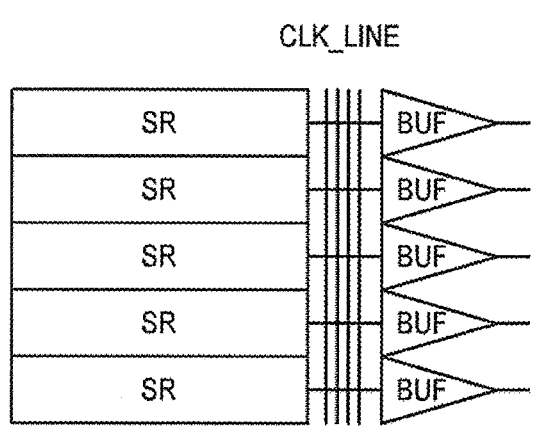
FIGS. 38A and 38B illustrate a way to obtain narrower bezel.
Figure 38B:
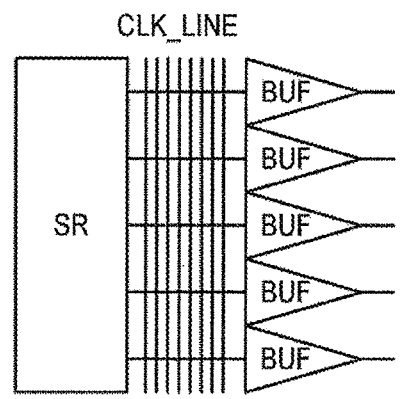

Here, to narrow the bezel of the gate driver circuit 600 is briefly described. FIG. 38A is a block diagram of a conventional gate driver circuit. FIG. 38B is a block diagram of a gate driver circuit in this embodiment.

In a conventional gate driver circuit illustrated in FIG. 38A, one stage of a shift register unit SR is connected to four signal lines CLK_LINE for transmitting a clock signal and one buffer BUF outputs one signal. On the other hand, in the gate driver circuit in this embodiment illustrated in FIG. 38B, one shift register unit SR is connected to eight signal lines CLK_LINE for transmitting clock signals and five buffers BUF output five signals.

The gate driver circuit in this embodiment can have a smaller horizontal layout width of one shift register unit than that of the conventional gate driver circuit. The vertical layout width increases because of increased buffers BUF (here, five times as much as the conventional one), but the increase does not contribute to the bezel of the gate driver circuit. The horizontal layout width of one shift register unit can be reduced, so that the bezel can be narrower. In comparison with the conventional one, the number of the signal lines CLK_LINE for transmitting a clock signal is increased, and accordingly, load capacitance for each signal line CLK_LINE can be reduced. Therefore, even when the signal line CLK_LINE is set to thin to increase load resistance, delay time is not changed (because time constant=load capacitance×load resistance). Accordingly, by making the width of the signal line thin to obtain the same time constant, increase in layout width can be prevented; therefore, even if the number of the signal lines CLK_LINE is increased, the width of the gate driver circuit can be reduced.

Next, the operation of the gate driver circuit 600 is described with reference to a timing diagram in FIG. 39. Here, high potentials of the set signal LIN, the reset signal RIN, and the clock signals CLK1 to CLK8 correspond to the potential of the high power supply potential line VDD, while low potentials of the set signal LIN, the reset signal RIN, and the clock signals CLK1 to CLK8 correspond to the potential of the low power supply potential line VSS.

Figure 39:
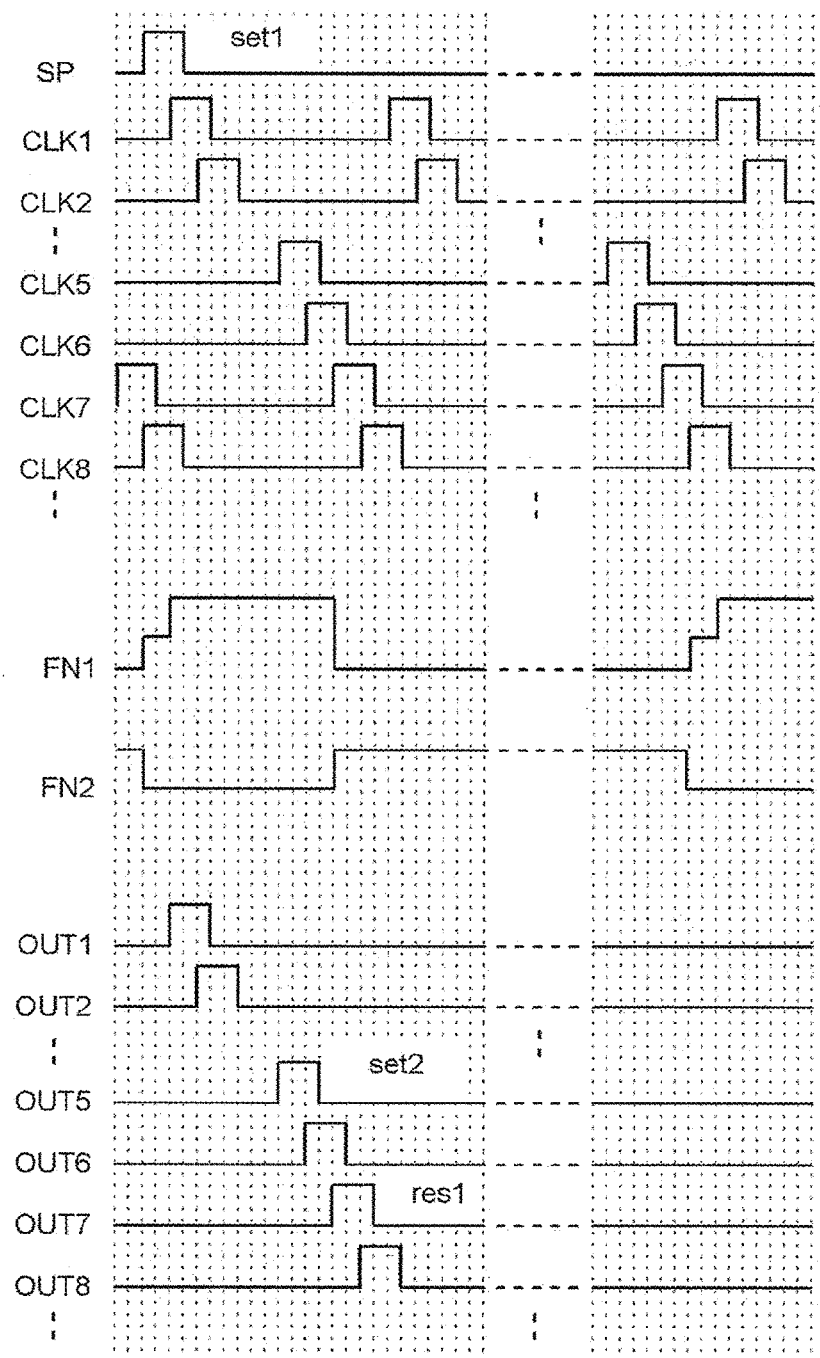
FIG. 39 is a timing diagram of a shift register unit.

In the driving method of the gate driver circuit 600 shown in FIG. 39, first, the start pulse SP is set to a high potential to turn on the first transistor 611 and the fifth transistor 615.

Since the reset signal RIN (the output signal OUT7) is a low potential, the sixth transistor 616 is turned off. Since the clock signals CLK1 to CLK6 are low potentials and the clock signals CLK7 and CLK8 are high potentials, the fourth transistor 614 and the seventh transistor 617 are turned off and the third transistor 613 is turned on.

At that time, the potential of the node FN1 has a value obtained by subtracting the threshold voltage of the first transistor 611 from the potential of the high potential power supply line VDD (VDD−Vth(611)), while the potential of the node FN2 becomes equal to the potential of the low potential power supply line VSS. Accordingly, the seventh transistor 617 is turned on and the eighth transistor 618 is turned off, and thus, the output signals OUT1 to OUT5 are low potentials, as in the clock signals CLK1 to CLK5.

Then, the clock signal CLK7 is set to a low potential, so that the third transistor 613 is turned off. Note that a high potential is held at a node in which the other of the source and the drain of the third transistor 613 and the one of the source and the drain of the fourth transistor 614 are electrically connected.

Next, the clock signal CLK1 changes from a low potential to a high potential, and the potential of the node FN1 increases by a voltage corresponding to the amplitude of the clock signal CLK1 by a bootstrap operation. As a result, the seventh transistor 617 is turned on, and a high potential (the potential of the clock signal CLK1) is output as the output signal OUT1. Note that the bootstrap operation occurs similarly when the clock signals followed by the clock signal CLK2 changes from a low potential to a high potential. Next, the clock signal CLK8 becomes a low potential, but change does not occur because a signal of the clock signal CLK8 is not used for the shift register unit 601 in the first stage. Then, the clock signal CLK2 becomes a high potential, and a high potential is output as the output signal OUT2. After that, the clock signal CLK1 becomes a low potential, and a low potential is output as the output signal OUT1. The same can be applied to the following operation associated with the output signals OUT3 and OUT4. When the clock signal CLK5 becomes a high potential and the output signal OUT5 becomes a high potential, the set signal LIN of the shift register unit 601 in the second stage becomes a high potential.

In the shift register unit 601 in the first stage, when the clock signal CLK6 becomes a high potential, the fourth transistor 614 is turned on. Then, the clock signal CLK5 becomes a low potential, and a low potential is output as the output signal OUT5.

In the shift register unit 601 in the second stage, the set signal LIN (the output signal OUT5) becomes a high potential, and the first transistor 611 and the fifth transistor 615 are turned on. Since the reset signal RIN (an output signal OUT12) is a low potential, the sixth transistor 616 is turned off. Since the clock signals CLK1, CLK2, and CLK6 to CLK8 become a low potential and the clock signals CLK4 and CLK5 become high potential, the fourth transistor 614 and the seventh transistor 617 are turned off and the third transistor 613 is turned on.

At this time, the potential of the node FN1 has a value obtained by subtracting the threshold voltage of the first transistor 611 from the potential of the high potential power supply line VDD (VDD−Vth(611)), while the potential of the node FN2 becomes equal to the potential of the low potential power supply line VSS. Accordingly, the seventh transistor 617 is turned on and the eighth transistor 618 is turned off, and thus, output signals OUT6 to OUT10 become a low potential, as in the clock signals CLK1, CLK2, and CLK6 to CLK8.

Next, the clock signal CLK4 becomes a low potential, and the third transistor 613 is turned off. Note that a high potential is held at a node in which the other of the source and the drain of the third transistor 613 and the one of the source and the drain of the fourth transistor 614 are electrically connected.

Next, the clock signal CLK6 changes from a low potential to a high potential, and the potential of the node FN1 increases by a voltage corresponding to the amplitude of the clock signal CLK6 by a bootstrap operation. As a result, the seventh transistor 617 is turned on, and a high potential (the potential of the clock signal CLK6) is output as the output signal OUT6. Next, the clock signal CLK5 becomes a low potential, but change does not occur because a signal of the clock signal CLK5 is not used for the shift register unit 601 in the second stage. Then, the clock signal CLK7 becomes a high potential, and a high potential is output as the output signal OUT7.

At that time, in the shift register unit 601 in the first stage, the reset signal RIN (the output signal OUT7) becomes a high potential, and the sixth transistor 616 is turned on, so that the potential of the node FN2 becomes equal to the potential of the high potential power supply line VDD. The second transistor 612 is turned on with the potential of the node FN2, so that the potential of the node FN1 becomes the potential of the low potential power supply line VSS and then is reset.

The shift register unit 601 in the second stage is driven like the shift register unit 601 in the first stage.

That is, the output signal OUT5($m$−1) of the shift register unit 601 in the (m−1)th stage is input as the set signal LIN of the shift register unit 601 in the m-th stage (m is a natural number). The output signal OUT5($m$+2) of the shift register unit 601 in the (m+1)th stage is input as the reset signal RIN of the shift register unit 601 in the m-th stage. Note that the set signal LIN when m is 1 corresponds to the start pulse SP.

The shift register unit 602 which is a dummy stage is similar to the shift register unit 601. The reset signal RIN can be input to the shift register unit 601 in the final stage with the shift register unit 602.

Note that pulses of a clock signal and the next clock signal overlap by one third of the pulse width in this embodiment, but the present invention is not limited thereto. The overlap width may be any value as long as it is half of the pulse width or less. The falling of the pulse of the clock signal and the rising of the pulse of the next clock signal may be at the same timing. In that case, the gate selection output period of the shift register unit 601 in the first stage is a period from the rising (set) of the start pulse SP to the rising (reset) of the clock signal CLK6; accordingly, the number of clock signals needed for regularly compensating charge is only one.

Note that the structure and the like described in this embodiment can be used as appropriate in combination with any of the structures and the like in the other embodiments.

Embodiment 5

The semiconductor device of one embodiment of the present invention can be used in a sensor that can detect proximity or touch of an object (e.g., a capacitive, a resistive, a surface acoustic wave, an infrared, and an optical touch sensor) and a radiographic image detection device that can obtain a medical radiographic image. The semiconductor device which is one embodiment of the present invention can be applied to a variety of electronic appliances (including game machines). Examples of electronic appliances include a television device (also referred to as television or television receiver), a monitor of a computer or the like, a digital camera, a digital video camera, a digital photo frame, a mobile phone, a portable game machine, a portable information terminal, an audio reproducing device, a game machine (e.g., a pachinko machine or a slot machine), and a game console, and the like. Examples of these electronic appliances are illustrated in FIGS. 24A to 24C.

Figure 24A:
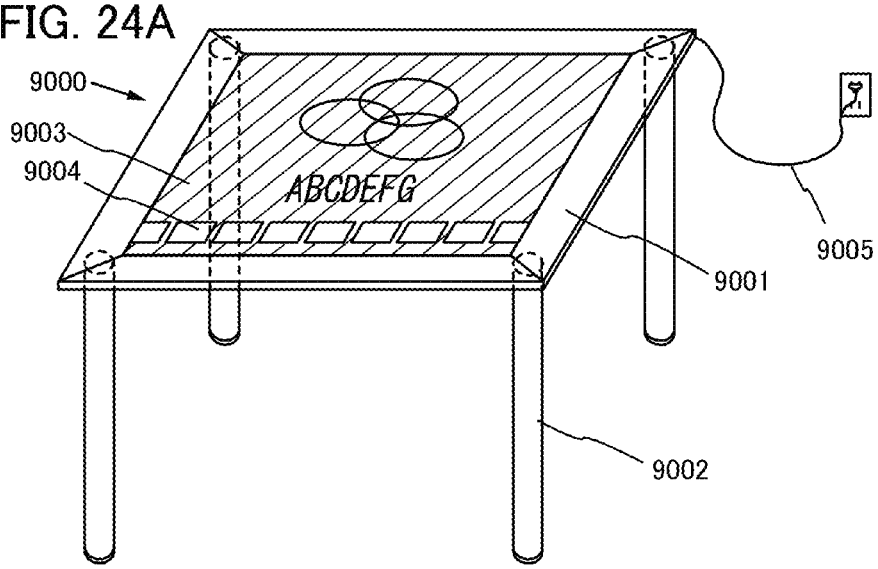
FIGS. 24A to 24C illustrate electronic appliances each including a semiconductor device that is one embodiment of the present invention.
Figure 24B:
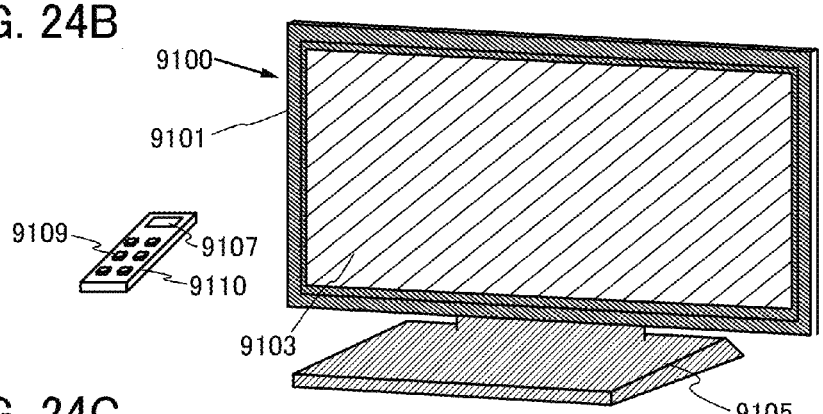
Figure 24C:
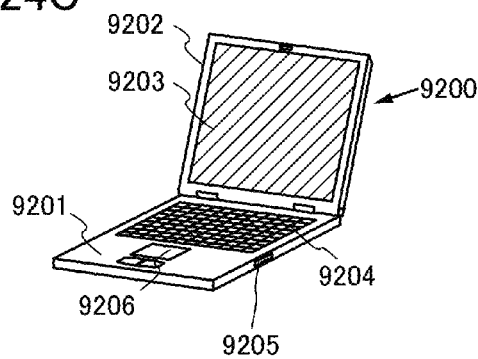

FIG. 24A illustrates a table 9000 having a display portion. In the table 9000, a display portion 9003 is incorporated in a housing 9001 and an image can be displayed on the display portion 9003. The housing 9001 is supported by four leg portions 9002. Further, a power cord 9005 for supplying power is provided for the housing 9001.

The semiconductor device described in any of the above embodiments can be used for the display portion 9003. Thus, the display portion 9003 can have high display quality.

The display portion 9003 has a touch-input function. When a user touches displayed buttons 9004 which are displayed on the display portion 9003 of the table 9000 with his/her fingers or the like, the user can carry out operation of the screen and input of information. Further, when the table may be made to communicate with home appliances or control the home appliances, the display portion 9003 may function as a control device which controls the home appliances by operation on the screen. For example, with use of a semiconductor device having an image sensor function, the display portion 9003 can have a touch-input function.

Further, the screen of the display portion 9003 can be placed perpendicular to a floor with a hinge provided for the housing 9001; thus, the table can also be used as a television device. When a television device having a large screen is set in a small room, an open space is reduced; however, when a display portion is incorporated in a table, a space in the room can be efficiently used.

FIG. 24B illustrates a television device 9100. In the television device 9100, a display portion 9103 is incorporated in a housing 9101 and an image can be displayed on the display portion 9103. Note that the housing 9101 is supported by a stand 9105 here.

The television device 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television device 9100 illustrated in FIG. 24B is provided with a receiver, a modem, and the like. With the receiver, general television broadcasts can be received in the television device 9100. Further, when the television device 9100 is connected to a communication network by wired or wireless connection via the modem, one-way (from a transmitter to a receiver) or two-way (between a transmitter and a receiver or between receivers) data communication can be performed.

Any of the semiconductor devices described in the above embodiments can be used for the display portions 9103 and 9107. Thus, the television device can have high display quality.

FIG. 24C illustrates a computer 9200, which includes a main body 9201, a housing 9202, a display portion 9203, a keyboard 9204, an external connection port 9205, a pointing device 9206, and the like.

Any of the semiconductor devices described in the above embodiments can be used for the display portion 9203. Thus, the computer 9200 can have high display quality.

Figure 25A:
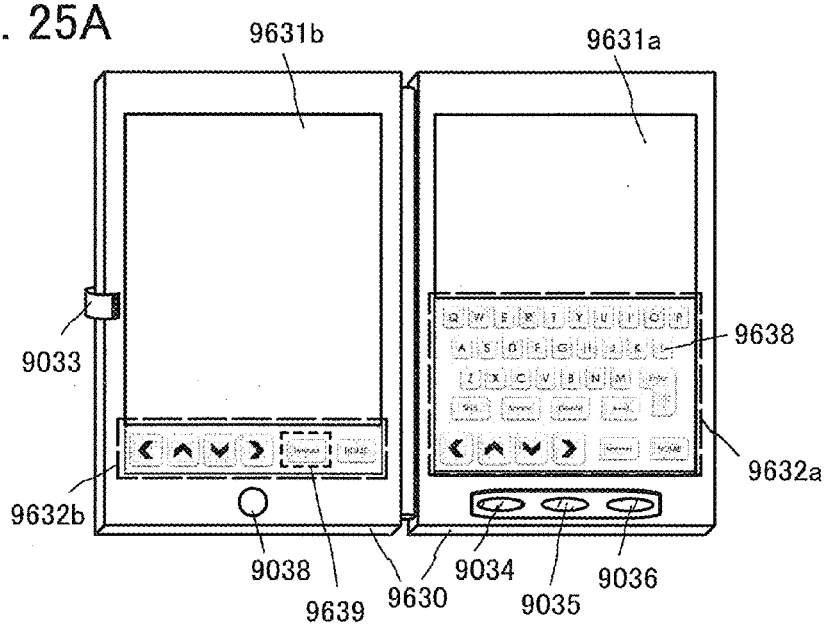
FIGS. 25A to 25C illustrate an electronic appliance including a semiconductor device that is one embodiment of the present invention.
Figure 25B:
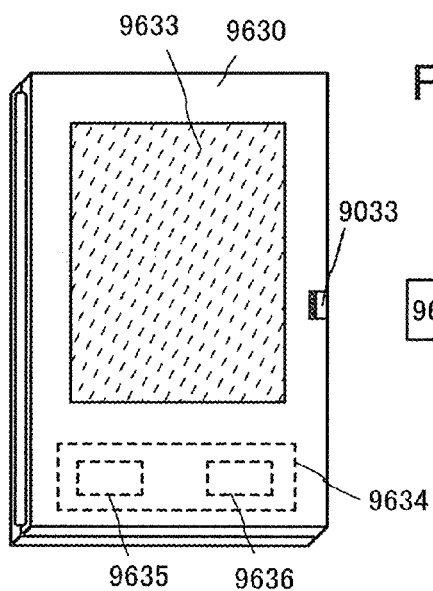

FIGS. 25A and 25B illustrate a foldable tablet terminal. The tablet terminal is opened in FIG. 25A. The tablet terminal includes a housing 9630, a display portion 9631a, a display portion 9631b, a display mode switch 9034, a power switch 9035, a power saver switch 9036, a clasp 9033, and an operation switch 9038.

The semiconductor device described in any of the above embodiments can be used for the display portion 9631a and the display portion 9631b. Thus, the display quality of the tablet terminal can be improved.

Part of the display portion 9631a can be a touch panel region 9632a and data can be input when a displayed operation key 9638 is touched. Although a structure in which a half region in the display portion 9631a has only a display function and the other half region also has a touch panel function is illustrated as an example, the structure of the display portion 9631a is not limited thereto. The whole area of the display portion 9631a may have a touch screen function. For example, the whole area of the display portion 9631a can display keyboard buttons and serve as a touch screen while the display portion 9631b can be used as a display screen.

Like the display portion 9631b, part of the display portion 9631b can be a touch screen region 9632b. When a keyboard display switching button 9639 displayed on the touch panel is touched with a finger, a stylus, or the like, a keyboard can be displayed on the display portion 9631b.

Touch input can be performed concurrently on the touch screen regions 9632a and 9632b.

The display-mode switching switch 9034 can switch display orientation (e.g., between landscape mode and portrait mode) and select a display mode (switch between monochrome display and color display), for example. The power-saving-mode switching switch 9036 can control display luminance in accordance with the amount of external light in use of the tablet terminal detected by an optical sensor incorporated in the tablet. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 25A, one embodiment of the present invention is not limited to this example. The display portion 9631a and the display portion 9631b may have different areas or different display quality. For example, one of them may be a display panel that can display higher-definition images than the other.

In FIG. 25B, the tablet terminal is folded and includes the housing 9630, a solar cell 9633, and a charge and discharge control circuit 9634. Note that in FIG. 25B, an example in which the charge and discharge control circuit 9634 includes the battery 9635 and the DCDC converter 9636 is illustrated.

Since the tablet can be folded in two, the housing 9630 can be closed when not in use. Thus, the display portions 9631a and 9631b can be protected, thereby providing a tablet with high endurance and high reliability for long-term use.

In addition, the tablet terminal illustrated in FIGS. 25A and 25B can have a function of displaying various kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633, which is attached on the surface of the tablet terminal, supplies electric power to a touch screen, a display portion, an image signal processor, and the like. Note that the solar cell 9633 can be provided on one or both surfaces of the housing 9630, so that the battery 9635 can be charged efficiently. The use of a lithium ion battery as the battery 9635 is advantageous in downsizing or the like.

Figure 25C:
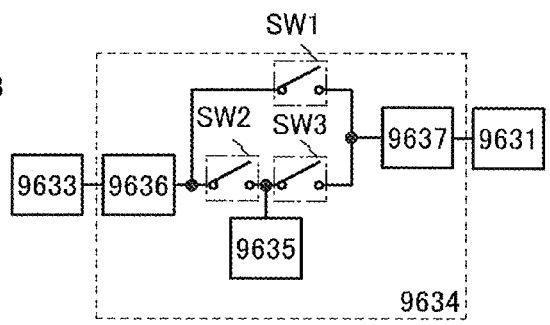

The structure and operation of the charge and discharge control circuit 9634 illustrated in FIG. 25B are described with reference to a block diagram of FIG. 25C. The solar cell 9633, the battery 9635, the DCDC converter 9636, a converter 9637, switches SW1 to SW3, and the display portion 9631 are shown in FIG. 25C, and the battery 9635, the DCDC converter 9636, the converter 9637, and the switches SW1 to SW3 correspond to the charge/discharge control circuit 9634 in FIG. 25B.

First, an example of the operation in the case where power is generated by the solar cell 9633 using external light is described. The voltage of power generated by the solar battery is raised or lowered by the DCDC converter 9636 so that the power has a voltage for charging the battery 9635. Then, when the power from the solar cell 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and a switch SW2 is turned on so that charge of the battery 9635 may be performed.

Note that the solar cell 9633 is described as an example of a power generation means; however, without limitation thereon, the battery 9635 may be charged using another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Note that the structures and the like described in this embodiment can be combined as appropriate with any of the structures and the like described in the other embodiments.

Example 1

In this example, a liquid crystal display device was fabricated using a semiconductor device in Embodiment 1. The bezel area of the fabricated liquid crystal display device is evaluated.

Figure 26:
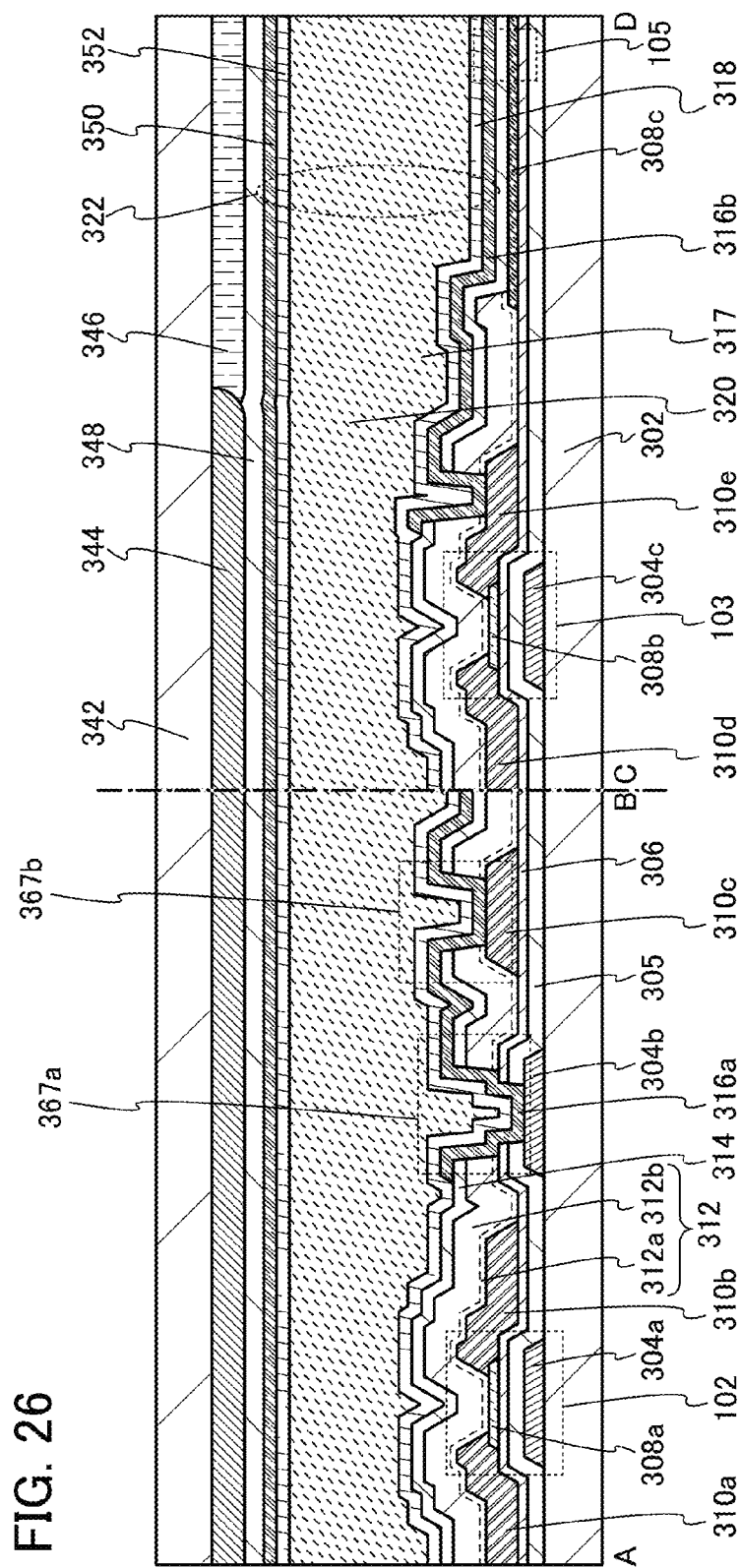
FIG. 26 is a cross-sectional view of a liquid crystal display device which is a comparative example.

As a comparative example, FIG. 26 shows a liquid crystal display device in which the conductive film 310c in the driver circuit portion does not overlap the conductive film 304b. In the driver circuit portion of the liquid crystal display device illustrated in FIG. 26, the conductive film 304b and the conductive film 310c are connected by the light-transmitting conductive film 316a. Note that the light-transmitting conductive film 316a is connected through an opening 367a and an opening 367b which are provided in the insulating film 305, the insulating film 306, and the insulating film 312.

Figure 27A:
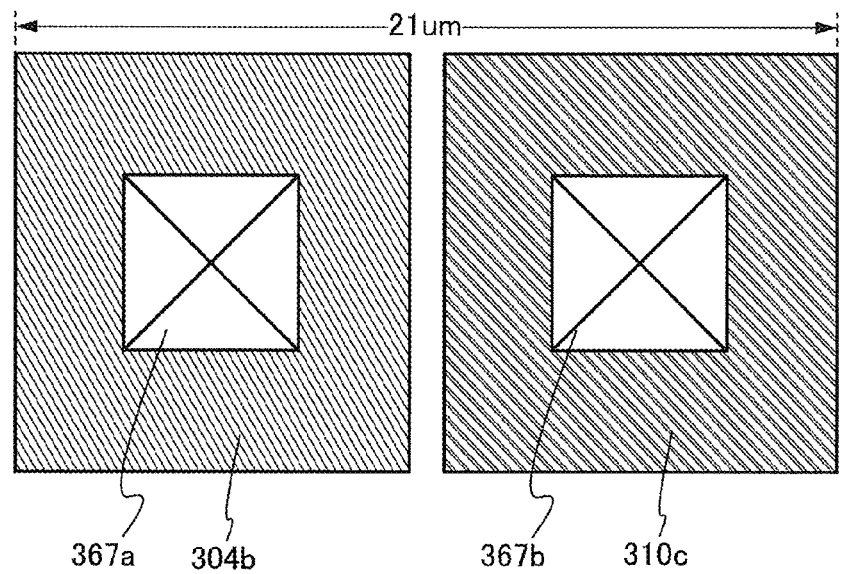
FIGS. 27A and 27B are layouts of a periphery of an opening a liquid crystal display device which is a comparative example.
Figure 27B:
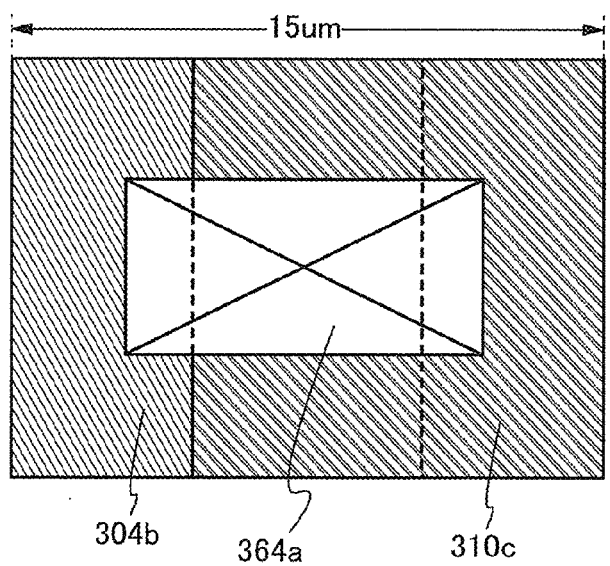

FIGS. 27A and 27B are layouts of the periphery of the openings. FIG. 27A is the layout of the periphery of an opening of liquid crystal display device which is a comparative example. FIG. 27B is the layout of the periphery of an opening of the liquid crystal display device using the semiconductor device of Embodiment 1.

The layout width of the periphery of the opening in the liquid crystal display device of the comparative example was 21 µm. The layout width of the periphery of the opening in the liquid crystal display device using the semiconductor device in Embodiment 1 was 15 µm. The results show that the layout width can be reduced by 6 µm for each opening in the case where the conductive film 304b, the conductive film 310c, and the light-transmitting conductive film 316a are connected through only one opening (here, the opening 364a) as in Embodiment 1 when the conductive film 304b and the conductive film 310c are connected by the light-transmitting conductive film 316a. Therefore, the bezel of the liquid crystal display device can be narrower.

Then, the reduction ratio of the bezel area in the case of changing two openings as shown in the comparative example into one opening as described in Embodiment 1 was obtained.

Figure 28:
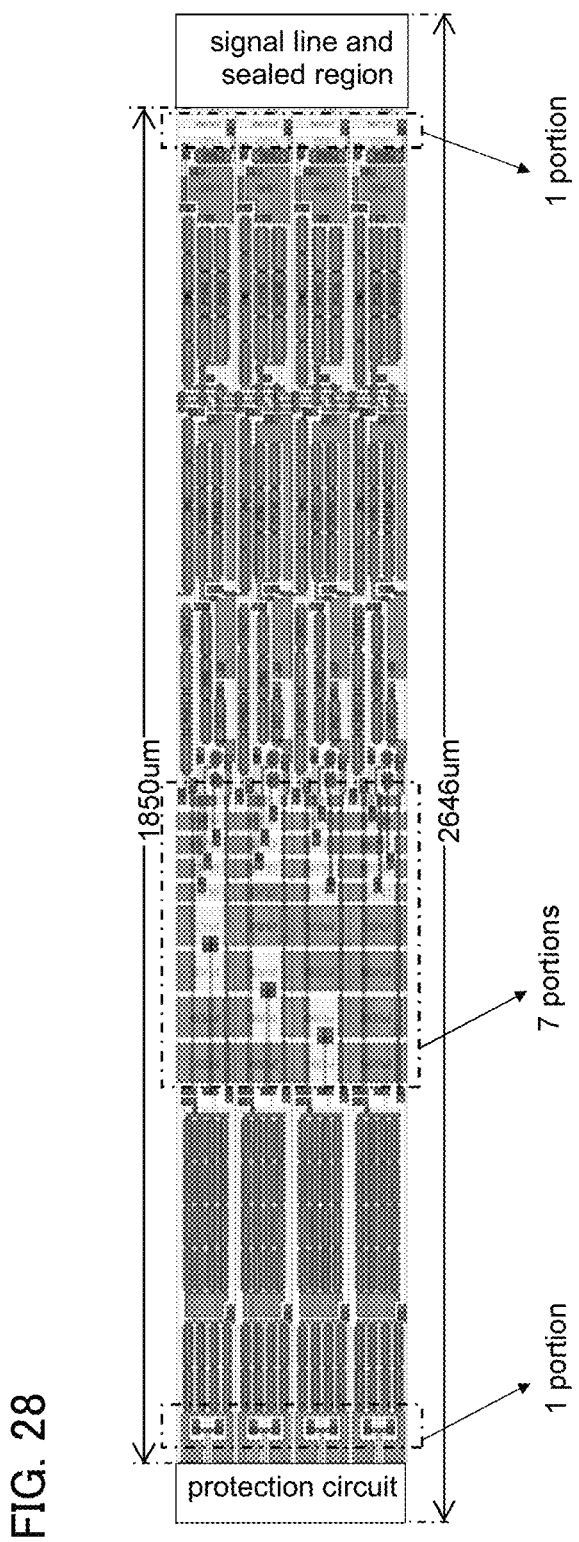
FIG. 28 is a layout of a liquid crystal display device which is a comparative example.

FIG. 28 shows a layout of the liquid crystal display device in the comparative example. The layout width of the driver circuit portion was 1850 µm. In the case of including the protection circuit, the signal line, and the sealed region, the layout width was 2646 µm.

In the driver circuit portion, the portion capable of changing two openings as shown in the comparative example into one opening as described in Embodiment 1 is surrounded by a dashed-dotted line in the figure.

In this example, nine portions in total can be changed to one opening, the layout width of the whole driver circuit portion is reduced by 54 µm (6 µm×9 portions). Accordingly, with the above structure, the bezel can be reduced by 2.04% (54 µm÷2646 µm×100%) and the bezel of the liquid crystal display device can be narrower.

Example 2

Figure 45A:
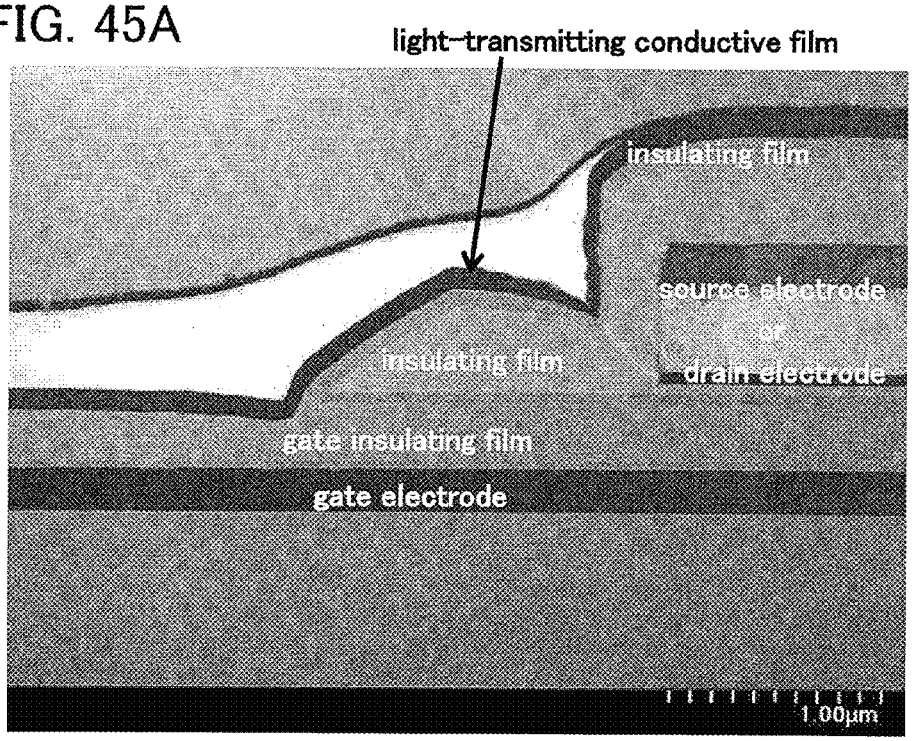
FIGS. 45A and 45B illustrate cross-sectional TEM images of a liquid crystal display device.
Figure 45B:
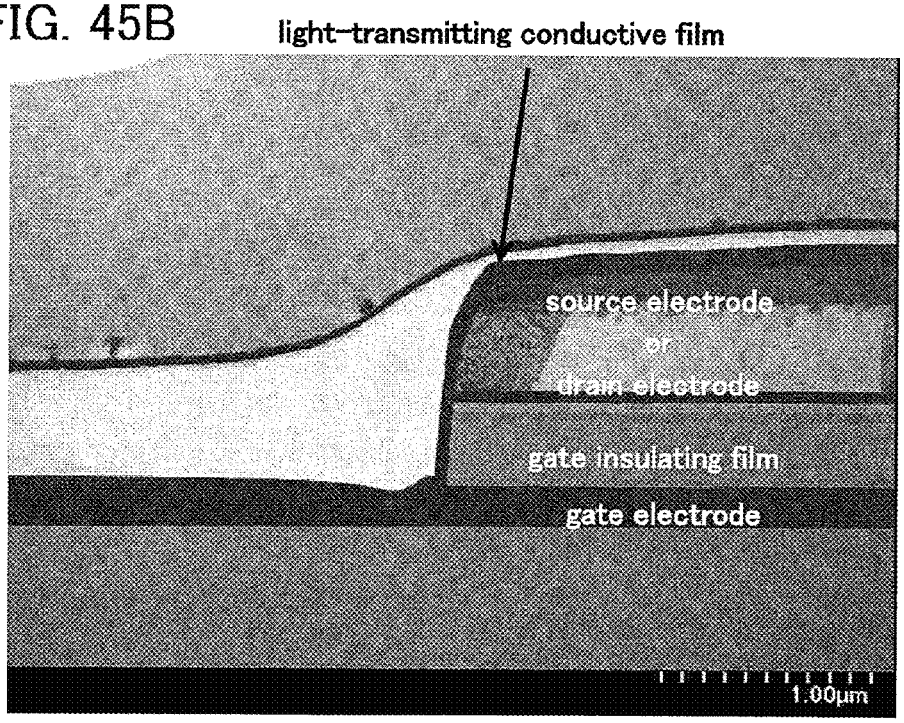

A liquid crystal display device was fabricated using the semiconductor device in Embodiment 1. FIG. 45A is a cross-sectional TEM image of the periphery of the opening in the liquid crystal display device of the comparative example of Example 1. FIG. 45B is a cross-sectional TEM image of the periphery of the opening in the liquid crystal display device using the semiconductor device in Embodiment 1.

In FIG. 45A, void portions are in the insulating film in the liquid crystal display device of the comparative example. In FIG. 45B, since a gate electrode is formed to overlap a source electrode or a drain electrode as described in Embodiment 1, a light-transmitting conductive film is not formed over the insulating film; accordingly, void portions do not generated. Therefore, the coverage of the film was found to be increased.

Example 3

In this example, a liquid crystal display device is fabricated using the driver circuit described in Embodiment 4. The bezel area of the fabricated liquid crystal display device is evaluated.

By using the structure in FIG. 26 for the driver circuit in Embodiment 4, a liquid crystal display device was fabricated. As a comparative example, a liquid crystal display device was fabricated using a driver circuit having the structure illustrated in FIG. 26 and having a conventional structure in which one stage of a shift register unit illustrated in FIG. 38A outputs one output signal.

Figures 43A, 43B:
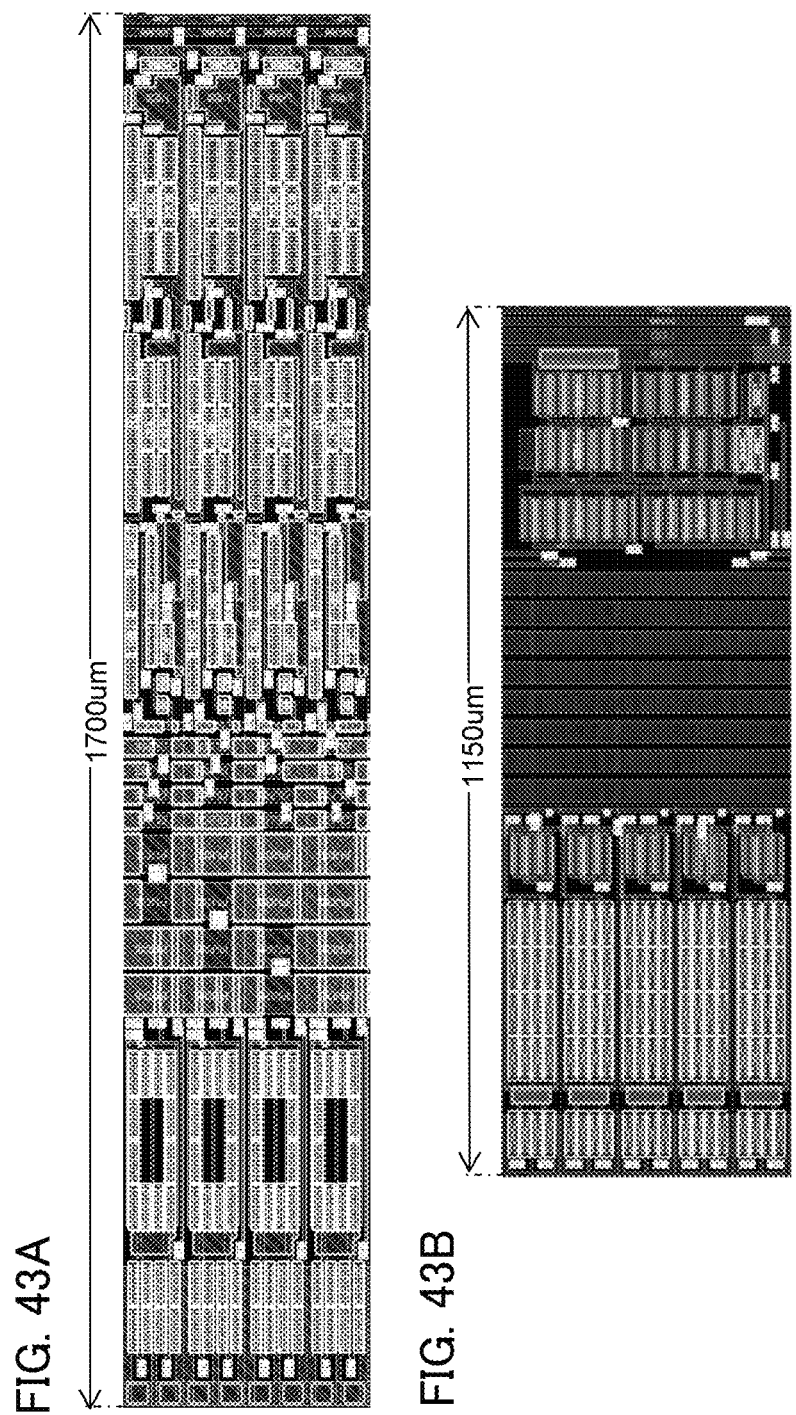
FIGS. 43A and 43B are layouts of driver circuit portions.

FIGS. 43A and 43B show layouts of driver circuit portions. FIG. 43A shows the layout of the driver circuit portion of the comparative example and the layout width was 1700 µm. FIG. 43B shows the layout of the driver circuit portion of this example and the layout width was 1150 µm. By using the driver circuit in Embodiment 4, the bezel can be reduced by 32.24% ((1700 µm−1150 µm)÷1700 µm×100%) from the conventional one, and the bezel of the liquid crystal display device can be narrower.

Similarly, by using the channel-protection transistor described in Modification Example 6 in Embodiment 1 for the driver circuit in Embodiment 4, a liquid crystal display device was fabricated. As a comparative example, a liquid crystal display device was fabricated using a channel-protection transistor for a driver circuit having a conventional structure in which one shift register unit illustrated in FIG. 38A outputs one output signal.

Figures 44A, 44B:
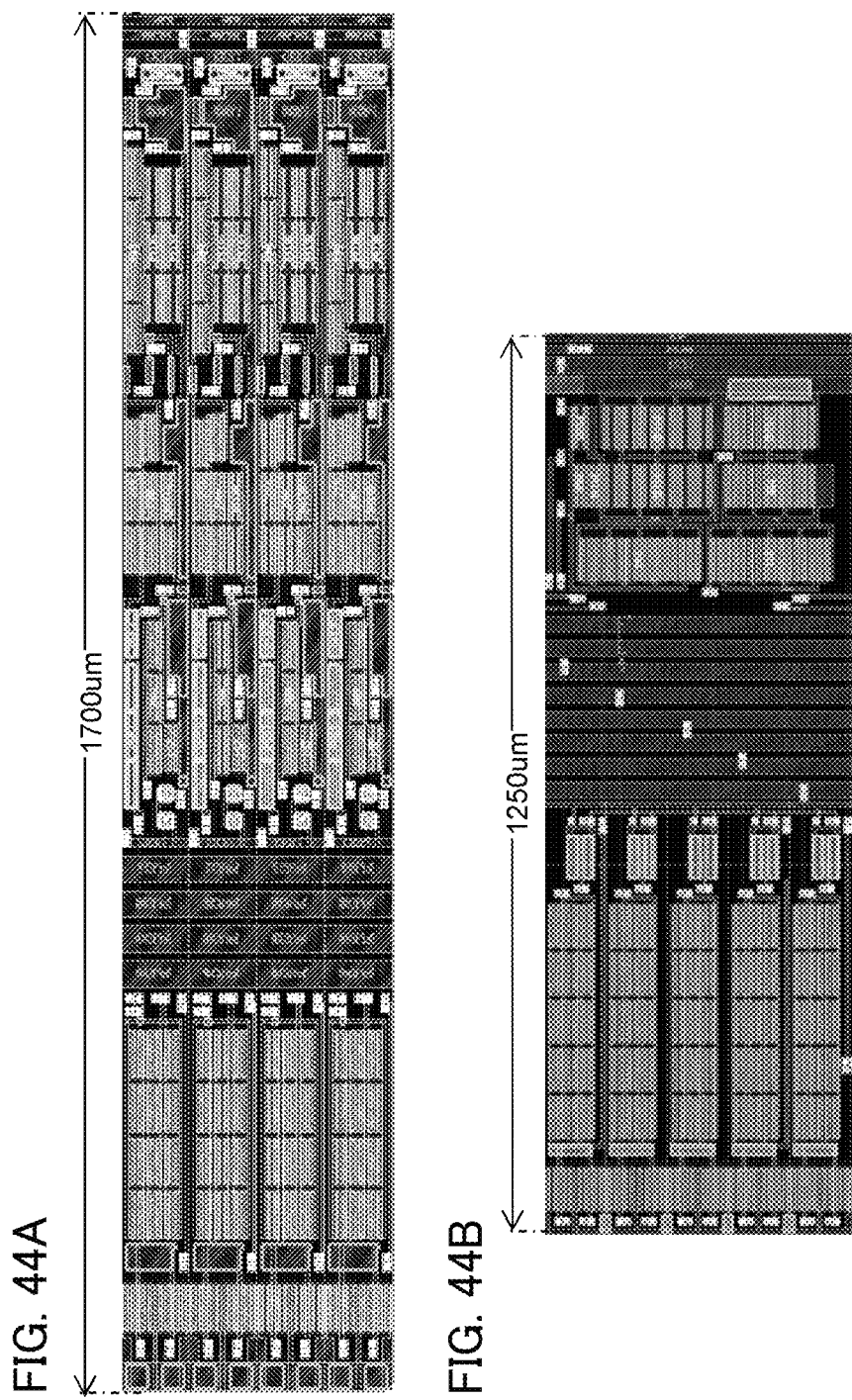
FIGS. 44A and 44B are layouts of driver circuit portions.

FIGS. 44A and 44B show layouts of driver circuit portions different from the above one. FIG. 44A shows the layout of the driver circuit portion of the comparative example and the layout width was 1700 µm. FIG. 44B shows the layout of the driver circuit portion of this example and the layout width was 1250 µm. By using the driver circuit in Embodiment 4, the bezel can be reduced by 26.47% ((1700 µm−1250 µm)÷1700 µm×100%) from the conventional one, and the bezel of the liquid crystal display device can be narrower.

Example 4

In this Example, the characteristics of the transistor which has a CAAC-OS film contains an In—Ga—Zn oxide and can be used in a liquid crystal display device were evaluated.

A transistor which is used for a buffer in the gate driver, has a channel length of 50 µm and a channel width of 4 µm, and has a channel-etched structure is used for the measurement.

Next, the structure of the transistor is described.

The transistor includes a gate electrode over a glass substrate; a gate insulating film over the glass substrate and the gate electrode; an oxide semiconductor film over the gate insulating film; a source electrode and a drain electrode in contact with the oxide semiconductor film; a first insulating film and a second insulating film over the oxide semiconductor film, the source electrode, and the drain electrode; and a pixel electrode electrically connected to the source electrode or the drain electrode through an opening provided in the first insulating film and the second insulating film.

In the gate electrode, a 200-nm-thick copper film is stacked over a 35-nm-thick titanium film. In the gate insulating film, a 50-nm-thick silicon oxynitride film is stacked over a 400-nm-thick silicon nitride film. The oxide semiconductor film is a 35-nm-thick In—Ga—Zn oxide film at an atomic ratio of In:Ga:Zn=1:1:1. In the source electrode and the drain electrode, a 400-nm-thick aluminum film is stacked over a 50-nm-thick tungsten film and a 200-nm-thick titanium film is stacked over the aluminum film. In the first insulating film, a 400-nm-thick silicon oxynitride film is stacked over 50-nm-thick silicon oxynitride film. The second insulating film is a 100-nm-thick silicon nitride film. The pixel electrode is a 110-nm-thick indium tin oxide film to which silicon oxide is added.

Figure 46:
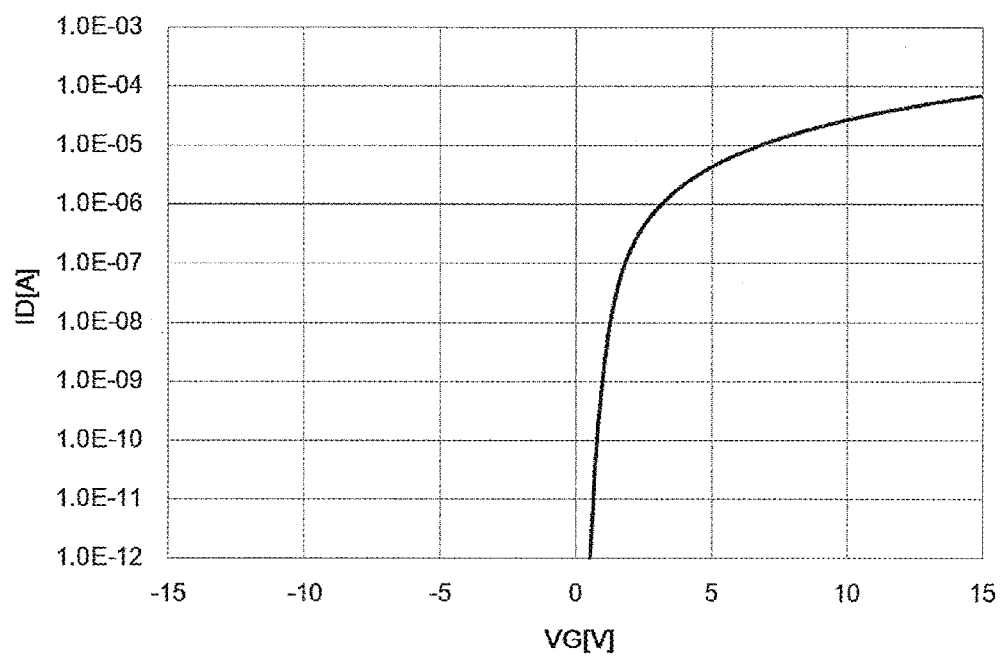
FIG. 46 shows characteristics of a transistor.

FIG. 46 shows the characteristics of the fabricated transistor. In the graph, the vertical axis represents drain current ID (unit: A) and the horizontal axis represents gate voltage VG (unit: V). FIG. 46 shows that the fabricated transistor can have favorable characteristics.

Figure 47A:
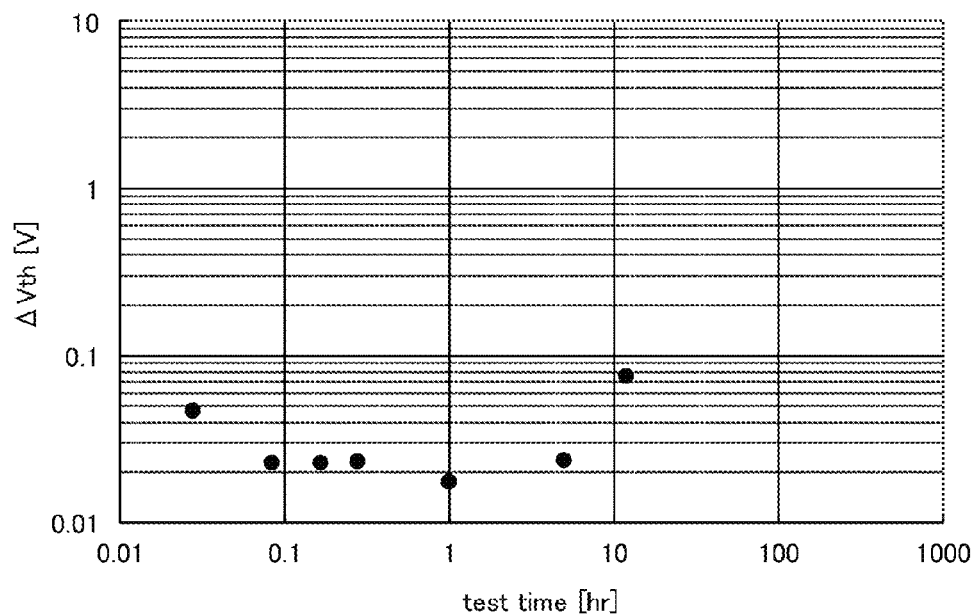
FIGS. 47A and 47B show characteristics of a transistor.

A channel-etched transistor with a channel length of 50 µm and a channel width of 6 µm was fabricated, and a test (+BT test) was performed on the transistor in a dark state (dark) at a gate potential of 30 V at 60° C. for an hour. FIG. 47A shows the characteristics of the transistor after the +BT test. In the graph, the vertical axis and the horizontal axis represent the amount of change in threshold voltage ΔVth [V] and test time [hr], respectively. From FIG. 47A, the amount of change in threshold voltage was found to be small.

Figure 47B:
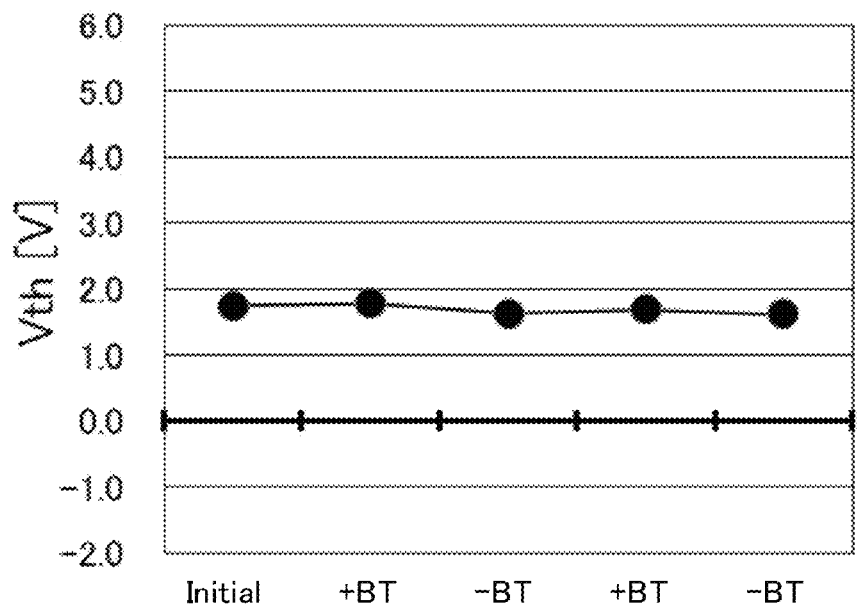

A test (+BT test) in which the transistor was held in a dark state (dark) at a gate potential of 30 V at 60° C. for an hour and a test (−BT test) in which the transistor was held in a dark state (dark) at a gate potential of −30 V at 60° C. for an hour were performed alternately. The measurement results are shown in FIG. 47B. In the graph, the vertical axis and the horizontal axis represent the threshold voltage Vth [V] and test conditions, respectively. From FIG. 47B, variation in characteristics was found to be little.

REFERENCE NUMERALS

101: pixel portion; 102: transistor; 103: transistor; 104: scan line driver circuit; 105: capacitor; 106: signal line driver circuit; 107: scan line; 109: signal line; 115: capacitor line; 131_1: transistor; 132: liquid crystal element; 133_1: capacitor; 301: pixel; 302: substrate; 304: conductive film; 304a: conductive film; 304b: conductive film; 304c: conductive film; 305: insulating film; 305a: nitride insulating film; 305b: nitride insulating film; 305c: nitride insulating film; 306: insulating film; 307: oxide semiconductor film; 308a: oxide semiconductor film; 308b: oxide semiconductor film; 308c: conductive film; 308d: oxide semiconductor film; 309: conductive film; 310a: conductive film; 310b: conductive film; 310c: conductive film; 310d: conductive film; 310e: conductive film; 310f: conductive film; 311: insulating film; 311a: insulating film; 311b: insulating film; 312: insulating film; 312a: insulating film; 312b: insulating film; 313: insulating film; 314: insulating film; 315: conductive film; 316a: conductive film; 316b: conductive film; 316c: conductive film; 316d: conductive film; 317: planarization film; 318: alignment film; 320: liquid crystal layer; 321: conductive film; 322: liquid crystal element; 324: insulating film; 325: conductive film; 326: conductive film; 334a: low-resistance region; 334b: low-resistance region; 336: multilayer film; 336a: oxide semiconductor film; 336b: oxide film; 342: substrate; 344: light-blocking film; 346: colored film; 348: insulating film; 350: conductive film; 352: alignment film; 360: depressed portion; 362: opening; 362c: opening; 364a: opening; 364b: opening; 364c: opening; 367a: opening; 367b: opening; 370: region; 384a: opening; 384b: opening; 600: gate driver circuit; 601: shift register unit; 601a: shift register unit; 602: shift register unit; 602a: shift register unit; 603: demultiplexer circuit; 604: demultiplexer circuit; 605: buffer; 605a: buffer; 611: transistor; 612: transistor; 613: transistor; 614: transistor; 615: transistor; 616: transistor; 617: transistor; 618: transistor; 619: capacitor; 621: transistor; 622: transistor; 623: transistor; 624: capacitor; 625: transistor; 9000: table; 9001: housing; 9002: leg portion; 9003: display portion; 9004: displayed button; 9005: power cord; 9033: clasp; 9034: switch; 9035: power switch; 9036: switch; 9038: operation switch; 9100: television device; 9101: housing; 9103: display portion; 9105: stand; 9107: display portion; 9109: operation key; 9110: remote controller; 9200: computer; 9201: main body; 9202: housing; 9203: display portion; 9204: keyboard; 9205: external connection port; 9206: pointing device; 9630: housing; 9631: display portion; 9631a: display portion; 9631b: display portion; 9632a: region; 9632b: region; 9633: solar cell; 9634: charge and discharge control circuit; 9635: battery; 9636: DCDC converter; 9637: converter; 9638: operation key; 9639: button This application is based on Japanese Patent Application serial no. 2013-036791 filed with Japan Patent Office on Feb. 27, 2013, Japanese Patent Application serial no. 2013-187853 filed with Japan Patent Office on Sep. 11, 2013, and Japanese Patent Application serial no. 2013-248897 filed with Japan Patent Office on Dec. 2, 2013, the entire contents of which are hereby incorporated by reference.

The invention claimed is:
1. A driver circuit comprising:
a shift register unit comprising:
  a set signal line;
  a first transistor;
  a second transistor;
  a third transistor;
  a fourth transistor;
  a fifth transistor; and
  a sixth transistor;
n signal lines (n is a natural number of four or more); and
p buffers (p is a natural number ranging one to (n−3)), the p buffers each comprising an output terminal,
wherein one of a source and a drain of the first transistor is electrically connected to a high power supply potential line,
wherein the other of the source and the drain of the first transistor is electrically connected to each of the p buffers and one of a source and a drain of the second transistor,
wherein a gate of the first transistor is electrically connected to the set signal line,
wherein the other of the source and the drain of the second transistor is electrically connected to a low power supply potential line,
wherein a gate of the second transistor is electrically connected to each of the p buffers, one of a source and a drain of the fourth transistor, one of a source and a drain of the fifth transistor, and one of a source and a drain of the sixth transistor,
wherein one of a source and a drain of the third transistor is electrically connected to the high power supply potential line,
wherein the other of the source and the drain of the third transistor is electrically connected to the other of the source and the drain of the fourth transistor,
wherein a gate of the third transistor is electrically connected to a first signal line of the n signal lines,
wherein a gate of the fourth transistor is electrically connected to a second signal line of the n signal lines,
wherein the other of the source and the drain of the fifth transistor is electrically connected to the low power supply potential line,
wherein a gate of the fifth transistor is electrically connected to the set signal line,
wherein the other of the source and the drain of the sixth transistor is electrically connected to the high power supply potential line,
wherein a gate of the sixth transistor is electrically connected to a reset signal line,
wherein a first buffer of the p buffers is electrically connected to a third signal line of the n signal lines, and
wherein a second buffer of the p buffers is electrically connected to a fourth signal line of the n signal lines.
2. The driver circuit according to claim 1, wherein the first transistor comprises an oxide semiconductor.

3. The driver circuit according to claim 1,
wherein the p buffers are included in a demultiplexer circuit, and
wherein the demultiplexer circuit comprises a first input terminal electrically connected to the other of the source and the drain of the first transistor and a second input terminal electrically connected to the gate of the second transistor.

4. A display device comprising the driver circuit according to claim 1.

5. An electronic device comprising the display device according to claim 4.

6. A driver circuit comprising:
a shift register unit comprising:
a set signal line;
a first transistor;
a second transistor;
a third transistor;
a fourth transistor;
a fifth transistor;
a sixth transistor;
a seventh transistor; and
an eighth transistor;
n signal lines (n is a natural number of four or more); and
p buffers (p is a natural number ranging one to (n−3)), the p buffers each comprising an output terminal,
wherein one of a source and a drain of the first transistor is electrically connected to a high power supply potential line,
wherein the other of the source and the drain of the first transistor is electrically connected to each of the p buffers and one of a source and a drain of the second transistor,
wherein a gate of the first transistor is electrically connected to the set signal line,
wherein the other of the source and the drain of the second transistor is electrically connected to a low power supply potential line through both of a source and a drain of the seventh transistor,
wherein a gate of the second transistor and a gate of the seventh transistor are electrically connected to each of the p buffers, one of a source and a drain of the fourth transistor, one of a source and a drain of the fifth transistor, and one of a source and a drain of the sixth transistor,
wherein one of a source and a drain of the third transistor is electrically connected to the high power supply potential line,
wherein the other of the source and the drain of the third transistor is electrically connected to the other of the source and the drain of the fourth transistor,
wherein a gate of the third transistor is electrically connected to a first signal line of the n signal lines,
wherein a gate of the fourth transistor is electrically connected to a second signal line of the n signal lines,
wherein the other of the source and the drain of the fifth transistor is electrically connected to the low power supply potential line through both of a source and a drain of the eighth transistor,
wherein a gate of the fifth transistor and a gate of the eighth transistor are electrically connected to the set signal line,
wherein the other of the source and the drain of the sixth transistor is electrically connected to the high power supply potential line,
wherein a gate of the sixth transistor is electrically connected to a reset signal line,
wherein a first buffer of the p buffers is electrically connected to a third signal line of the n signal lines, and
wherein a second buffer of the p buffers is electrically connected to a fourth signal line of the n signal lines.

7. The driver circuit according to claim 6, wherein the shift register unit further comprises a capacitor between the one of the source and the drain of the fifth transistor and the low power supply potential line.

8. The driver circuit according to claim 6,
wherein the shift register unit further comprises a ninth transistor,
wherein one of a source and a drain of the ninth transistor is electrically connected to the high power supply potential line, and
wherein the other of the source and the drain of the ninth transistor is electrically connected to each of the p buffers.

9. The driver circuit according to claim 8, wherein the first transistor comprises an oxide semiconductor.

10. The driver circuit according to claim 8,
wherein the p buffers are included in a demultiplexer circuit, and
wherein the demultiplexer circuit comprises a first input terminal electrically connected to the other of the source and the drain of the first transistor and a second input terminal electrically connected to the gate of the second transistor.

11. A display device comprising the driver circuit according to claim 8.

12. An electronic device comprising the display device according to claim 11.

13. A driver circuit comprising:
a shift register unit comprising:
a set signal line;
a first transistor;
a second transistor;
a third transistor;
a fifth transistor; and
a sixth transistor;
n signal lines (n is a natural number of four or more); and
p buffers (p is a natural number ranging one to (n−3)), the p buffers each comprising an output terminal,
wherein one of a source and a drain of the first transistor is electrically connected to a high power supply potential line,
wherein the other of the source and the drain of the first transistor is electrically connected to each of the p buffers and one of a source and a drain of the second transistor,
wherein a gate of the first transistor is electrically connected to the set signal line,
wherein the other of the source and the drain of the second transistor is electrically connected to a low power supply potential line,
wherein a gate of the second transistor is electrically connected to each of the p buffers, one of a source and a drain of the third transistor, one of a source and a drain of the fifth transistor, and one of a source and a drain of the sixth transistor,
wherein the other of a source and a drain of the third transistor is electrically connected to the high power supply potential line,
wherein a gate of the third transistor is electrically connected to a first signal line of the n signal lines,
wherein the other of the source and the drain of the fifth transistor is electrically connected to the low power supply potential line, wherein a gate of the fifth transistor is electrically connected to the set signal line, wherein the other of the source and the drain of the sixth transistor is electrically connected to the high power supply potential line, wherein a gate of the sixth transistor is electrically connected to a reset signal line, wherein a first buffer of the p buffers is electrically connected to a third signal line of the n signal lines, and wherein a second buffer of the p buffers is electrically connected to a fourth signal line of the n signal lines.

14. The driver circuit according to claim 13, wherein the first transistor comprises an oxide semiconductor.

15. The driver circuit according to claim 13, wherein the p buffers are included in a demultiplexer circuit, and wherein the demultiplexer circuit comprises a first input terminal electrically connected to the other of the source and the drain of the first transistor and a second input terminal electrically connected to the gate of the second transistor.

16. A display device comprising the driver circuit according to claim 13.

17. An electronic device comprising the display device according to claim 16.

* * * * *